United States Patent
Kim et al.

(10) Patent No.: US 10,373,953 B2
(45) Date of Patent: Aug. 6, 2019

(54) SEMICONDUCTOR DEVICE INCLUDING A SEMICONDUCTOR EXTENSION LAYER BETWEEN ACTIVE REGIONS

(71) Applicant: Samsung Electronics Co., Ltd., Suwon-si, Gyeonggi-do (KR)

(72) Inventors: Sungmin Kim, Incheon (KR); Jisu Kang, Seoul (KR); Jaehyun Park, Osan-si (KR); Heonjong Shin, Yongin-si (KR); Yuri Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 148 days.

(21) Appl. No.: 15/159,464

(22) Filed: May 19, 2016

(65) Prior Publication Data

US 2016/0343709 A1 Nov. 24, 2016

(30) Foreign Application Priority Data

May 19, 2015 (KR) ........................ 10-2015-0069712

(51) Int. Cl.

| H01L 29/06 | (2006.01) |
|---|---|
| H01L 29/10 | (2006.01) |
| H01L 27/088 | (2006.01) |
| H01L 21/8234 | (2006.01) |
| H01L 29/78 | (2006.01) |
| H01L 29/417 | (2006.01) |

(52) U.S. Cl.
CPC .. *H01L 27/0886* (2013.01); *H01L 21/823431* (2013.01); *H01L 21/823481* (2013.01); *H01L 27/088* (2013.01); *H01L 29/0653* (2013.01); *H01L 29/1037* (2013.01); *H01L 29/41791* (2013.01); *H01L 29/785* (2013.01)

(58) Field of Classification Search
CPC ............... H01L 27/088; H01L 27/0886; H01L 29/0653; H01L 29/785
USPC .................................................. 257/401, 619
See application file for complete search history.

(56) References Cited

U.S. PATENT DOCUMENTS

| 8,604,561 | B2 | 12/2013 | Cho et al. | |
|---|---|---|---|---|
| 8,609,499 | B2 | 12/2013 | Ho et al. | |
| 8,846,491 | B1 | 9/2014 | Pham et al. | |
| 9,337,339 | B1 * | 5/2016 | Lee | ..................... H01L 29/1608 |
| 2013/0270641 | A1 | 10/2013 | Chi | |
| 2013/0285138 | A1 | 10/2013 | Vega et al. | |
| 2013/0334615 | A1 | 12/2013 | Ho et al. | |
| 2014/0151759 | A1 | 6/2014 | Loubet et al. | |
| 2014/0264572 | A1 | 9/2014 | Kim et al. | |
| 2014/0327046 | A1 | 11/2014 | Huang et al. | |
| 2014/0335673 | A1 | 11/2014 | Kim et al. | |

(Continued)

*Primary Examiner* — Matthew E Warren
(74) *Attorney, Agent, or Firm* — Myers Bigel, P.A.

(57) ABSTRACT

A semiconductor device includes a first active region and a second active region, which are disposed in a semiconductor substrate and have side surfaces facing each other, an isolation pattern disposed between the first and second active regions, a semiconductor extension layer disposed between the first and second active regions, a first source/drain semiconductor layer disposed on the first active region, and a second source/drain semiconductor layer disposed on the second active region. The facing side surfaces of the first and second active regions are closer to the semiconductor extension layer than the isolation pattern.

11 Claims, 59 Drawing Sheets

(56) References Cited

U.S. PATENT DOCUMENTS

2015/0021695 A1 1/2015 Hu et al.
2015/0214341 A1* 7/2015 Shin ................ H01L 29/66818
                                              257/401

* cited by examiner

SEMICONDUCTOR DEVICE INCLUDING A SEMICONDUCTOR EXTENSION LAYER BETWEEN ACTIVE REGIONS

CROSS-REFERENCE TO RELATED APPLICATION

This application claims priority under 35 U.S.C. § 119 to Korean Patent Application No. 10-2015-0069712 filed on May 19, 2015, the disclosure of which is hereby incorporated by reference in its entirety.

BACKGROUND

Technical Field

Embodiments of the inventive concept relate to a semiconductor device and an electronic system adopting the same.

Description of Related Art

While the degree of integration of semiconductor devices has been increased, discrete devices, such as transistors having a fin field effect transistors (finFET) structure have been used in integrated circuits of the semiconductor devices. With the trend of an increasing degree of integration in semiconductor devices, unexpected problems may occur while distances between the transistors having the finFET structure become smaller.

SUMMARY

In accordance with an embodiment of the inventive concept, a semiconductor device includes a first active region and a second active region, which are disposed in a semiconductor substrate and have side surfaces facing each other, an isolation pattern disposed between the first and second active regions, a semiconductor extension layer disposed between the first and second active regions, a first source/drain semiconductor layer disposed on the first active region, and a second source/drain semiconductor layer disposed on the second active region. The facing side surfaces of the first and second active regions are closer to the semiconductor extension layer than the isolation pattern.

In accordance with an embodiment of the inventive concept, a semiconductor device includes a field insulating layer disposed on a semiconductor substrate, a first active region and a second active region, which are disposed in the semiconductor substrate and pass through the field insulating layer, an isolation pattern disposed between the first active region and the second active region and which extends into the field insulating layer, a semiconductor extension layer disposed between the first and second active regions, a first source/drain semiconductor layer disposed on the first active region, and a second source/drain semiconductor layer disposed on the second active region. A width of the isolation pattern in the field insulating layer is greater than a width of the isolation pattern between the first and second active regions.

In accordance with an embodiment of the inventive concept, a semiconductor device includes a first active region and a second active region, which are disposed in a semiconductor substrate and have line shapes which extend in a first direction, a first gate pattern disposed on the first active region, a second gate pattern disposed on the second active region, a dummy gate pattern disposed between the first and second gate patterns, an isolation pattern disposed between the first and second active regions, and a semiconductor extension layer disposed between the first active region and the isolation pattern.

In accordance with an embodiment of the inventive concept, a semiconductor device includes a field insulating layer disposed on a semiconductor substrate, a first active region and a second active region, which pass through the field insulating layer and protrude from an upper portion of the field insulating layer, a field trench area disposed between the first and second active regions, a semiconductor extension layer disposed in the field trench area, and an isolation pattern disposed on the semiconductor extension layer.

It is noted that aspects described with respect to one embodiment may be incorporated in different embodiments although not specifically described relative thereto. That is, all embodiments and/or features of any embodiments can be combined in any way and/or combination. Moreover, other methods, systems, articles of manufacture, and/or devices according to embodiments of the inventive subject matter will be or become apparent to one with skill in the art upon review of the following drawings and detailed description. It is intended that all such additional systems, methods, articles of manufacture, and/or devices be included within this description, be within the scope of the present inventive subject matter, and be protected by the accompanying claims. It is further intended that all embodiments disclosed herein can be implemented separately or combined in any way and/or combination.

Details of other embodiments are included in detailed explanations and the drawings.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
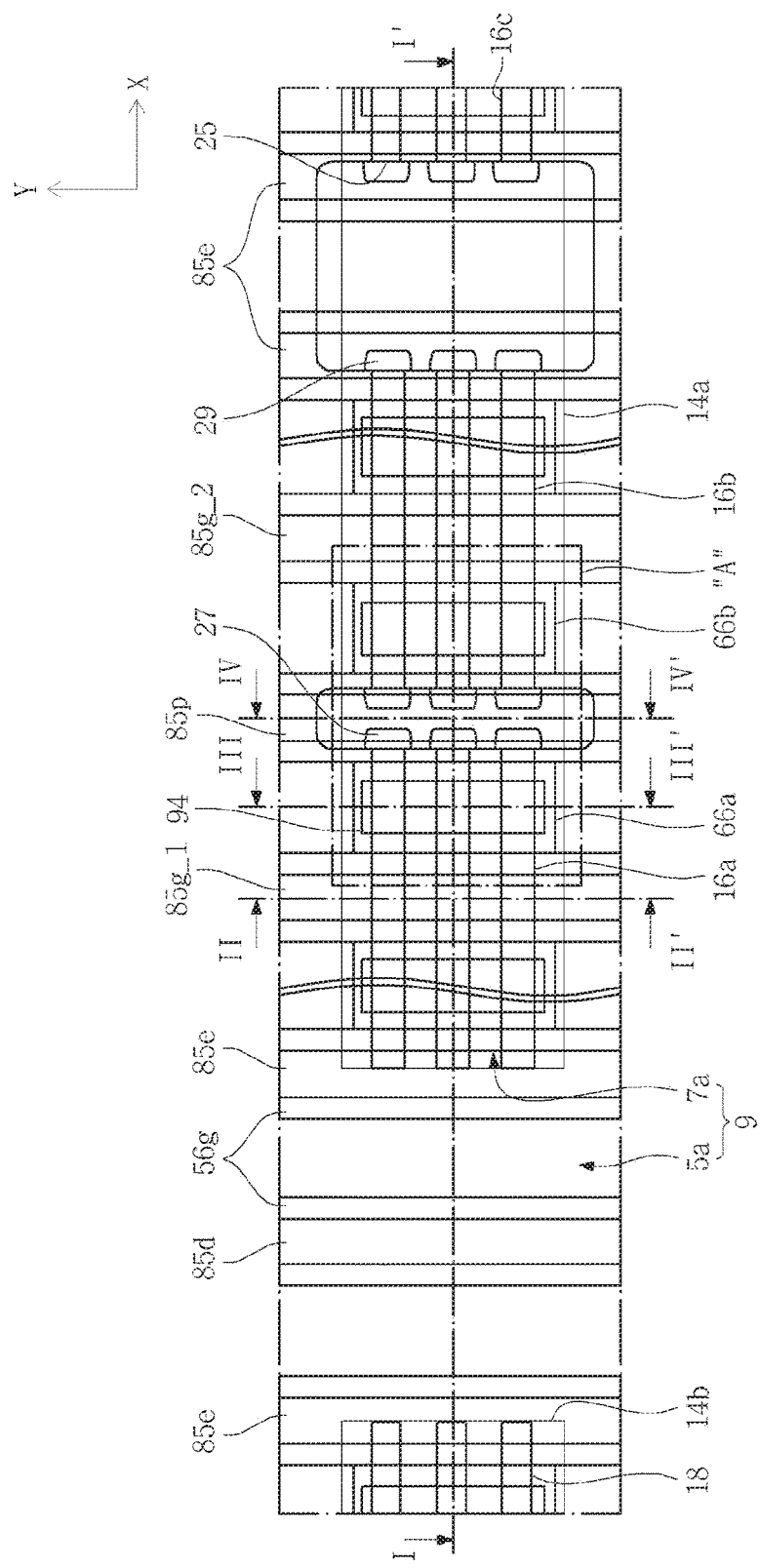
FIGS. 1, 2, 3A, and 3B are plan views showing a semiconductor device according to embodiments of the inventive concept.

The inventive concept may be embodied in various different forms, and should be construed as limited, not by the embodiments set forth herein, but only by the accompanying claims. Rather, these embodiments are provided so that this disclosure is thorough and complete and fully conveys the inventive concept to those skilled in the art. In the drawings, the sizes and relative sizes of layers and regions may be exaggerated for clarity. The same reference symbols denote the same components throughout the specification.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the inventive concept but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween.

Terms such as "top," "bottom," "upper," "lower," "above," "below," and the like are used herein to describe the relative positions of elements or features. For example, when an upper part of a drawing is referred to as a "top" and a lower part of a drawing is referred to as a "bottom" for the sake of convenience, in practice, the "top" may also be called a "bottom" and the "bottom" may also be a "top" without departing from the teachings of the inventive concept.

Furthermore, throughout this disclosure, directional terms such as "upper," "intermediate," "lower," and the like may be used herein to describe the relationship of one element or feature with another, and the inventive concept should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the inventive concept.

The terminology used herein to describe embodiments of the invention is not intended to limit the scope of the inventive concept.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
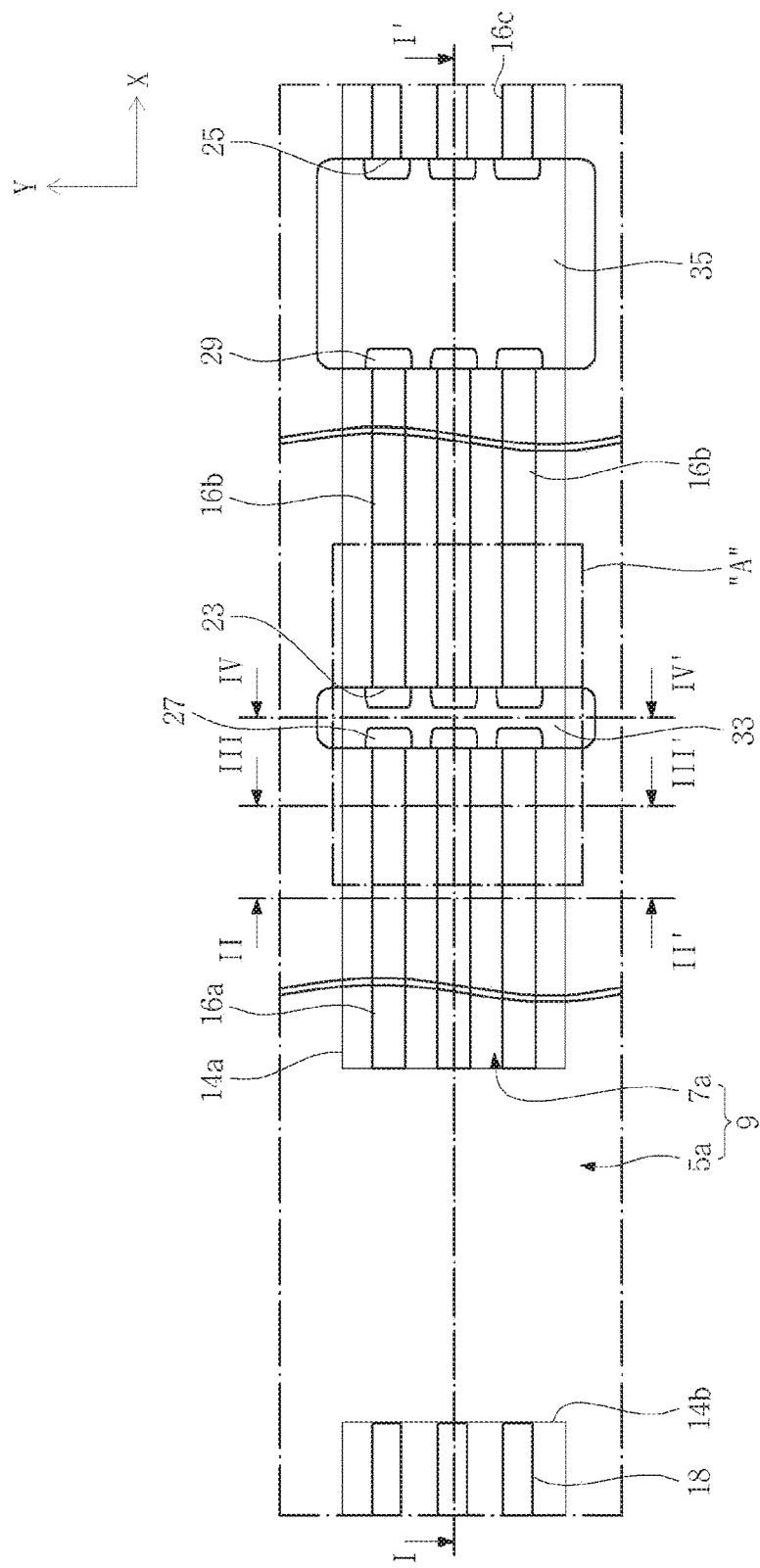
Figure 3A:
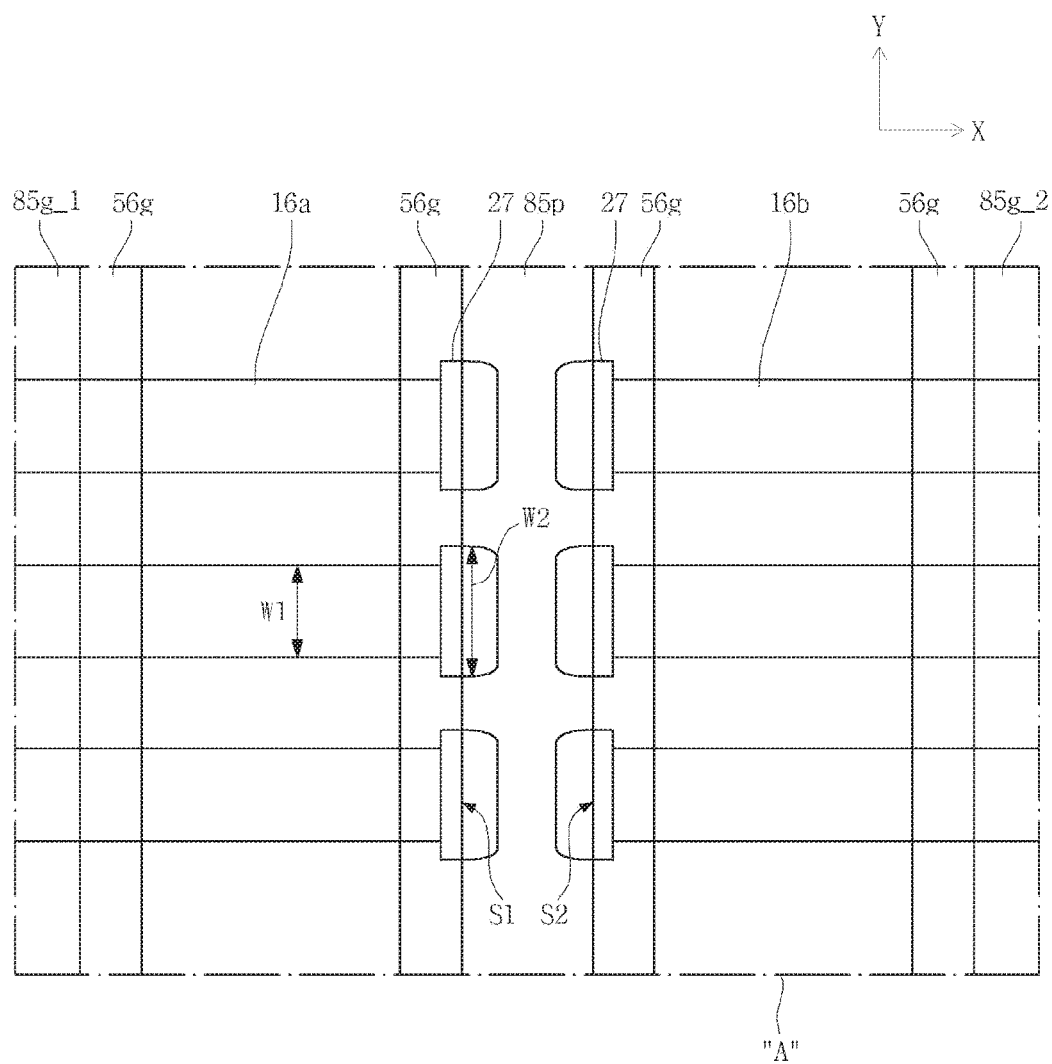
Figure 3B:
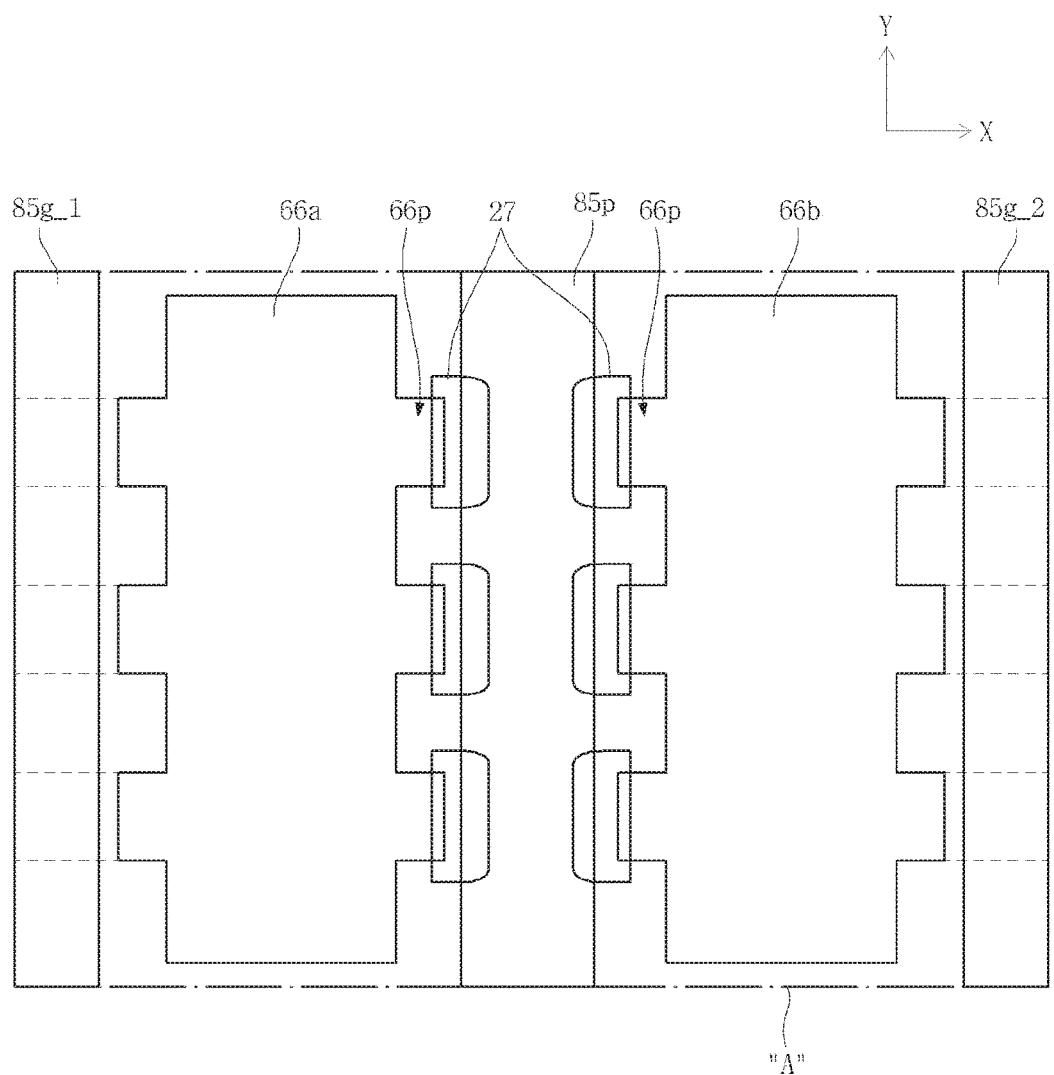

FIGS. 1, 2, 3A, and 3B are plan views showing a semiconductor device according to embodiments of the inventive concept. In FIGS. 1, 2, 3A, and 3B, FIG. 1 is a conceptual plan view showing the semiconductor device according to the embodiments of the inventive concept, FIG. 2 is a plan view showing some of the components of FIG. 1, FIG. 3A is a plan view showing some of the components in a portion "A" of FIG. 1, and FIG. 3B is a plan view showing the other components in the portion "A" of FIG. 1.

Figure 4A:
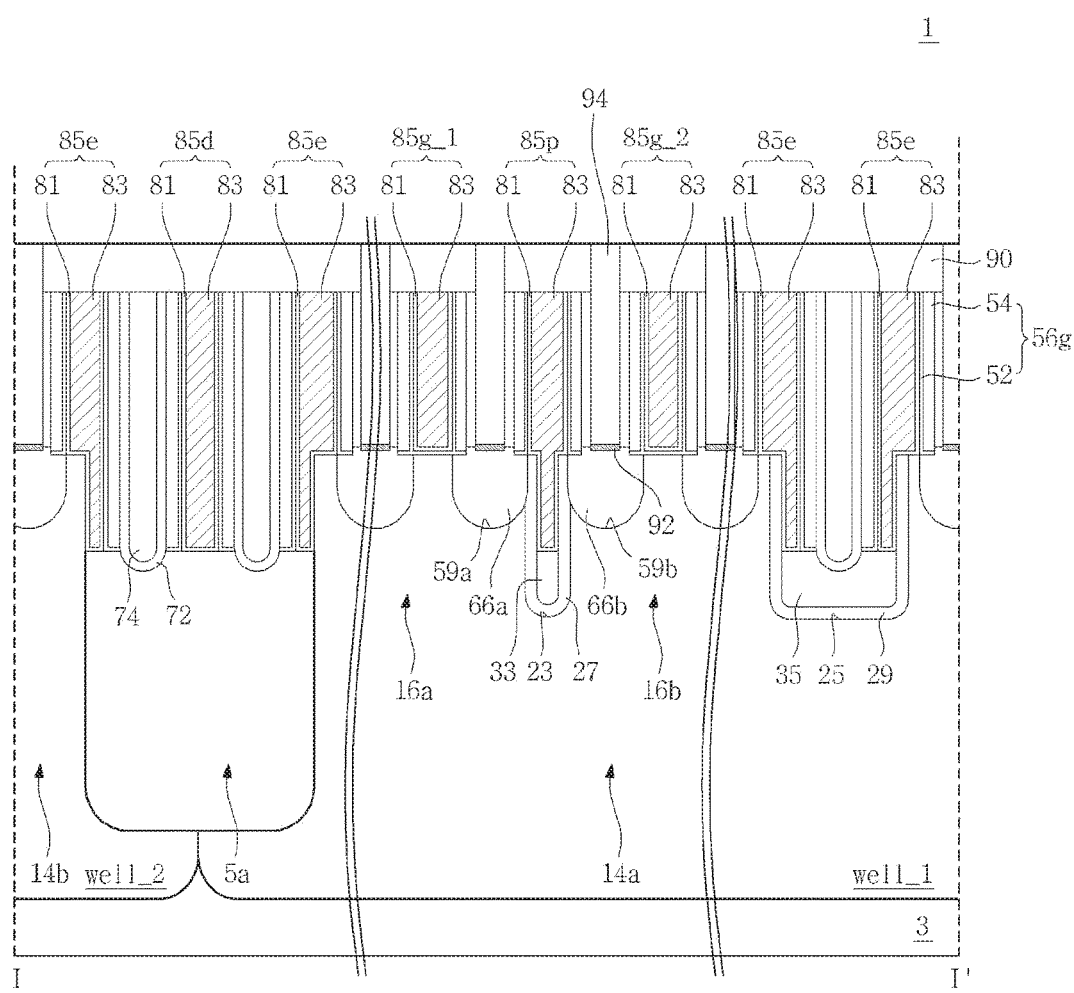
FIGS. 4A, 4B, and 4C are cross-sectional views showing a semiconductor device according to an embodiment of the inventive concept.
Figure 4B:
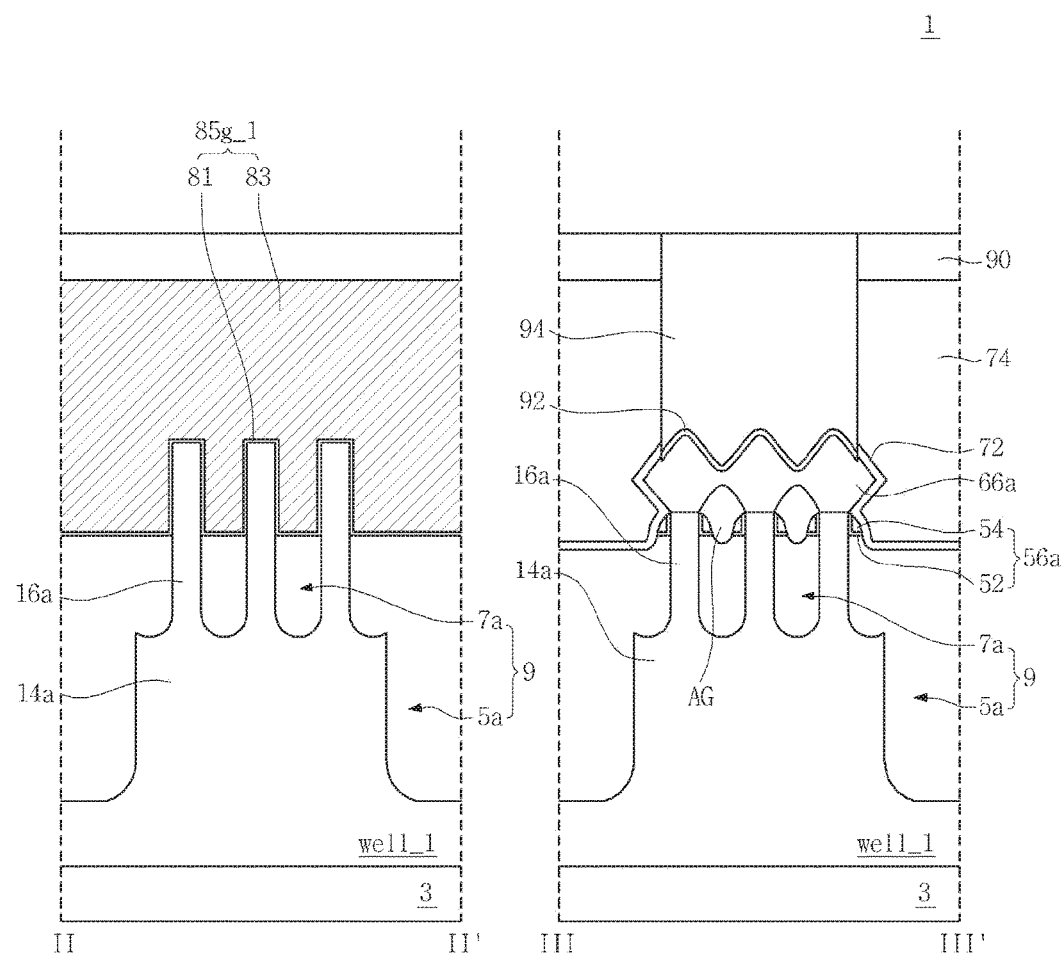
Figure 4C:
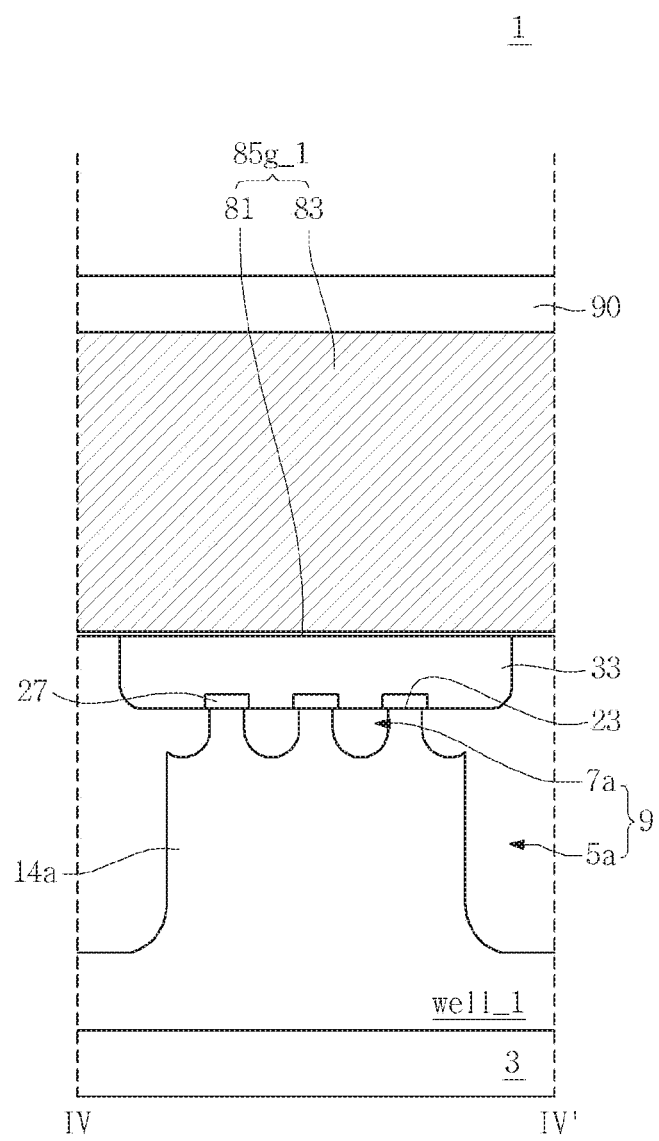

FIGS. 4A, 4B, and 4C are cross-sectional views showing a semiconductor device according to an embodiment of the inventive concept. In FIGS. 4A, 4B, and 4C, FIG. 4A is a cross-sectional view taken along line I-I' of FIG. 1, FIG. 4B is a cross-sectional view taken along lines II-II' and III-III' of FIG. 1, and FIG. 4C is a cross-sectional view taken along line IV-IV' of FIG. 1.

Figure 5A:
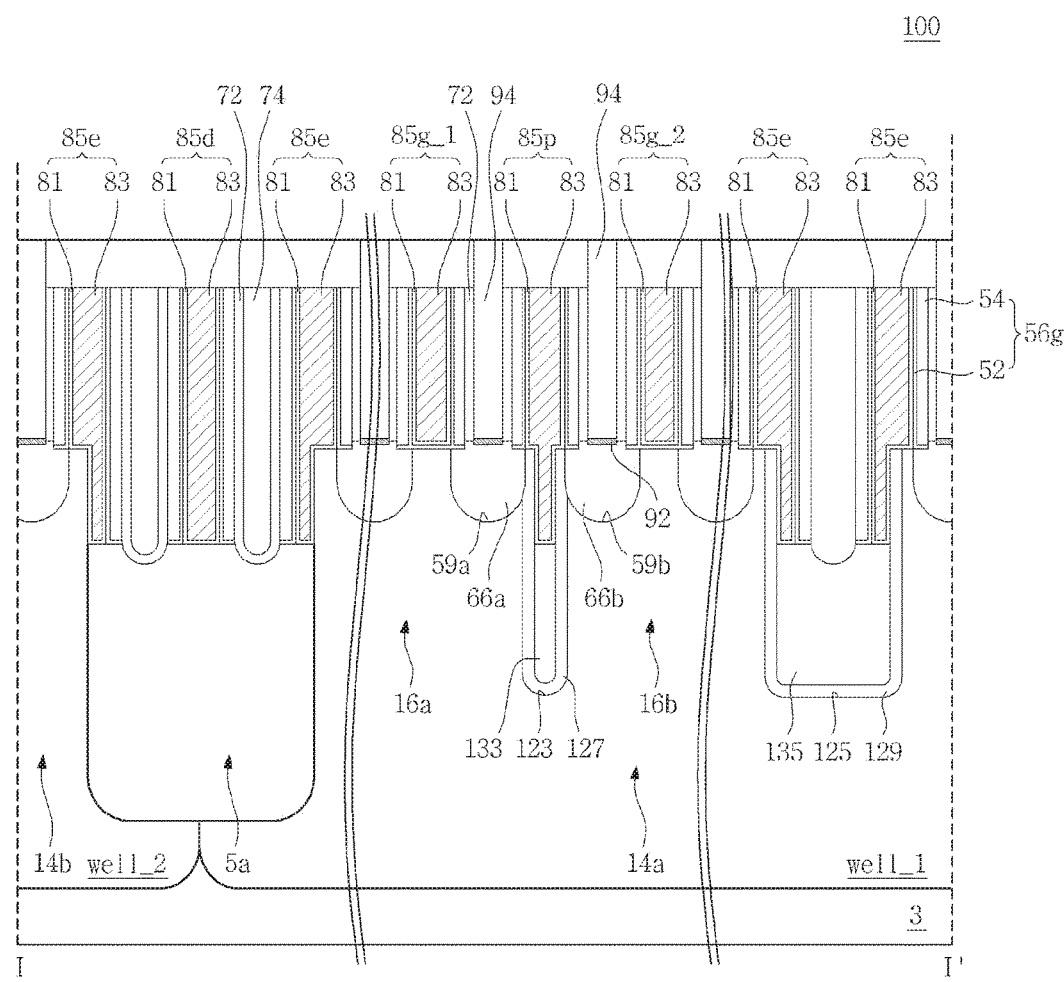
FIGS. 5A, 5B, and 5C are cross-sectional views showing a semiconductor device according to an embodiment of the inventive concept.
Figure 5B:
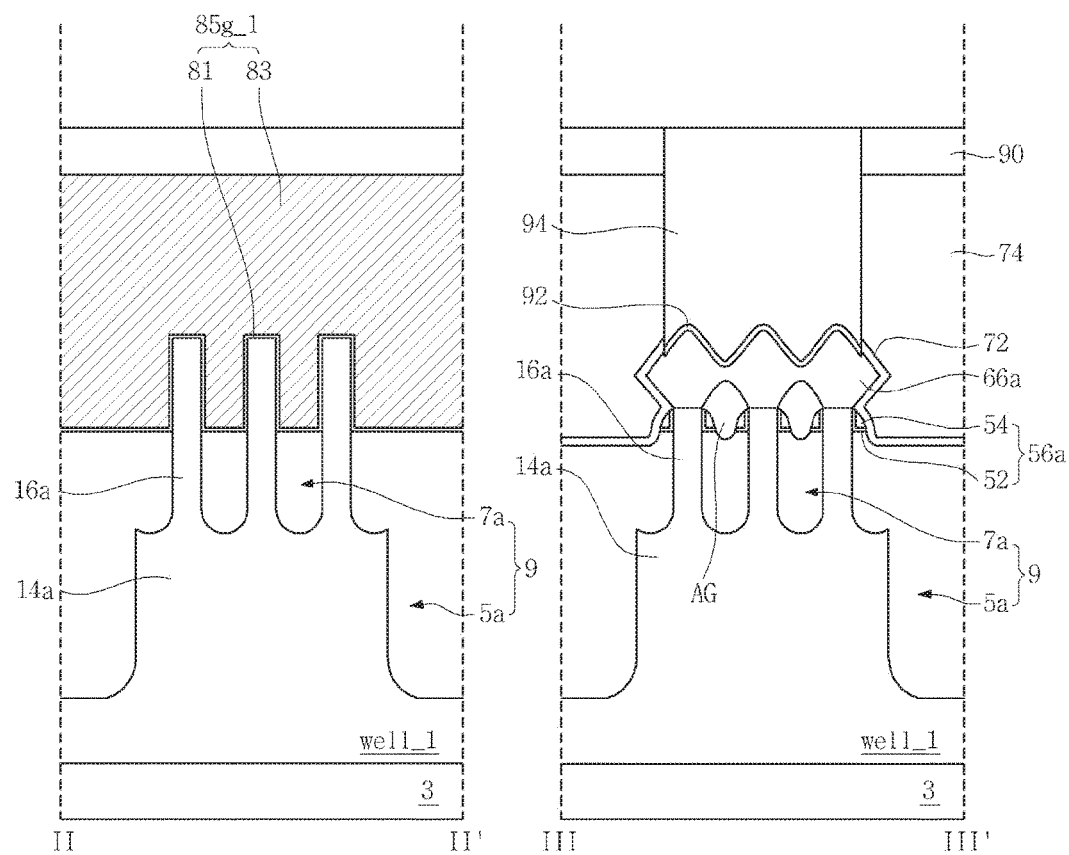
Figure 5C:
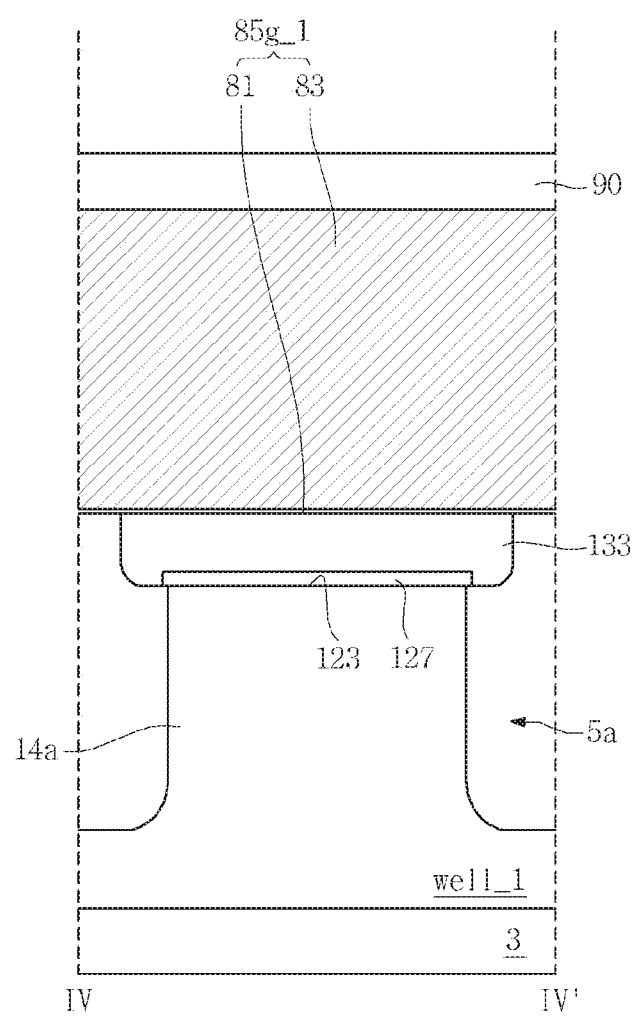

FIGS. 5A, 5B, and 5C are cross-sectional views showing a semiconductor device according to an embodiment of the inventive concept. In FIGS. 5A, 5B, and 5C, FIG. 5A is a cross-sectional view taken along line I-I' of FIG. 1, FIG. 5B is a cross-sectional view taken along lines II-II' and III-III' of FIG. 1, and FIG. 5C is a cross-sectional view taken along line IV-IV' of FIG. 1.

First, a semiconductor device 1 according to an embodiment of the inventive concept will be described with reference to FIGS. 1, 2, 3A, 3B, 4A, 4B, and 4C.

Referring to FIGS. 1, 2, 3A, 3B, 4A, 4B, and 4C, a field insulating layer 9 may be disposed on a semiconductor substrate 3. The semiconductor substrate 3 may be a substrate formed of a semiconductor material, such as silicon, etc. The field insulating layer 9 may be a trench isolation area, which may be formed using a trench isolation process. The field insulating layer 9 may include a deep portion 5a and a shallow portion 7a. The field insulating layer 9 may be formed of an oxide-based insulating material.

In the embodiments, the terms "deep" and "shallow" indicate relative depths, but the terms are not intended to limit the scope of the inventive concept.

A plurality of active regions 14a, 14b, 16a, 16b, 16c, and 18 may be disposed in the semiconductor substrate 3. The plurality of active regions 14a, 14b, 16a, 16b, 16c, and 18 may include the first and second lower active regions 14a and 14b defined by the deep portion 5a of the field insulating layer 9. The shallow portion 7a of the field insulating layer 9 may be disposed on the first and second lower active regions 14a and 14b. The plurality of active regions 14a, 14b, 16a, 16b, 16c, and 18 may include the first to fourth active regions 16a, 16b, 16c, and 18 defined by the shallow portion 7a of the field insulating layer 9. The first to fourth active regions 16a, 16b, 16c, and 18 may pass through the shallow portion 7a of the field insulating layer 9 and protrude from an upper portion of the field insulating layer 9.

The first to third active regions 16a, 16b, and 16c may be disposed on the first lower active region 14a. The fourth active regions 18 may be disposed on the second lower active region 14b.

The first lower active region 14a and the first to third active regions 16a, 16b, and 16c may be disposed in a first well region well_1, and the second lower active region 14b and the fourth active region 18 may be disposed in a second well region well_2. The first well region well_1 may have a different conductivity type from the second well region well_2.

The first to fourth active regions 16a, 16b, 16c, and 18 may have line shapes, which extend in a first direction X. Distances between the first active regions 16a and the second active regions 16b may be smaller than distances between the second active regions 16b and the third active regions 16c. The first active regions 16a may be disposed to face the second active regions 16b. The first active regions 16a and the second active regions 16b may have line shapes which extend in the same first direction X and side surfaces S1 and S2 facing each other. The first active regions 16a may have the first side surfaces S1 and the second active regions 16b may have the second side surfaces S2 facing the first side surfaces S1 of the first active regions 16a.

A first isolation pattern 33 may be disposed in a first field trench area 23 between the first active regions 16a and the second active regions 16b. The first isolation pattern 33 may be disposed between the first side surfaces S1 of the first active regions 16a and the second side surfaces S2 of the second active regions 16b.

The first isolation pattern 33 may be disposed between the first active regions 16a and the second active regions 16b and may extend into the shallow portion 7a of the field insulating layer 9. In a plan view, a width of the first isolation pattern 33 in the field insulating layer 9 may be greater than widths thereof between the first active regions 16a and the second active regions 16b.

A second isolation pattern 35 may be disposed in a second field trench area 25 between the second active regions 16b and the third active regions 16c. Levels of bottoms of the first and second field trench areas 23 and 25 may be higher than a level of a bottom of the shallow portion 7a of the field insulating layer 9.

The first and second isolation patterns 33 and 35 may be disposed at a lower level than upper surfaces of the first to third active regions 16a, 16b, and 16c. The first and second isolation patterns 33 and 35 may be spaced apart from the first to third active regions 16a, 16b, and 16c. The first and second isolation patterns 33 and 35 may be formed of an insulating material (e.g., an oxide-based insulating material and/or a nitride-based insulating material).

The first to third active regions 16a, 16b, and 16c may have line shapes, which extend in the first direction X and the first and second isolation patterns 33 and 35 may have elongated shapes in a second direction Y perpendicular to the first direction X.

Because a level of a bottom of the first field trench area 23 may be higher than a level of the bottom of the shallow portion 7a of the field insulating layer 9, a portion of the shallow portion 7a of the field insulating layer 9 may be disposed between the first isolation pattern 33 and the first lower active region 14a as shown in FIG. 4C.

A first semiconductor extension layer 27 may be disposed between the first and second active regions 16a and 16b. The first semiconductor extension layer 27 may be disposed in the first field trench area 23 between the first and second active regions 16a and 16b. The side surfaces S1 and S2 of the first and second active regions 16a and 16b may be closer to the first semiconductor extension layer 27 than the first isolation pattern 33. The first semiconductor extension layer 27 may be in contact with the side surfaces S1 and S2 of the first and second active regions 16a and 16b.

The first semiconductor extension layer 27 may cover side surfaces and a bottom of the first isolation pattern 33. The first semiconductor extension layer 27 may be disposed between the first isolation pattern 33 and the first side surface S1 of the first active region 16a and between the first isolation pattern 33 and the second side surface S2 of the second active region 16b and may extend under the first isolation pattern 33. A level of an upper end of the first semiconductor extension layer 27 may be higher than a level of an upper surface of the first isolation pattern 33. The first semiconductor extension layer 27 may be disposed in a "U" shape.

A second semiconductor extension layer 29 may be disposed between the second and third active regions 16b and 16c. The second semiconductor extension layer 29 may be disposed in the second field trench area 25 between the second and third active regions 16b and 16c. The second semiconductor extension layer 29 may be disposed in a "U" shape.

The first and second semiconductor extension layers 27 and 29 may be epitaxial layers. The first and second semiconductor extension layers 27 and 29 may be epitaxial layers formed by performing a selective epitaxial growth (SEG) process. The first and second semiconductor extension layers 27 and 29 may have the same conductivity types as the first and second active regions 16a and 16b.

A width W1 of each of the first and second active regions 16a and 16b in the second direction Y may be smaller than a width W2 of each of the first and second semiconductor extension layers 27 and 29 in the second direction Y.

A plurality of gate patterns 85e, 85d, 85g_1, 85p, and 85g_2 may be disposed on the semiconductor substrate 3. The plurality of gate patterns 85e, 85d, 85g_1, 85p, and 85g_2 may have line shapes or elongated shapes, which extend in the second direction Y.

Each of the plurality of gate patterns 85e, 85d, 85g_1, 85p, and 85g_2 may include a gate dielectric 81 and a gate electrode 83. The gate dielectric 81 may be disposed on side surfaces and a bottom of the gate electrode 83. The gate dielectric 81 may include silicon oxide and/or a metal oxide having a greater dielectric constant than silicon oxide. The gate electrode 83 may include a first conductive material and a second conductive material. The first conductive material may include a barrier conductive material, such as titanium (Ti), titanium nitride (TiN), tantalum (Ta), tantalum nitride (TaN), or the like, and the second conductive material may include a metal, such as tungsten (W), an alloy, or a metal compound.

The plurality of gate patterns 85e, 85d, 85g_1, 85p, and 85g_2 may include the first gate pattern 85g_1, which crosses the first active regions 16a and overlaps the first active regions 16a, the first dummy gate pattern 85p disposed on the first isolation pattern 33, the second gate pattern 85g_2, which crosses the second active regions 16b and overlaps the second active regions 16b, the second dummy gate pattern 85d disposed on the deep portion 5a of the field insulating layer 9, and the edge gate patterns 85e, which overlap end portions of the first to fourth active regions 16a, 16b, 16c, and 18. The first gate pattern 85g_1 may overlap upper surfaces and side surfaces of portions, which protrude from the field insulating layer 9 of the first active regions 16a. The second gate pattern 85g_2 may overlap upper surfaces and side surfaces of portions which protrude from the field insulating layer 9 of the second active regions 16b.

The first dummy gate pattern 85p may be disposed between the first and second gate patterns 85g_1 and 85g_2. The first dummy gate pattern 85p may be disposed on the first isolation pattern 33.

The first dummy gate pattern 85p may overlap the first isolation pattern 33 and cover the upper surface of the first isolation pattern 33. The first dummy gate pattern 85p may overlap first semiconductor extension layers 27 located on both sides of the first isolation pattern 33. The first dummy gate pattern 85p may extend between the first and second active regions 16a and 16b and may be in contact with the upper surface of the first isolation pattern 33.

First recessed areas 59a may be disposed in the first active regions 16a located at both sides of the first gate pattern 85g_1 and second recessed areas 59b may be disposed in the second active regions 16b located at both sides of the second gate pattern 85g_2.

First source/drain semiconductor layers 66a may be disposed in the first recessed areas 59a and second source/drain semiconductor layers 66b may be disposed in the second recessed areas 59b. The first and second source/drain semiconductor layers 66a and 66b may be formed of different materials from the first and second semiconductor extension layers 27 and 29 or epitaxial layers having different com-position ratios. The first and second source/drain semiconductor layers 66a and 66b may be formed as different conductivity types from the first and second semiconductor extension layers 27 and 29.

Among the first source/drain semiconductor layers 66a, the first source/drain semiconductor layer near the first isolation pattern 33 may have a portion 66p in contact with the first semiconductor extension layer 27. Among the second source/drain semiconductor layers 66b, the second source/drain semiconductor layer near the first isolation pattern 33 may have a portion 66p in contact with the first semiconductor extension layer 27. Among the second source/drain semiconductor layers 66b, the second source/drain semiconductor layer near the second isolation pattern 35 may be spaced apart from the second semiconductor extension layer 29.

An extended portion of the first dummy gate pattern 85p may be interposed between the first and second source/drain semiconductor layers 66a and 66b facing each other due to the interposition of the first field trench area 23. The extended portion of the first dummy gate pattern 85p may be a portion that extends between the first and second active regions 16a and 16b. A portion of the first semiconductor extension layer 27 may be interposed between the extended portion of the first dummy gate pattern 85p and the first and second source/drain semiconductor layers 66a and 66b.

Air gaps AG may be disposed between the shallow portion 7a of the field insulating layer 9, which is located between the first active regions 16a, and the first source/drain semiconductor layers 66a. In the same manner, the air gaps AG may be disposed between the shallow portion 7a of the field insulating layer 9, which is located between the second active regions 16b, and the second source/drain semiconductor layers 66b.

Gate spacers 56g may be disposed on side surfaces of the plurality of gate patterns 85e, 85d, 85g_1, 85p, and 85g_2.

Active spacers 56a may be disposed on side surfaces of protruding portions of the first and second active regions 16a and 16b located under the first and second source/drain semiconductor layers 66a and 66b. Each of the gate spacers 56g and the active spacers 56a may include an inner spacer 52 and an outer spacer 54 disposed on the inner spacer 52. The gate spacers 56g and the active spacers 56a may be formed of an insulating material. The inner spacer 52 may include an insulating nitride (e.g., SiN) and the outer spacer 54 may be formed of an insulating oxide (e.g., SiO) or an insulating oxide (e.g., SiOC) including carbon.

An insulating stopper layer 72 and a lower interlayer insulating layer 74 may be disposed on the semiconductor substrate 3 having the plurality of gate patterns 85e, 85d, 85g_1, 85p, and 85g_2, the gate spacers 56g, the active spacers 56a, and the first and second source/drain semiconductor layers 66a and 66b. The insulating stopper layer 72 may be conformally formed. The lower interlayer insulating layer 74 may be formed on the insulating stopper layer 72 and may not overlap upper surfaces of the plurality of gate patterns 85e, 85d, 85g_1, 85p, and 85g_2.

An upper interlayer insulating layer 90 may be disposed on the plurality of gate patterns 85e, 85d, 85g_1, 85p, and 85g_2 and the lower interlayer insulating layer 74.

Contact structures 94 may be disposed on the first and second source/drain semiconductor layers 66a and 66b. The contact structures 94 may pass through the lower and upper interlayer insulating layers 74 and 90. The contact structures 94 may be formed of a conductive material, for example, a metal nitride and/or a metal material. The gate spacers 56g and the insulating stopper layer 72 may be interposed between the plurality of gate patterns 85e, 85d, 85g_1, 85p, and 85g_2 and the contact structures 94. Silicide layers 92 may be disposed between the first and second source/drain semiconductor layers 66a and 66b and the contact structures 94.

Next, a semiconductor device 100 according to an embodiment of the inventive concept will be described with reference to FIGS. 1, 2, 3A, 3B, 5A, 5B, and 5C.

Referring to FIGS. 1, 2, 3A, 3B, 5A, 5B, and 5C, the field insulating layer 9, the plurality of active regions 14a, 14b, 16a, 16b, 16c, and 18, the plurality of gate patterns 85e, 85d, 85g_1, 85p, and 85g_2, the first and second source/drain semiconductor layers 66a and 66b, the gate spacers 56g, the active spacers 56a, the insulating stopper layer 72, the lower and upper interlayer insulating layers 74 and 90, the silicide layers 92, and the contact structures 94 may be disposed on the semiconductor substrate 3 as illustrated in FIGS. 4A, 4B, and 4C.

A first field trench area 123 may be disposed between the first and second active regions 16a and 16b and a second field trench area 125 may be disposed between the second and third active regions 16b and 16c.

Levels of bottoms of the first and second field trench areas 123 and 125 may be lower than a level of the bottom of the shallow portion 7a of the field insulating layer 9. The first field trench area 123 may be disposed between the first and second active regions 16a and 16b and may extend into the first lower active region 14a, and the second field trench area 125 may be disposed between the second and third active regions 16b and 16c and may extend into the first lower active region 14a.

A first semiconductor extension layer 127 may be disposed in the first field trench area 123 disposed between the first and second active regions 16a and 16b. A second semiconductor extension layer 129 may be disposed in the second field trench area 125 disposed between the second and third active regions 16b and 16c. The first and second semiconductor extension layers 127 and 129 may have a "U" shape. The first semiconductor extension layer 127 may be in contact with the first and second source/drain semiconductor layers 66a and 66b.

A first isolation pattern 133 may be disposed on the first semiconductor extension layer 127 and a second isolation pattern 135 may be disposed on the second semiconductor extension layer 129. A level of upper surfaces of the first and second isolation patterns 133 and 135 may be lower than a level of the upper surfaces of the first to third active regions 16a, 16b, and 16c. The first isolation pattern 133 may be disposed under the first dummy gate pattern 85p.

According to the embodiments of the inventive concept, the semiconductor device having a structure in which the first isolation pattern 133 disposed in the first field trench area 123 and the first and second source/drain semiconductor layers 66a and 66b formed as epitaxial layers facing each other due to the interposition of a lower extended portion of the first dummy gate pattern 85p may be stably formed may be provided. As the first semiconductor extension layer 127 is disposed between the first and second source/drain semiconductor layers 66a and 66b, the first and second source/drain semiconductor layers 66a and 66b capable of being formed as the epitaxial layers may be stably formed. For example, because the first and second source/drain semiconductor layers 66a and 66b may be epitaxially grown from the first semiconductor extension layer 127 as well as the first and second active regions 16a and 16b, the first and second source/drain semiconductor layers 66a and 66b adjacent to the first field trench area 123 may be stably formed.

Next, a semiconductor device according to an embodiment of the inventive concept will be described with reference to FIGS. 6, 7A, 7B, 8A, 8B, and 8C.

Figure 6:
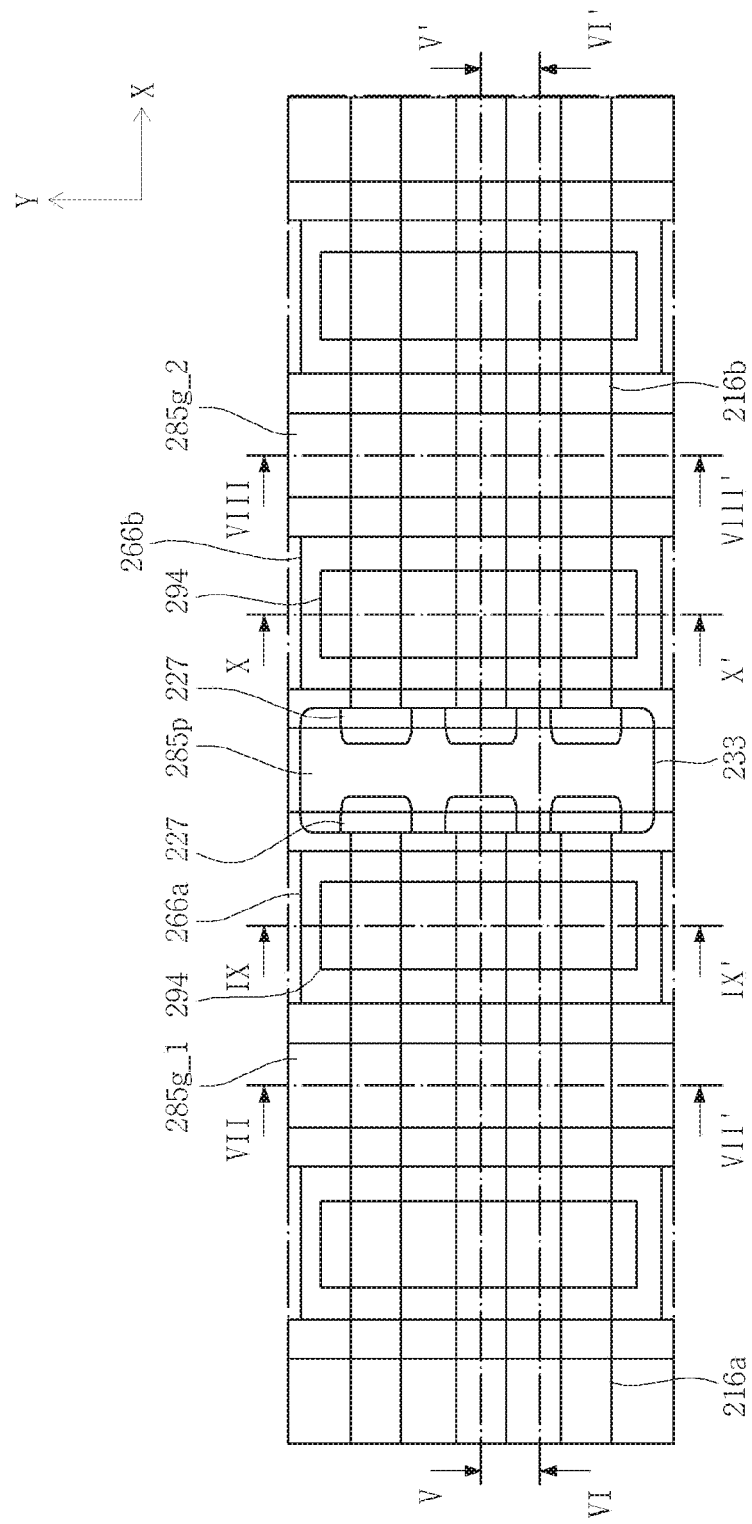
FIGS. 6, 7A, and 7B are plan views showing a semiconductor device according to an embodiment of the inventive concept.
Figure 7A:
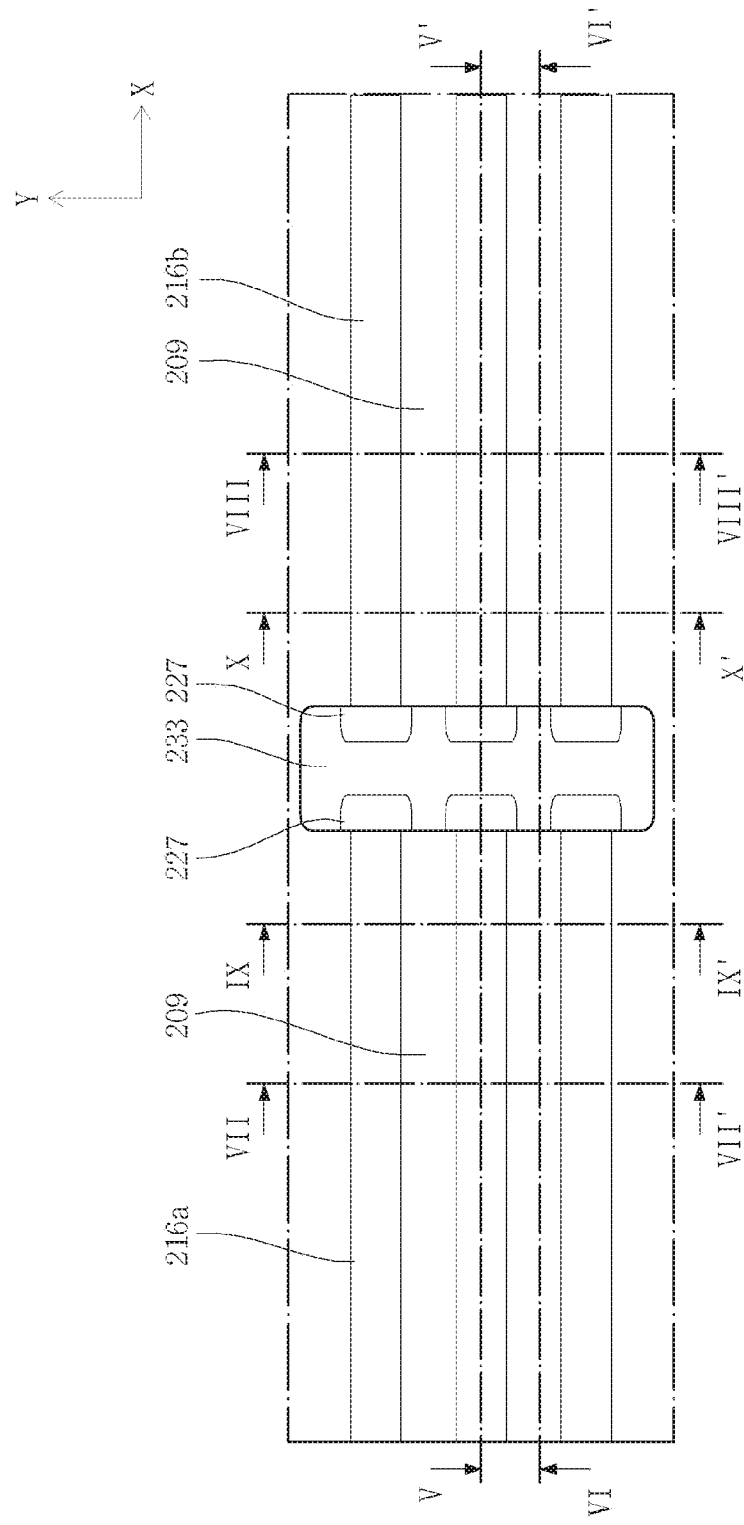
Figure 7B:
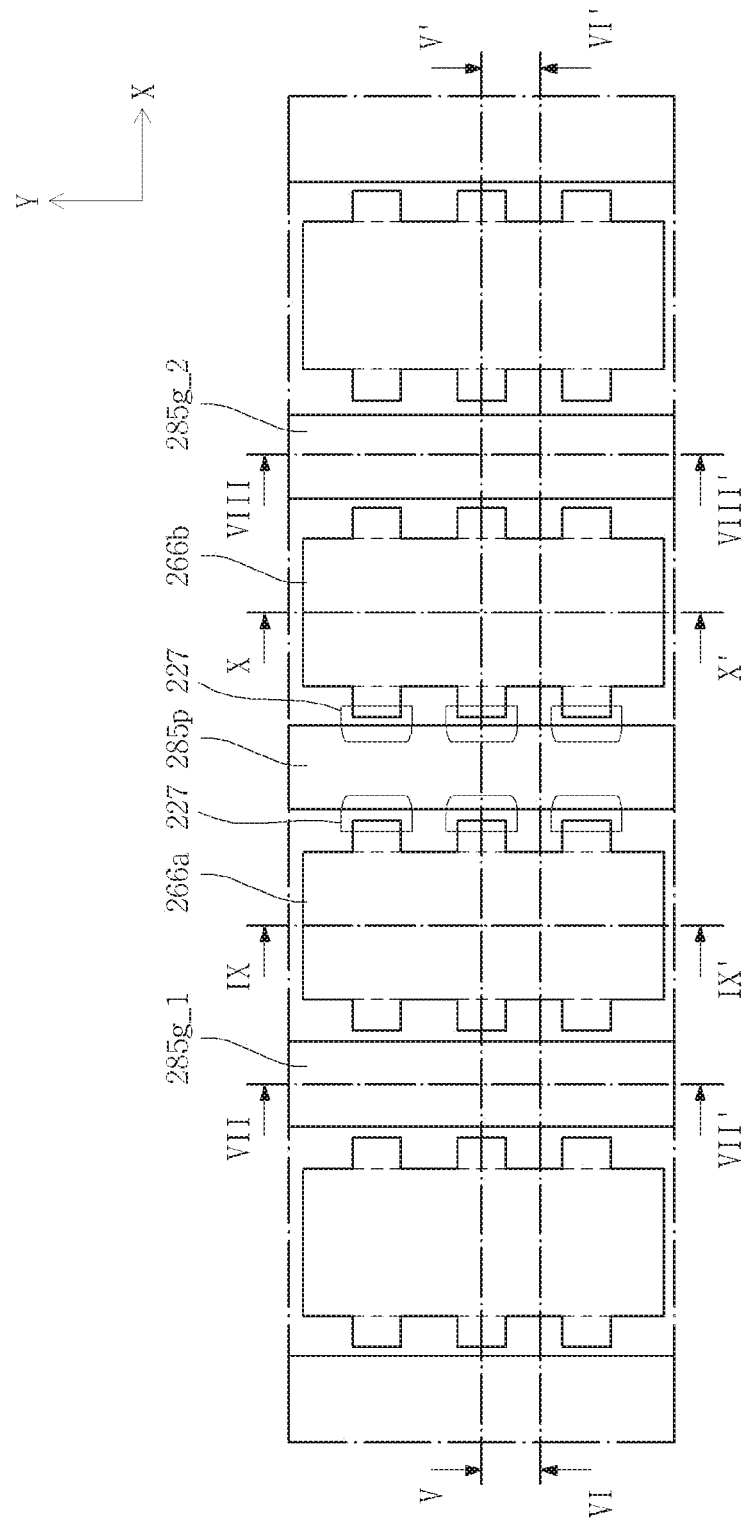

FIGS. 6, 7A, and 7B are plan views showing a semiconductor device according to an embodiment of the inventive concept. In FIGS. 6, 7A, and 7B, FIG. 6 is a conceptual plan view showing the semiconductor device according to the embodiment of the inventive concept, and FIGS. 7A and 7B are plan views showing some components of FIG. 6.

Figure 8A:
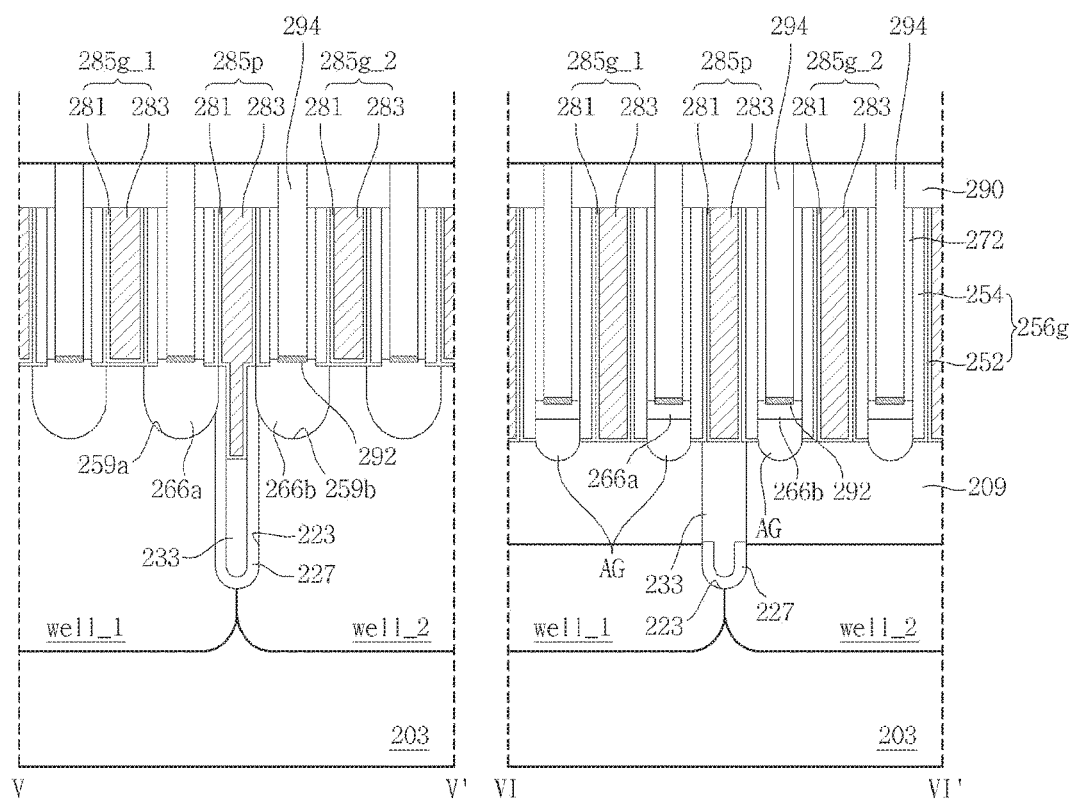
FIGS. 8A, 8B, and 8C are cross-sectional views showing a semiconductor device according to an embodiment of the inventive concept.
Figure 8B:
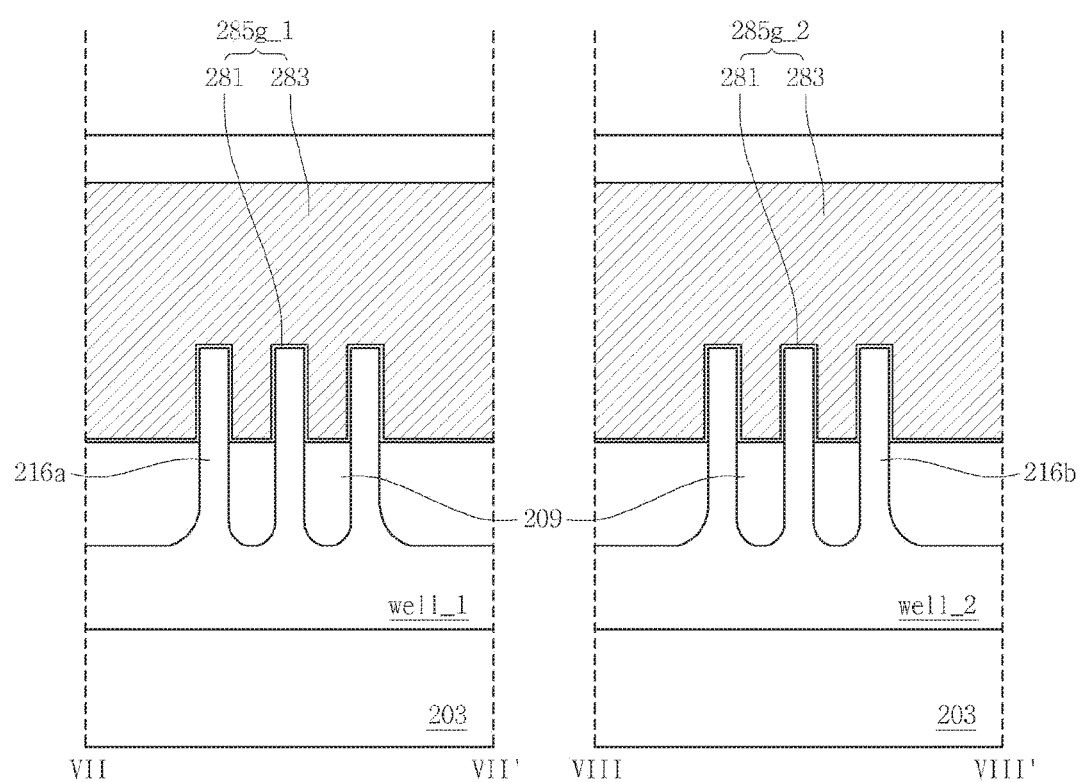
Figure 8C:
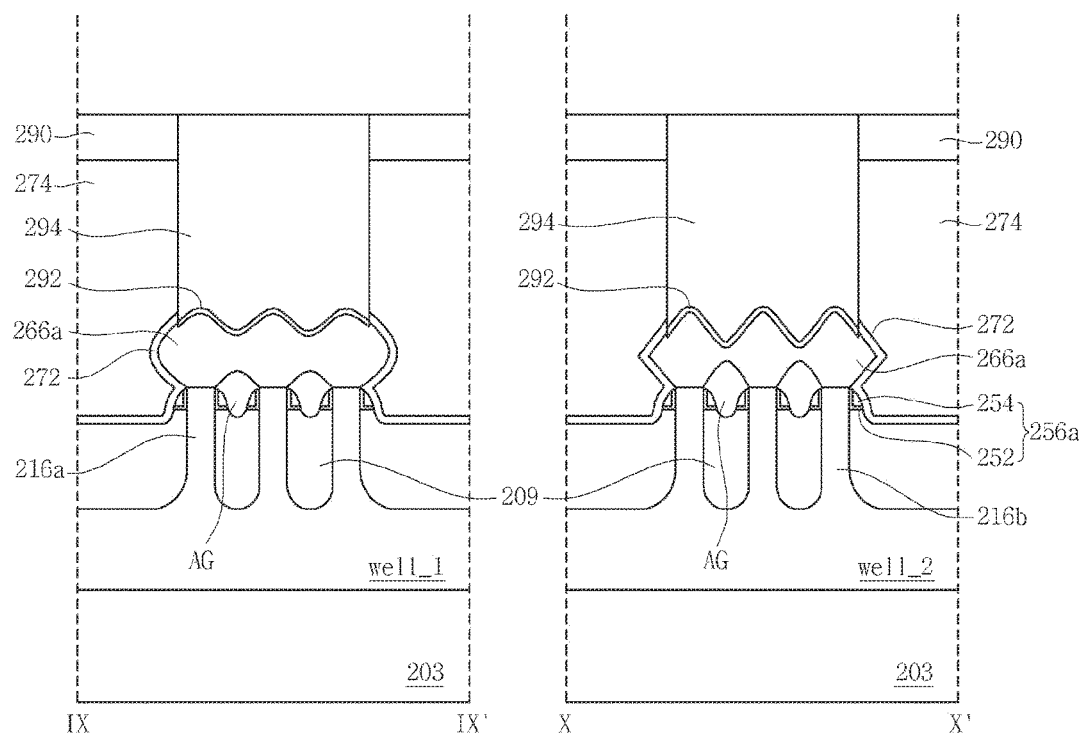

FIGS. 8A, 8B, and 8C are cross-sectional views showing a semiconductor device according to an embodiment of the inventive concept. In FIGS. 8A, 8B, and 8C, FIG. 8A is a cross-sectional view taken along lines V-V' and VI-VI' of FIG. 6, FIG. 8B is a cross-sectional view taken along lines VII-VII' and VIII-VIII' of FIG. 6, and FIG. 8C is a cross-sectional view taken along lines IX-IX' and X-X' of FIG. 6.

Referring to FIGS. 6, 7A, 7B, 8A, 8B, and 8C, a field insulating layer 209 may be disposed on a semiconductor substrate 203. The semiconductor substrate 203 may be a substrate formed of a semiconductor material, such as silicon, etc. The field insulating layer 209 may be a trench isolation area formed using a trench isolation process.

A plurality of active regions 216a and 216b may be disposed in the semiconductor substrate 203 to pass through the field insulating layer 209 and protrude from an upper portion of the field insulating layer 209.

The plurality of active regions 216a and 216b may include the first active regions 216a and the second active regions 216b. The first active regions 216a may be disposed in a first well region well_1 of the semiconductor substrate 203 and the second active regions 216b may be disposed in a second well region well_2 of the semiconductor substrate 203. The first well region well_1 may have a different conductivity type from the second well region well_2.

The first active regions 216a and the second active regions 216b may have side surfaces facing each other. A field trench area 223 may be disposed between the first active regions 216a and the second active regions 216b.

An isolation pattern 233 may be disposed in the field trench area 223. The isolation pattern 233 may be formed of an insulating material.

A semiconductor extension layer 227 may be disposed in the field trench area 223 disposed between the first active regions 216a and the second active regions 216b. The semiconductor extension layer 227 may be disposed on side walls and a bottom of the field trench area 223. The semiconductor extension layer 227 may have a "U" shape. The semiconductor extension layer 227 may be interposed between the isolation pattern 233 and the first and second active regions 216a and 216b. A level of an upper end of the semiconductor extension layer 227 may be higher than a level of an upper surface of the isolation pattern 233. The semiconductor extension layer 227 may be an epitaxial layer formed by performing an SEG process. The semiconductor extension layer 227 may be in contact with the first and second active regions 216a and 216b.

The first and second active regions 216a and 216b may have line shapes which extend in a first direction X. In a second direction Y perpendicular to the first direction X, the first and second active regions 216a and 216b may have smaller widths than the semiconductor extension layer 227.

A first gate pattern 285g_1 may overlap the first active regions 216a and a second gate pattern 285g_2 may overlap the second active regions 216b. A dummy gate pattern 285p may be disposed between the first and second gate patterns 285g_1 and 285g_2. Each of the first and second gate patterns 285g_1 and 285g_2 and the dummy gate pattern 285p may include a gate dielectric 281 and a gate electrode 283. The gate dielectric 281 may be disposed on side surfaces and a bottom of the gate electrode 283.

First recessed areas 259a may be disposed in the first active regions 216a located at both sides of the first gate pattern 285g_1 and second recessed areas 259b may be disposed in the second active regions 216b located at both sides of the second gate pattern 285g_2.

First source/drain semiconductor layers 266a may be disposed in the first recessed areas 259a and second source/drain semiconductor layers 266b may be disposed in the second recessed areas 259b. The first and second source/drain semiconductor layers 266a and 266b may be formed as different conductivity types. For example, the first source/drain semiconductor layer 266a may have different conductivity types from the first well region well_1 and the second source/drain semiconductor layer 266b may have different conductive types from the second well region well_2.

The first and second source/drain semiconductor layers 266a and 266b may be formed of epitaxial layers having different materials. For example, the first source/drain semiconductor layer 266a may be formed of an epitaxial layer having a silicon material and the second source/drain semiconductor layer 266b may be formed of an epitaxial layer having a silicon germanium material.

Among the first source/drain semiconductor layers 266a, a first source/drain semiconductor layer near the isolation pattern 233 may be in contact with the semiconductor extension layer 227. Among the second source/drain semiconductor layers 266b, a second source/drain semiconductor layer near the isolation pattern 233 may be in contact with the semiconductor extension layer 227.

Air gaps AG may be disposed between the field insulating layer 209, which is located between the first active regions 216a, and the first source/drain semiconductor layers 266a. In the same manner, the air gaps AG may be disposed between the field insulating layer 209, which is located between the second active regions 216b, and the second source/drain semiconductor layers 266b.

Gate spacers 256g may be disposed on side surfaces of the first and second gate patterns 285g_1 and 285g_2 and the dummy gate pattern 285p. Active spacers 256a may be disposed on side surfaces of protruding portions of the first and second active regions 216a and 216b located under the first and second source/drain semiconductor layers 266a and 266b. Each of the gate spacers 256g and the active spacers 256a may include an inner spacer 252 and an outer spacer 254 disposed on the inner spacer 252. The gate spacers 256g and the active spacers 256a may be formed of an insulating material. The inner spacer 252 may include an insulating nitride (e.g., SiN), and the outer spacer 254 may be formed of an insulating oxide (e.g., SiO) or an insulating oxide (e.g., SiOC) including carbon.

An insulating stopper layer 272 and a lower interlayer insulating layer 274 may be disposed on the semiconductor substrate 203 having the gate patterns 285g_1, 285p, and 285g_2, the gate spacers 256g, the active spacers 256a, and the first and second source/drain semiconductor layers 266a and 266b. The insulating stopper layer 272 may be conformally formed. The lower interlayer insulating layer 274 may be formed on the insulating stopper layer 272 and may not overlap upper surfaces of the gate patterns 285g_1, 285p, and 285g_2.

An upper interlayer insulating layer 290 may be disposed on the gate patterns 285g_1, 285p, and 285g_2 and the lower interlayer insulating layer 274.

Contact structures 294 may be disposed on the first and second source/drain semiconductor layers 266a and 266b. The contact structures 294 may pass through the lower and upper interlayer insulating layers 274 and 290. The contact structures 294 may be formed of a conductive material, for example, a metal nitride and/or a metal material. The gate spacers 256g and the insulating stopper layer 272 may be interposed between the gate patterns 285g_1, 285p, and 285g_2 and the contact structures 294. Silicide layers 292 may be disposed between the first and second source/drain semiconductor layers 266a and 266b and the contact structures 294.

Next, an example of a method of forming the semiconductor device 1 described with reference to FIGS. 1, 2, 3A, 3B, 4A, 4B, and 4C will be described with reference to FIGS. 9 to 23B. In FIGS. 9 to 23B, FIGS. 9, 11, 13, 16, 18, and 21 are plan views illustrating the example of the method of forming the semiconductor device according to the embodiment of the inventive concept, and FIGS. 10A, 10B, 12A, 12B, 14A, 14B, 15A, 15B, 17A, 17B, 19A, 19B, 20A, 20B, 22A, 22B, 23A, and 23B are cross-sectional views illustrating the example of the method of forming the semiconductor device according to an embodiment of the inventive concept.

Figure 9:
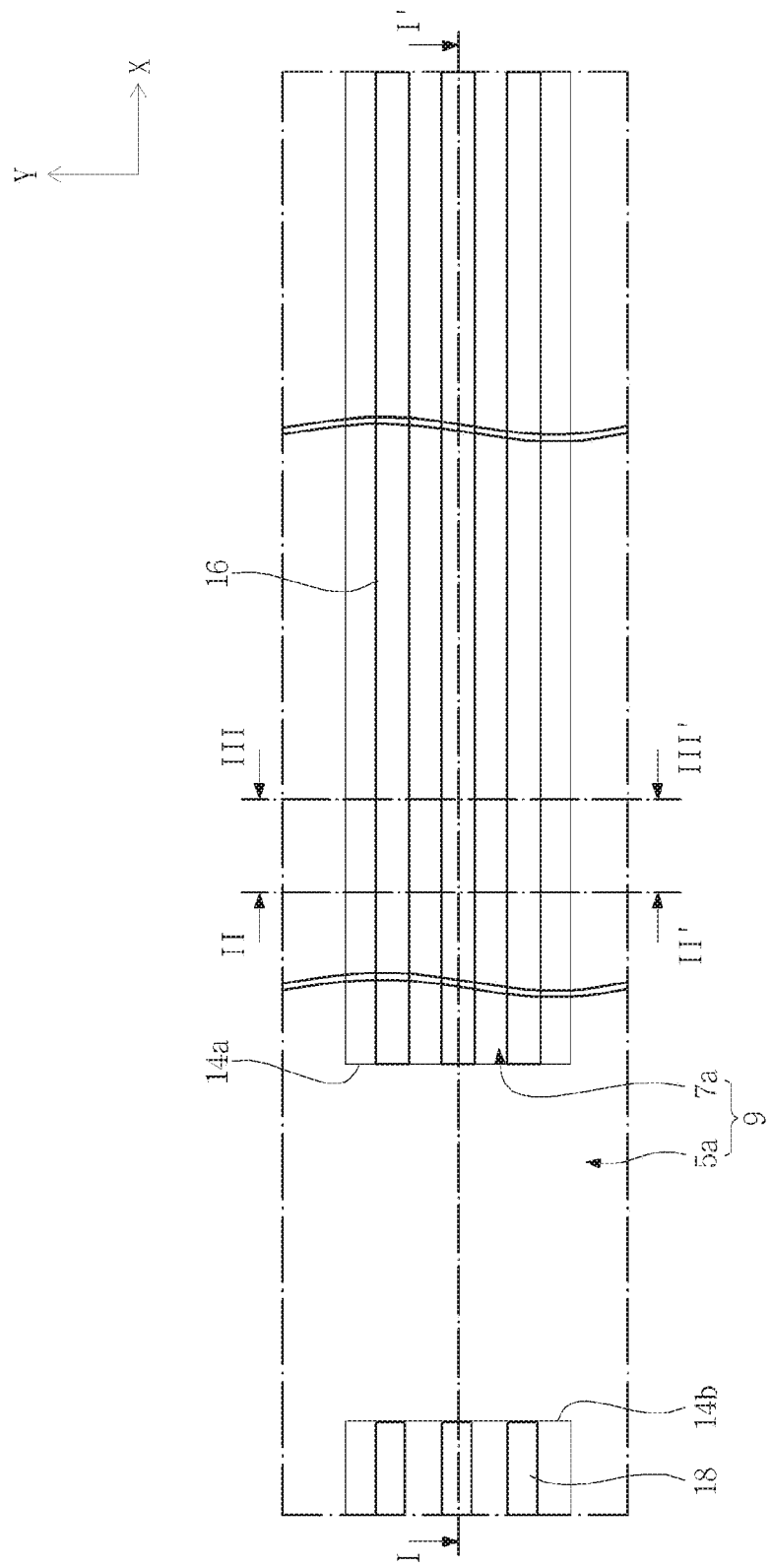
FIGS. 9, 11, 13, 16, 18, and 21 are plan views illustrating an example of a method of forming a semiconductor device according to an embodiment of the inventive concept.
Figure 10A:
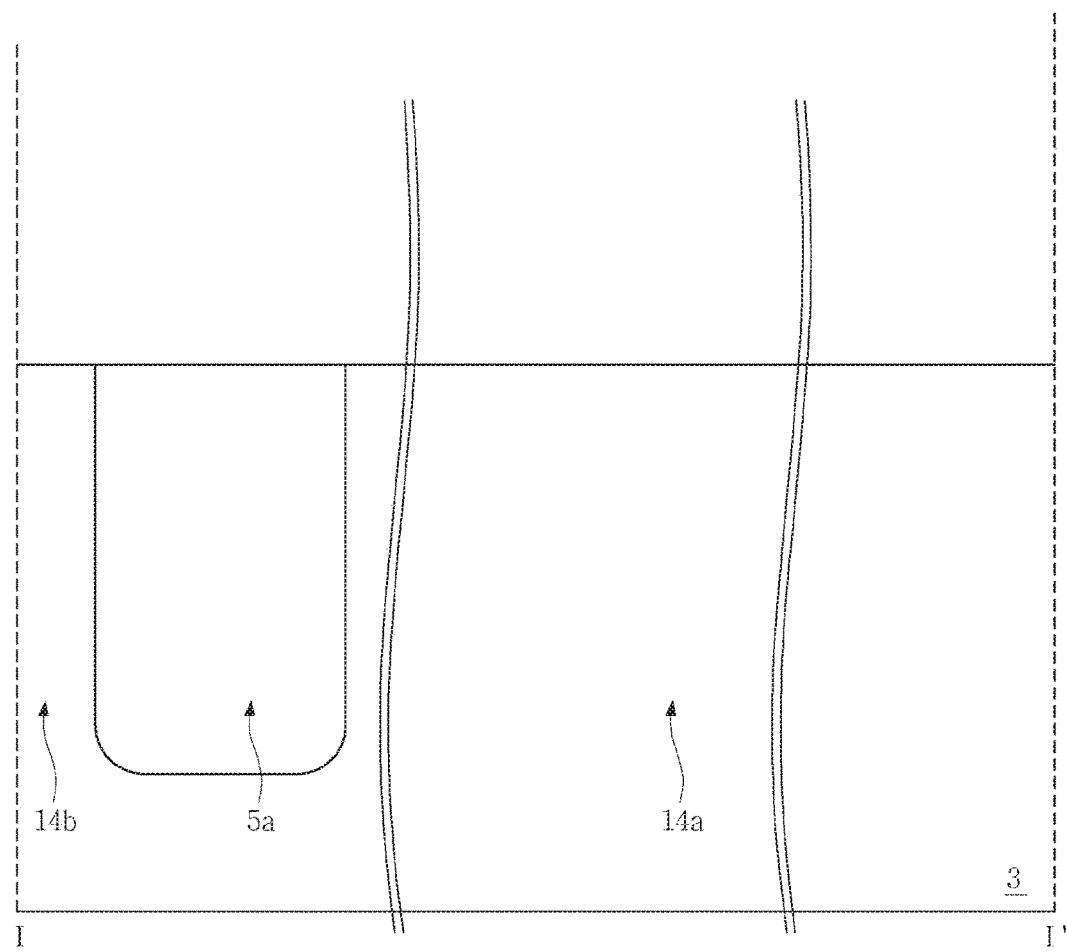
FIGS. 10A, 10B, 12A, 12B, 14A, 14B, 15A, 15B, 17A, 17B, 19A, 19B, 20A, 20B, 22A, 22B, 23A, and 23B are cross-sectional views illustrating an example of a method of forming a semiconductor device according to an embodiment of the inventive concept.
Figure 10B:
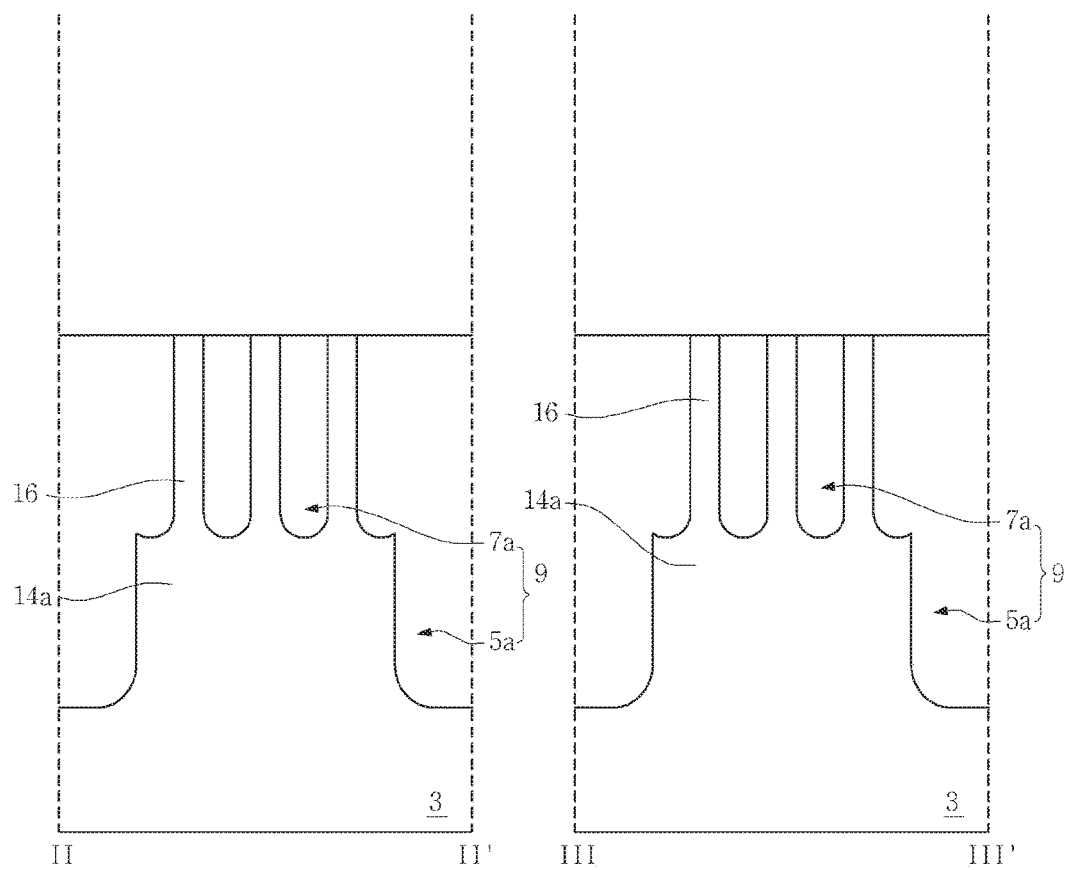

Referring to FIGS. 9, 10A, and 10B, the method of forming the semiconductor device according to the embodiment of the inventive concept may include forming a field insulating layer 9, which defines a plurality of active regions 14a, 14b, 16, and 18 in a semiconductor substrate 3. The field insulating layer 9 may be formed using a trench isolation process. The field insulating layer 9 may be formed of a silicon oxide-based insulating material. The field insulating layer 9 may include a deep portion 5a and a shallow portion 7a.

The plurality of active regions 14a, 14b, 16, and 18 may include the first lower active region 14a and the second lower active region 14b, which are spaced apart from each other, the plurality of active regions 16 disposed in the first lower active region 14a, and the plurality of active regions 18 disposed in the second lower active region 14b. The plurality of active regions 16 and 18 may have line shapes that extend in a first direction X. The shallow portion 7a of the field insulating layer 9 may define the plurality of active regions 16 and 18.

Figure 11:
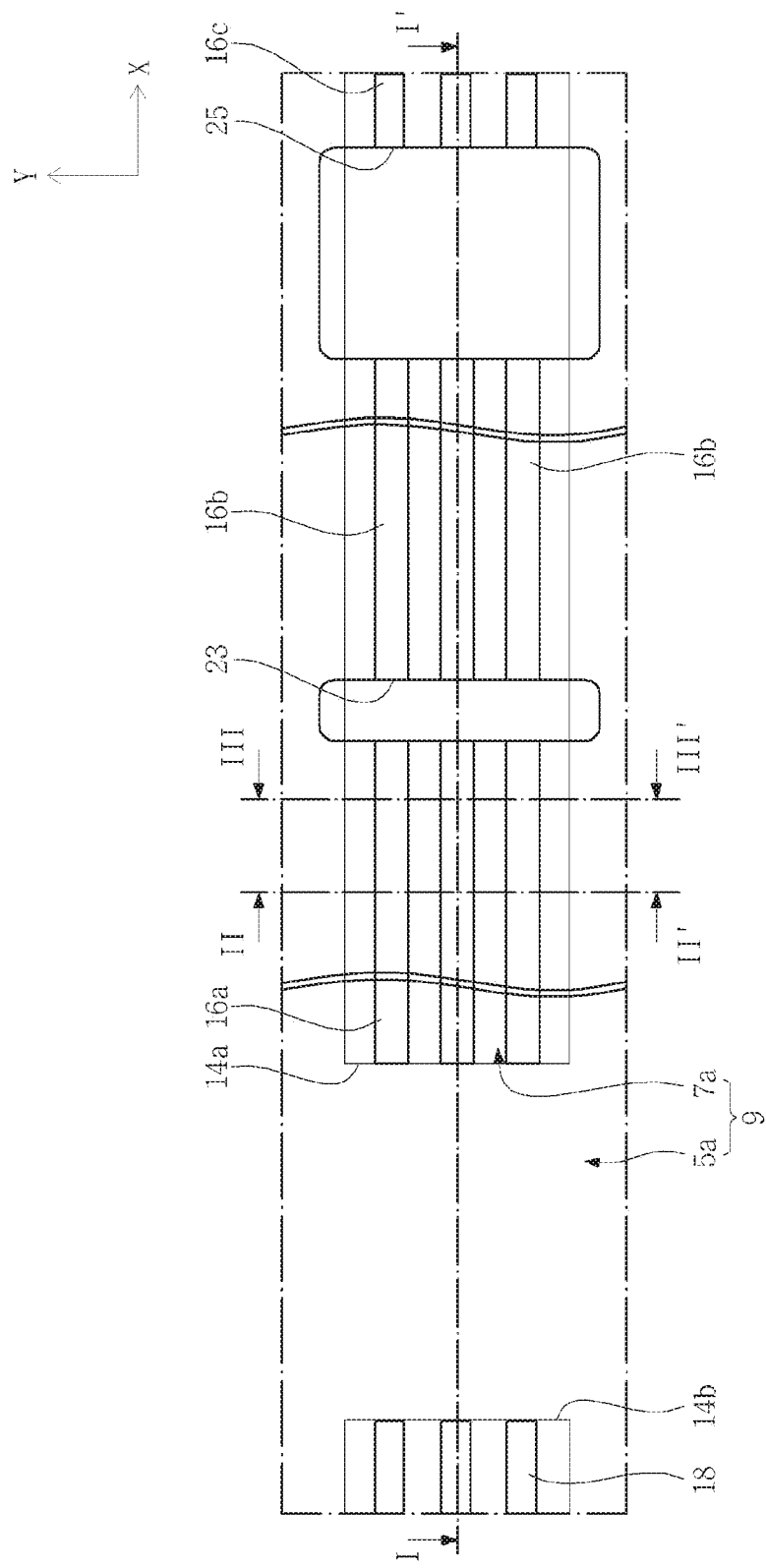
Figure 12A:
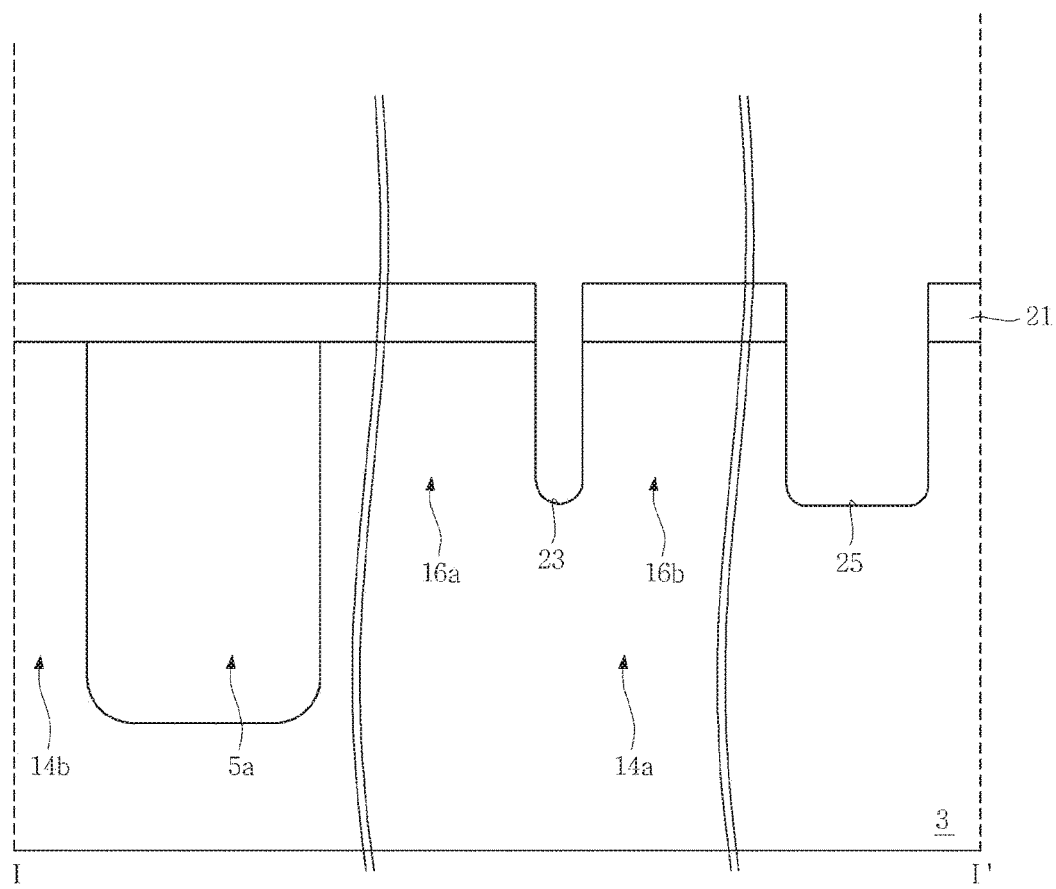
Figure 12B:
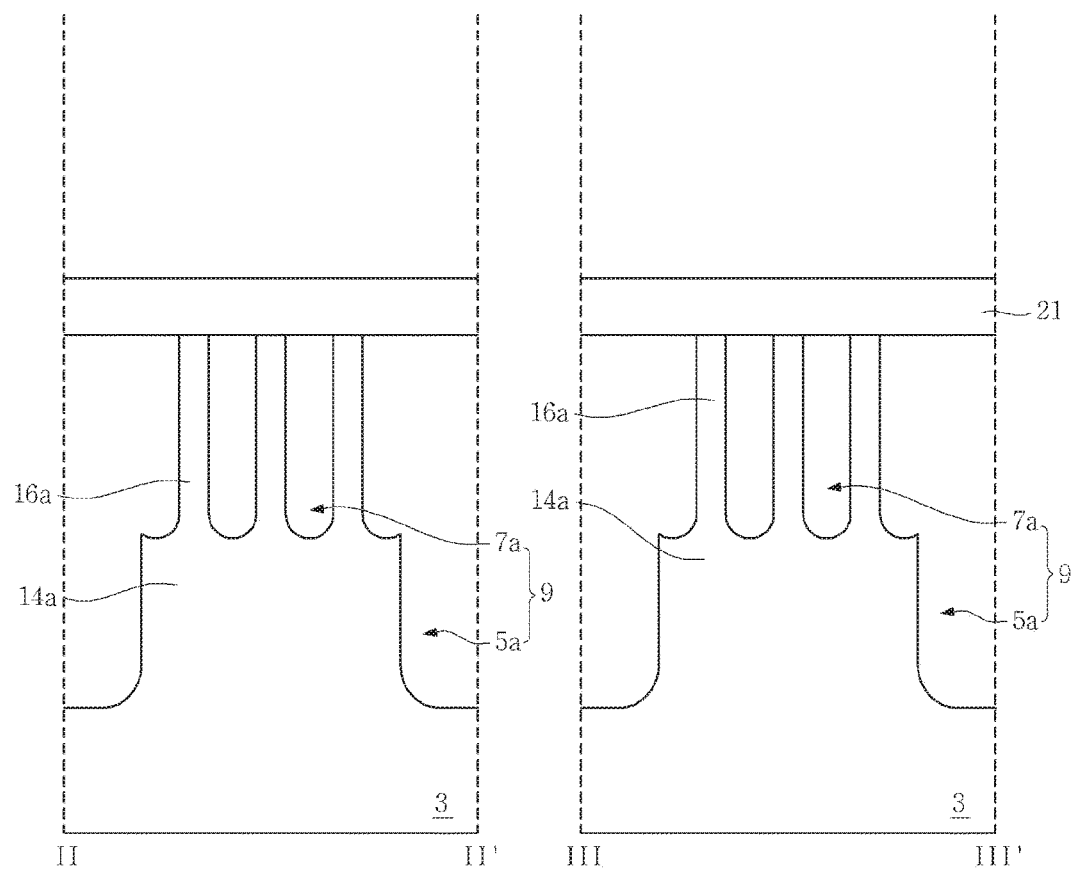

Referring to FIGS. 11, 12A, and 12B, the method of forming the semiconductor device according to an embodiment of the inventive concept may include etching the plurality of active regions 16 disposed in the first lower active region 14a and forming first active regions 16a, second active regions 16b, and third active regions 16c.

The forming of the first to third active regions 16a, 16b, and 16c may include forming a hard mask pattern 21 having openings on the semiconductor substrate 3 having the field insulating layer 9 and the plurality of active regions 16 and 18, and etching the plurality of active regions 16 disposed in the first lower active region 14a using the hard mask pattern 21 as an etch mask. The hard mask pattern 21 may be formed of a material having an etch selectivity with respect to the plurality of active regions 16 and the field insulating layer 9, for example, a material such as silicon nitride, etc.

The plurality of active lines 18 disposed in the second lower active region 14b may be referred to as fourth active regions.

A first field trench area 23 may be formed between the first active regions 16a and the second active regions 16b and a second field trench area 25 may be formed between the second active regions 16b and the third active regions 16c. The first field trench area 23 may have a smaller width than the second field trench area 25.

In an embodiment, the field insulating layer 9 may also be etched while the plurality of active regions 16 disposed in the first lower active region 14a are etched.

Depths of the first and second field trench areas 23 and 25 may be shallower than a depth of a bottom of the shallow portion 7a of the field insulating layer 9. For example, height differences between bottoms of the first and second field trench areas 23 and 25 and upper surfaces of the first to third active regions 16a, 16b, and 16c may be less than height differences between the bottom of the shallow portion 7a of the field insulating layer 9 and the upper surfaces of the first to third active regions 16a, 16b, and 16c.

Figure 13:
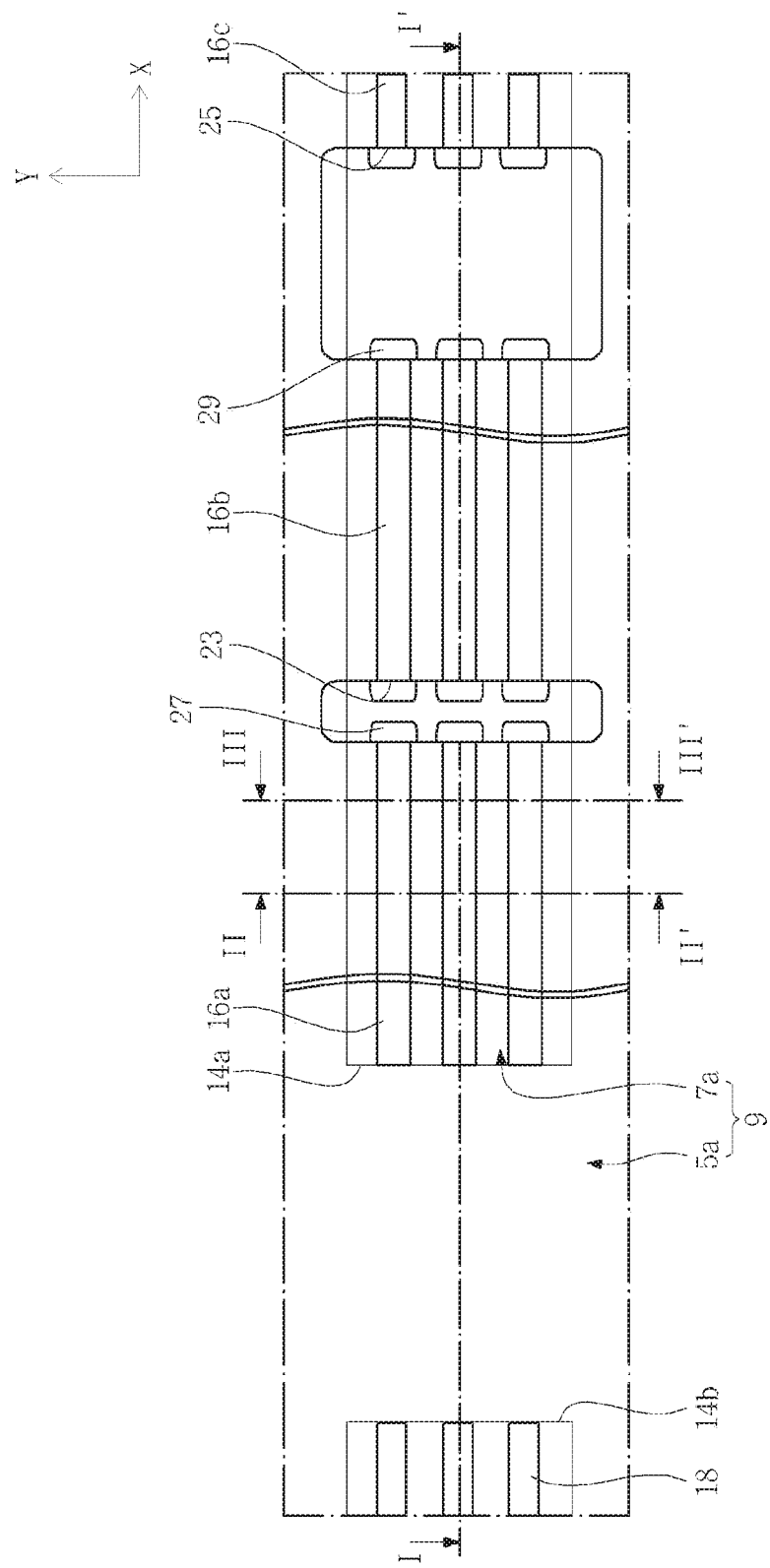
Figure 14A:
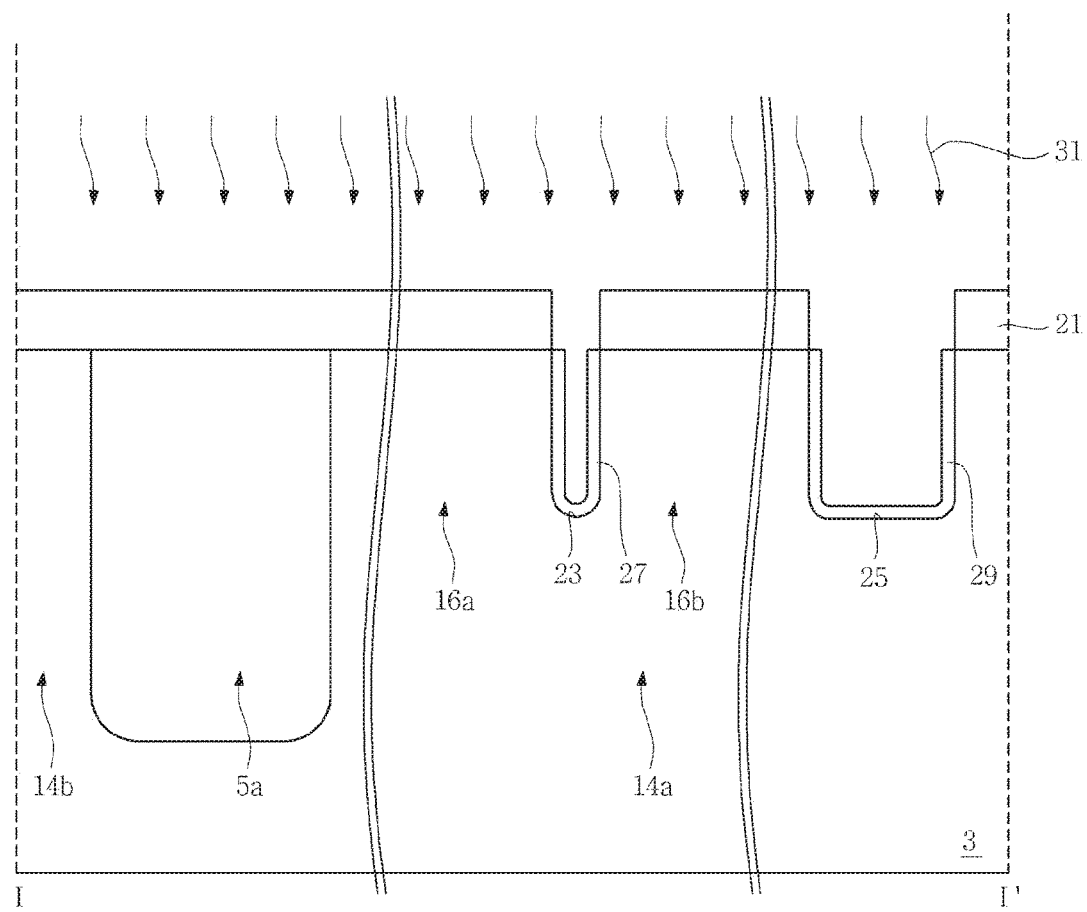
Figure 14B:
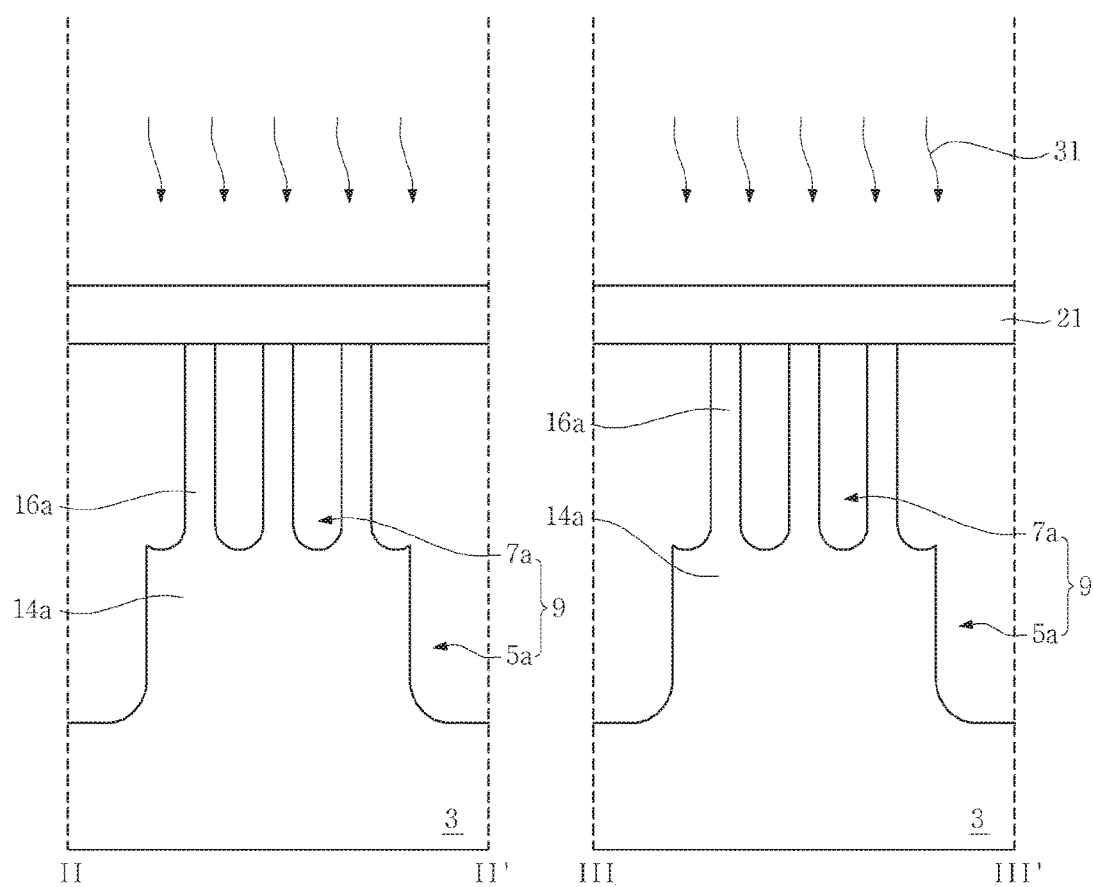

Referring to FIGS. 13, 14A, and 14B, the method of forming the semiconductor device according to an embodiment of the inventive concept may include forming a first semiconductor extension layer 27 and a second semiconductor extension layer 29.

The forming of the first and second semiconductor extension layers 27 and 29 may include growing a semiconductor material from the first to third active regions 16a, 16b, and 16c exposed by the first and second field trench areas 23 and 25 and the plurality of active regions 16 disposed under the first to third active regions 16a, 16b, and 16c, by performing an SEG process.

The first semiconductor extension layer 27 may be formed as an epitaxial layer grown along side surfaces and a bottom of the first field trench area 23, and the second semiconductor extension layer 29 may be formed as an epitaxial layer grown along side surfaces and a bottom of the second field trench area 25.

The first and second semiconductor extension layers 27 and 29 may be formed as epitaxial layers having undoped silicon material.

In an embodiment, after the SEG process is performed, a hydrogen thermal treatment process 31 may be performed. The hydrogen thermal treatment process 31 may repair defects included in the first and second semiconductor extension layers 27 and 29 and surface defects of the first and second semiconductor extension layers 27 and 29.

Figure 15A:
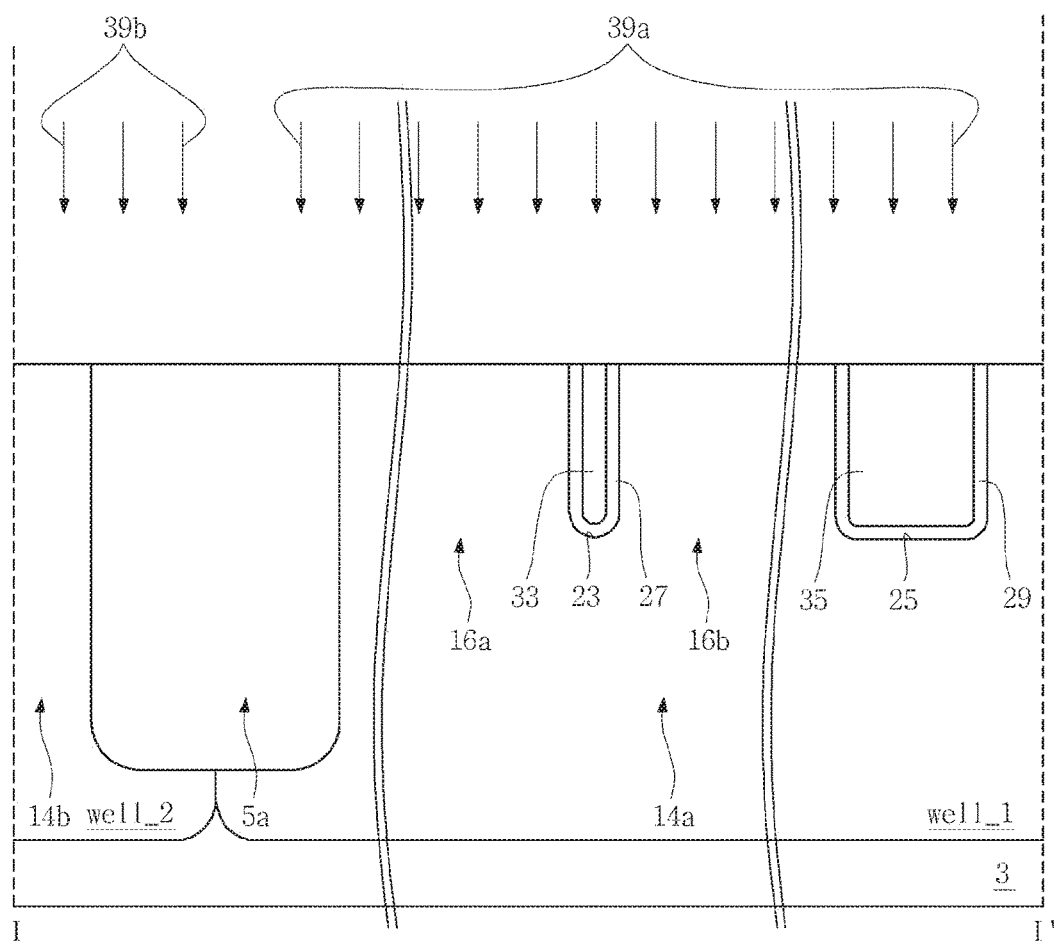
Figure 15B:
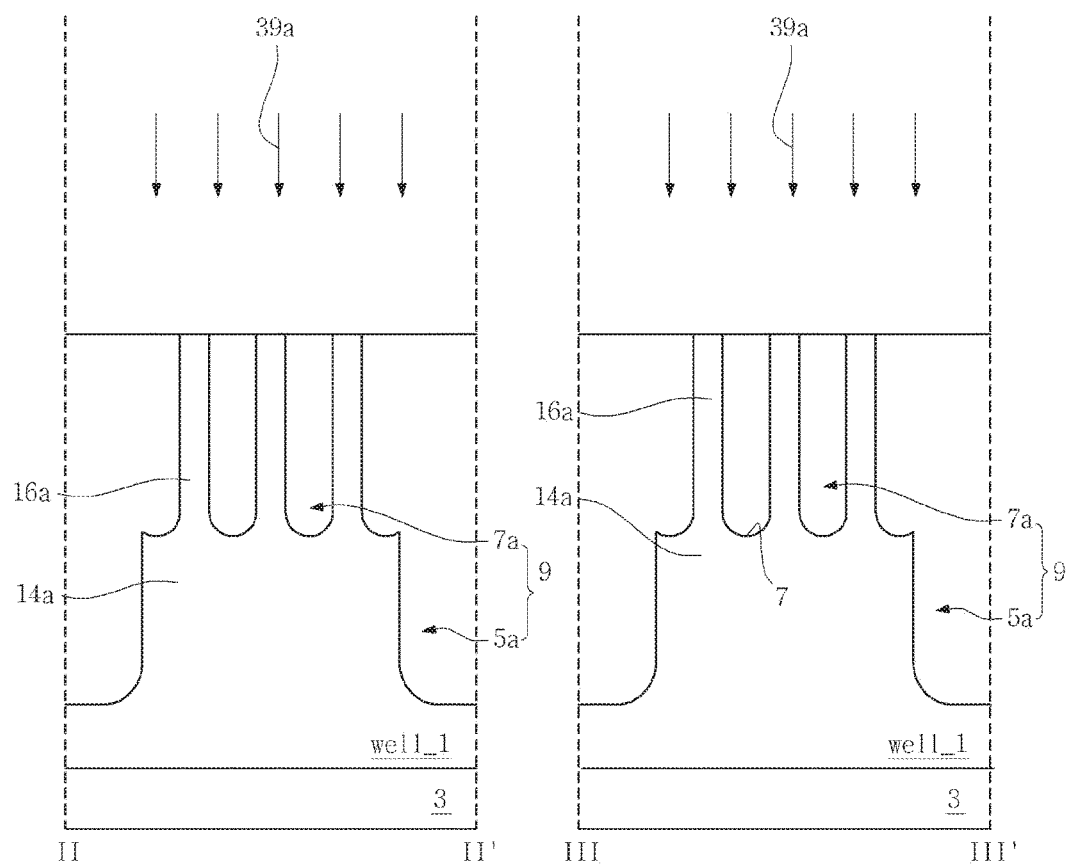

Referring to FIGS. 13, 15A, and 15B, the method of forming the semiconductor device according to an embodiment of the inventive concept may include forming a first isolation pattern 33, which fills the first field trench area 23 and a second isolation pattern 35, which fills the second field trench area 25, and forming a first well region well_1 and a second well region well_2 having a different conductivity types from the first well region well_1.

The forming of the first and second isolation patterns 33 and 35 may include forming an insulating material layer on the semiconductor substrate 3 having the first and second semiconductor extension layers 27 and 29, planarizing the insulating material layer until the hard mask pattern 21 is exposed, and removing the hard mask pattern 21 by performing an etching process. A portion of the planarized insulating material layer may also be etched while the hard mask pattern 21 is removed using the etching process.

The first well region well_1 may be formed in the first to third active regions 16a, 16b, and 16c and the first lower active region 14a. The forming of the first well region well_1 may include implanting impurities in the first to third active regions 16a, 16b, and 16c and the first lower active region 14a by performing a first well ion implantation process 39a.

The second well region well_2 may be formed in the fourth active region 18 and the second lower active region 14b. The forming of the second well region well_2 may include implanting impurities in the fourth active region 18 and the second lower active region 14b by performing a second well ion implantation process 39b.

The second well ion implantation process 39b may be performed before or after the first well ion implantation process 39a is performed.

Figure 16:
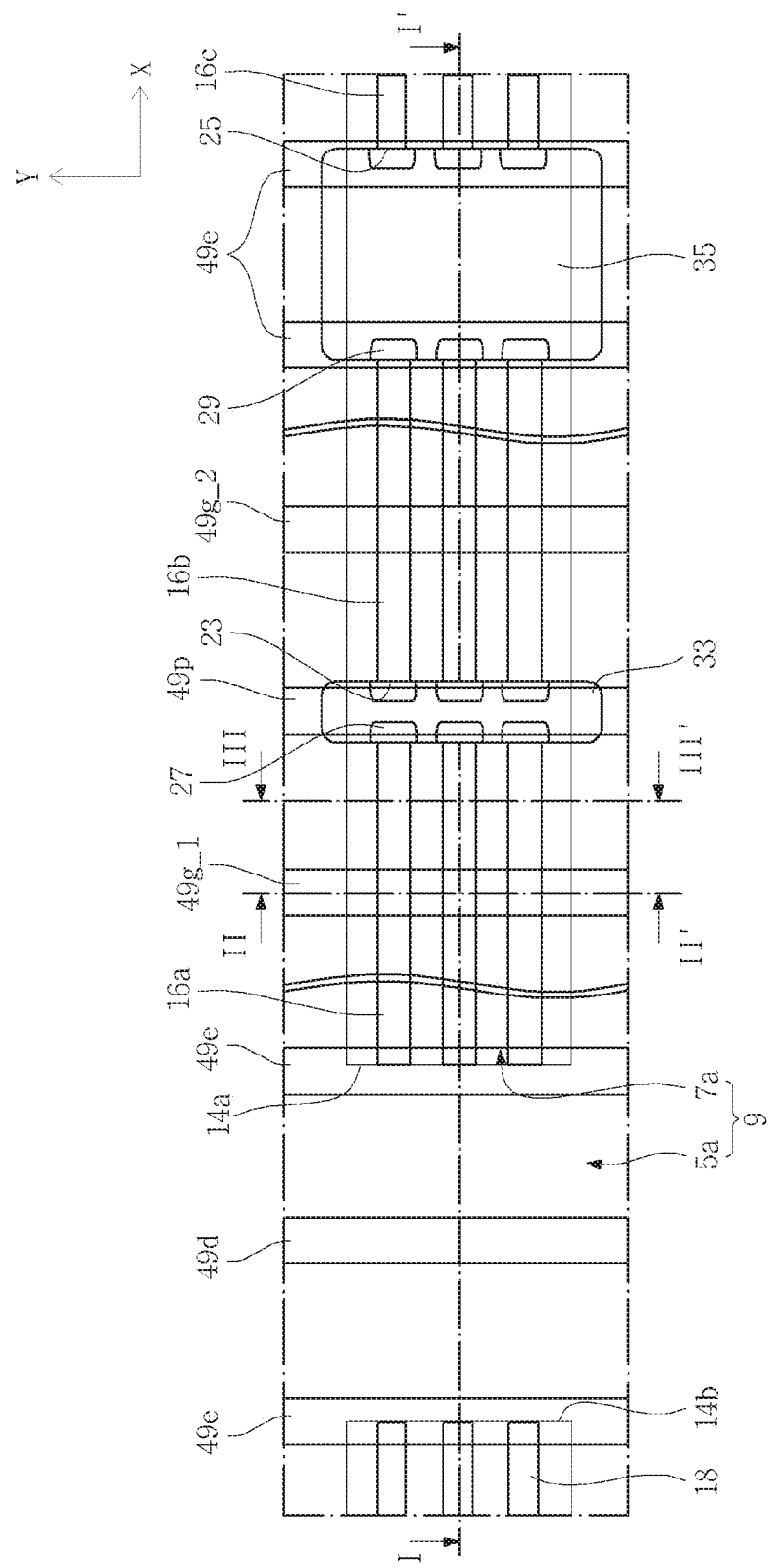
Figure 17A:
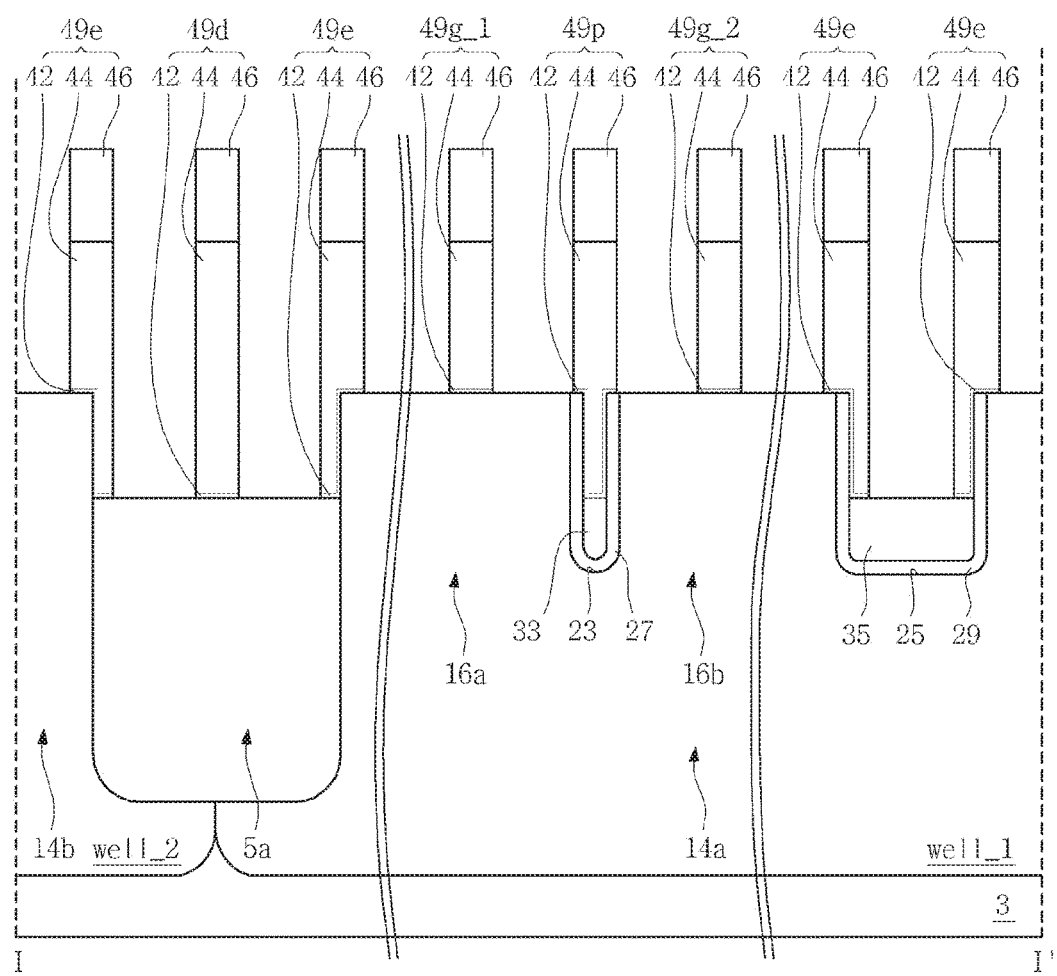
Figure 17B:
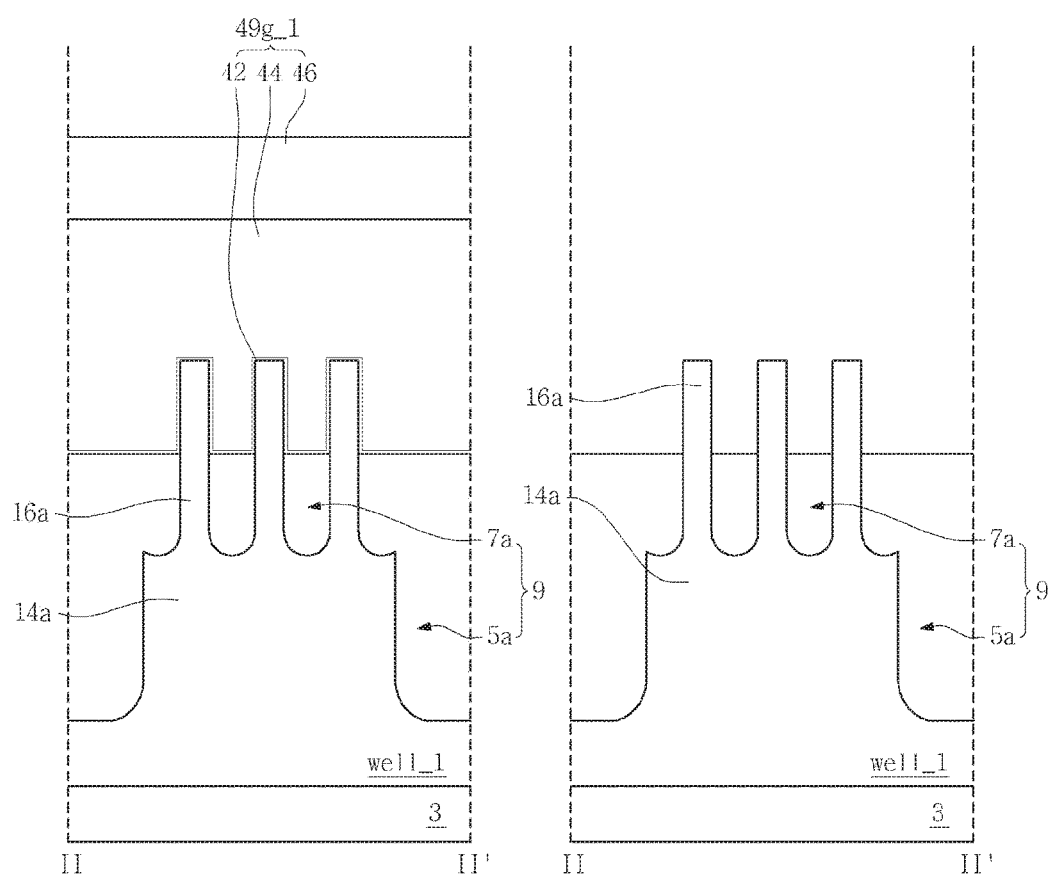

Referring to FIGS. 16, 17A, and 17B, the method of forming the semiconductor device according to an embodiment of the inventive concept may include partially etching the field insulating layer 9, the first isolation pattern 33 and then the second isolation pattern 35 and forming sacrificial gate patterns 49e, 49d, 49g_1, 49p, and 49g_2 after the first and second well regions well_1 and well_2 are formed.

The field insulating layer 9, the first isolation pattern 33 and the second isolation pattern 35 may be partially etched to have levels of upper surfaces formed lower than levels of the upper surfaces of the first to third active regions 16a, 16b, and 16c.

Each of the sacrificial gate patterns 49e, 49d, 49g_1, 49p, and 49g_2 may include a base insulating pattern 42, a lower sacrificial pattern 44, and an upper sacrificial pattern 46, which are sequentially stacked.

The forming of the sacrificial gate patterns 49e, 49d, 49g_1, 49p, and 49g_2 may include forming the base insulating layer after the field insulating layer 9, the first isolation pattern 33, and the second isolation pattern 35 are partially etched, sequentially forming the lower sacrificial layer and the upper sacrificial layer on the semiconductor substrate 3 having the base insulating layer, and patterning the base insulating layer, the lower sacrificial layer, and the upper sacrificial layer. The base insulating pattern 42 may be formed of silicon oxide, the lower sacrificial pattern 44 may be formed of polysilicon, and the upper sacrificial pattern 46 may be formed of silicon nitride.

The sacrificial gate patterns 49e, 49d, 49g_1, 49p, and 49g_2 may include the first sacrificial gate pattern 49g_1, which crosses the first active regions 16a, the first dummy sacrificial gate pattern 49p disposed on the first isolation pattern 33, the second sacrificial gate pattern 49g_2, which crosses the second active regions 16b, the second dummy sacrificial gate pattern 49d disposed on the deep portion 5a of the field insulating layer 9, and the edge sacrificial gate patterns 49e, which overlap end portions of the first to fourth active regions 16a, 16b, 16c, and 18.

Figure 18:
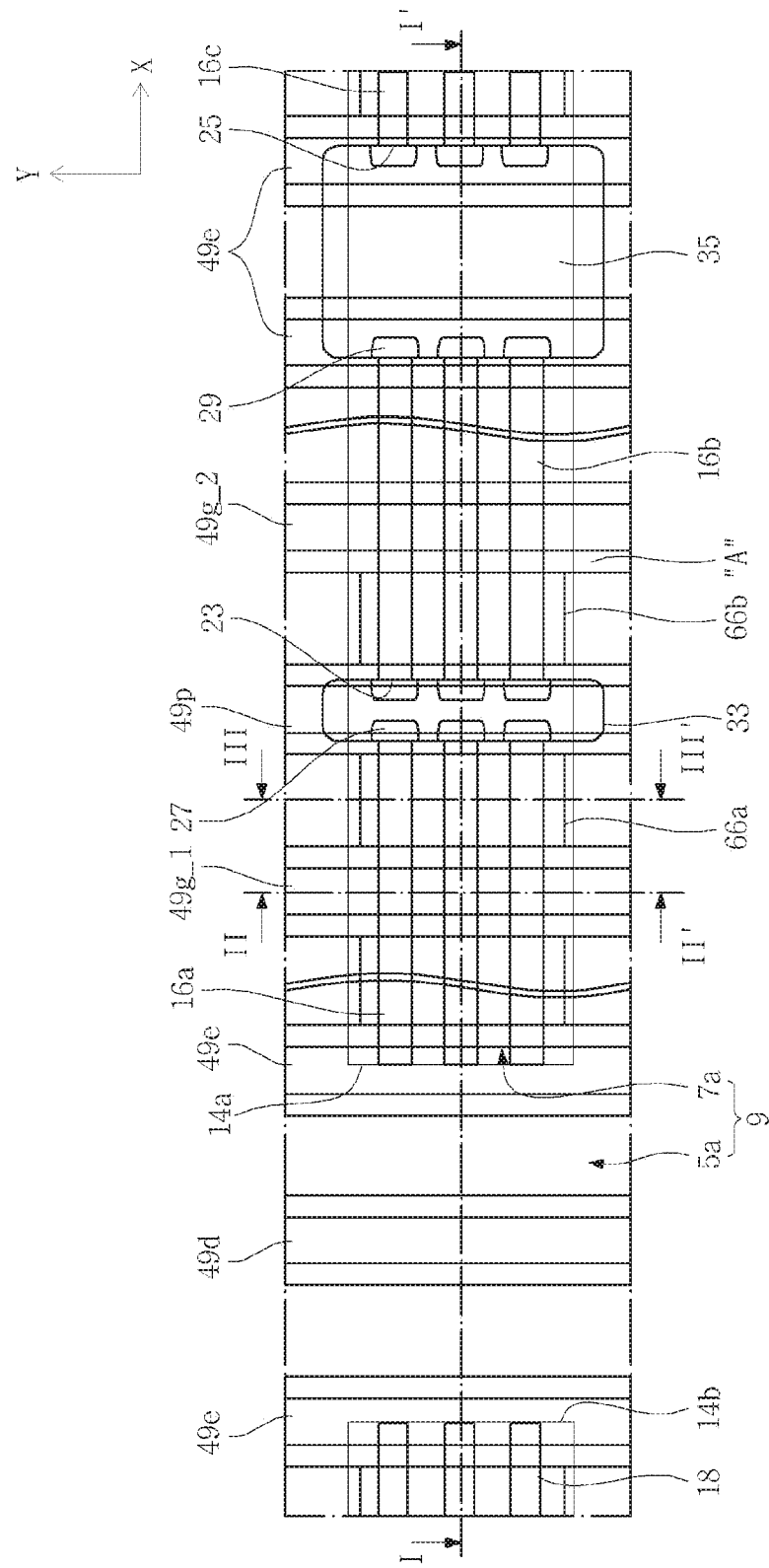
Figure 19A:
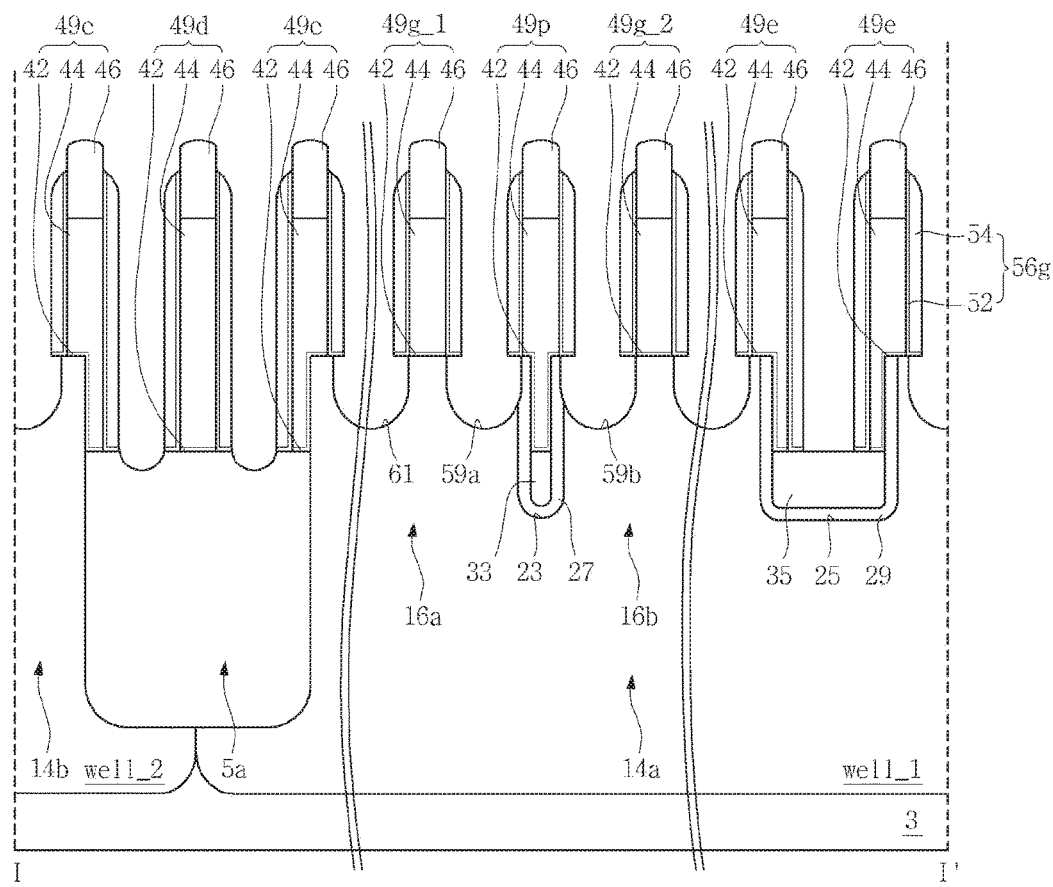
Figure 19B:
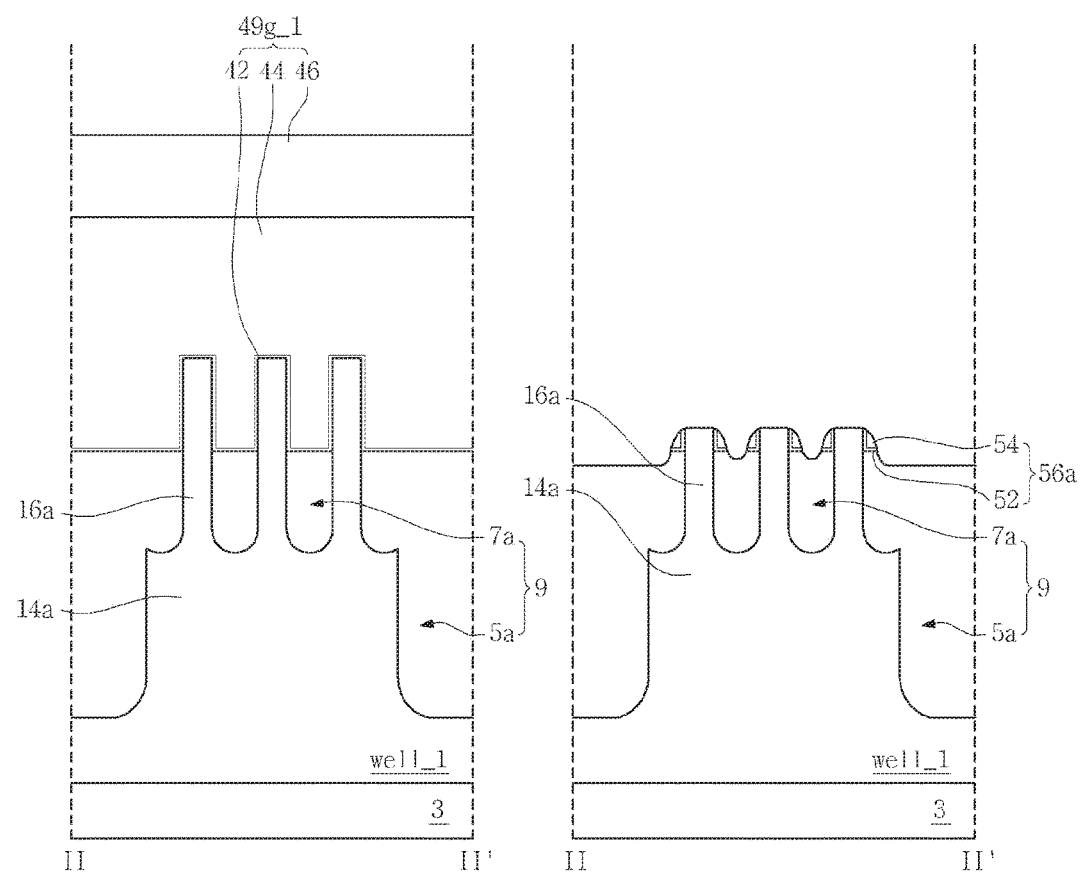

Referring to FIGS. 18, 19A, and 19B, the method of forming the semiconductor device according to an embodiment of the inventive concept may include forming gate spacers 56g, active spacers 56a, and a plurality of recessed areas.

The gate spacers 56g may be formed on side surfaces of the sacrificial gate patterns 49e, 49d, 49g_1, 49p, and 49g_2. The active spacers 56a may be formed on side surfaces of the first to fourth active regions 16a, 16b, 16c, and 18 disposed on the side surfaces of the sacrificial gate patterns 49e, 49d, 49g_1, 49p, and 49g_2.

Each of the gate spacers 56g and the active spacers 56a may include an inner spacer 52 and an outer spacer 54. The forming of the gate spacers 56g and the active spacers 56a may include sequentially forming the inner spacer 52 and the outer spacer 54 on the semiconductor substrate 3 having the sacrificial gate patterns 49e, 49d, 49g_1, 49p, and 49g_2 and anisotropically etching the inner and outer spacers 52 and 54.

The forming of the plurality of recessed areas may include etching the first to fourth active regions 16a, 16b, 16c, and 18 using the sacrificial gate patterns 49e, 49d, 49g_1, 49p, and 49g_2 and the gate spacers 56g as etch masks.

The plurality of recessed areas may include the first recessed area 59a formed in the first active region 16a and the second recessed area 59b formed in the second active region 16b.

In an embodiment, the first and second recessed areas 59a and 59b may expose bottoms of the gate spacers 56g by extending under the gate spacers 56g.

In an embodiment, at least one of the first and second recessed areas 59a and 59b adjacent to the first field trench area 23 may expose the first semiconductor extension layer 27.

Figure 20A:
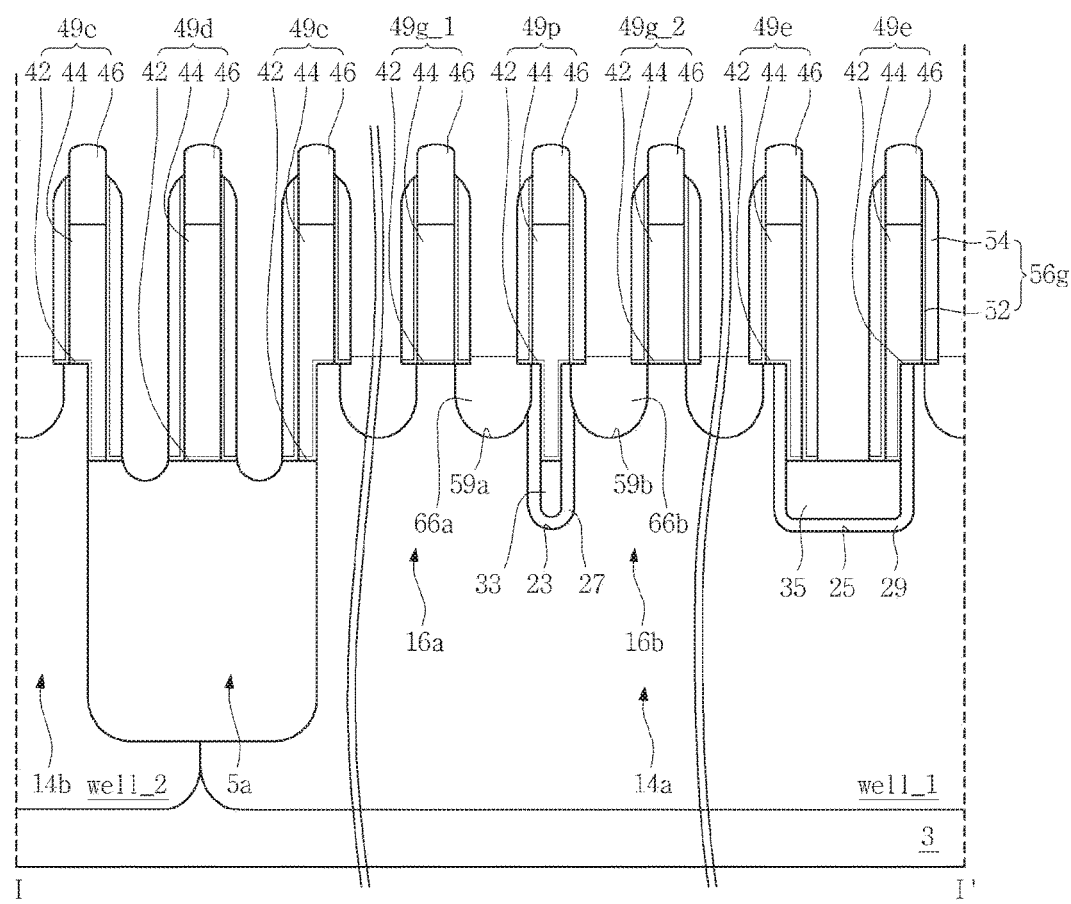
Figure 20B:
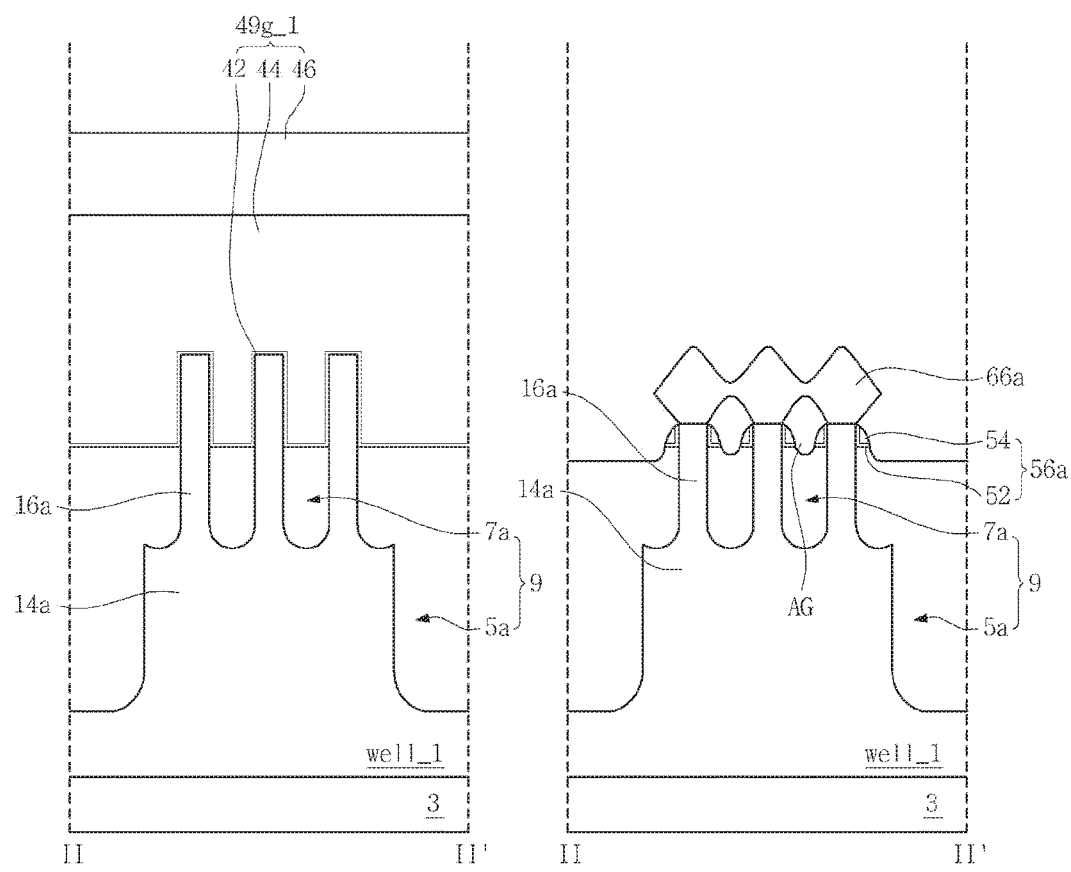

Referring to FIGS. 18, 20A, and 20B, the method of forming the semiconductor device according to an embodiment of the inventive concept may include forming first and second source/drain semiconductor layers 66a and 66b.

The forming of the first and second source/drain semiconductor layers 66a and 66b may include forming epitaxial layers in the plurality of recessed areas 59a and 59b by performing an SEG process.

The first source/drain semiconductor layers 66a is formed in the first recessed areas 59a and the second source/drain semiconductor layers 66b is formed in the second recessed areas 59b. The first and second source/drain semiconductor layers 66a and 66b formed in the first well region well_1 may be formed to have different conductivity types from the first well region well_1.

In an embodiment, the first source/drain semiconductor layer 66a may be connected to the first active regions 16a and the second source/drain semiconductor layer 66b may be connected to the second active regions 16b. An air gap AG may be formed between the first source/drain semiconductor layer 66a and the shallow portion 7a of the field insulating layer 9. The air gap AG may be formed between the second source/drain semiconductor layer 66b and the shallow portion 7a of the field insulating layer 9.

Figure 21:
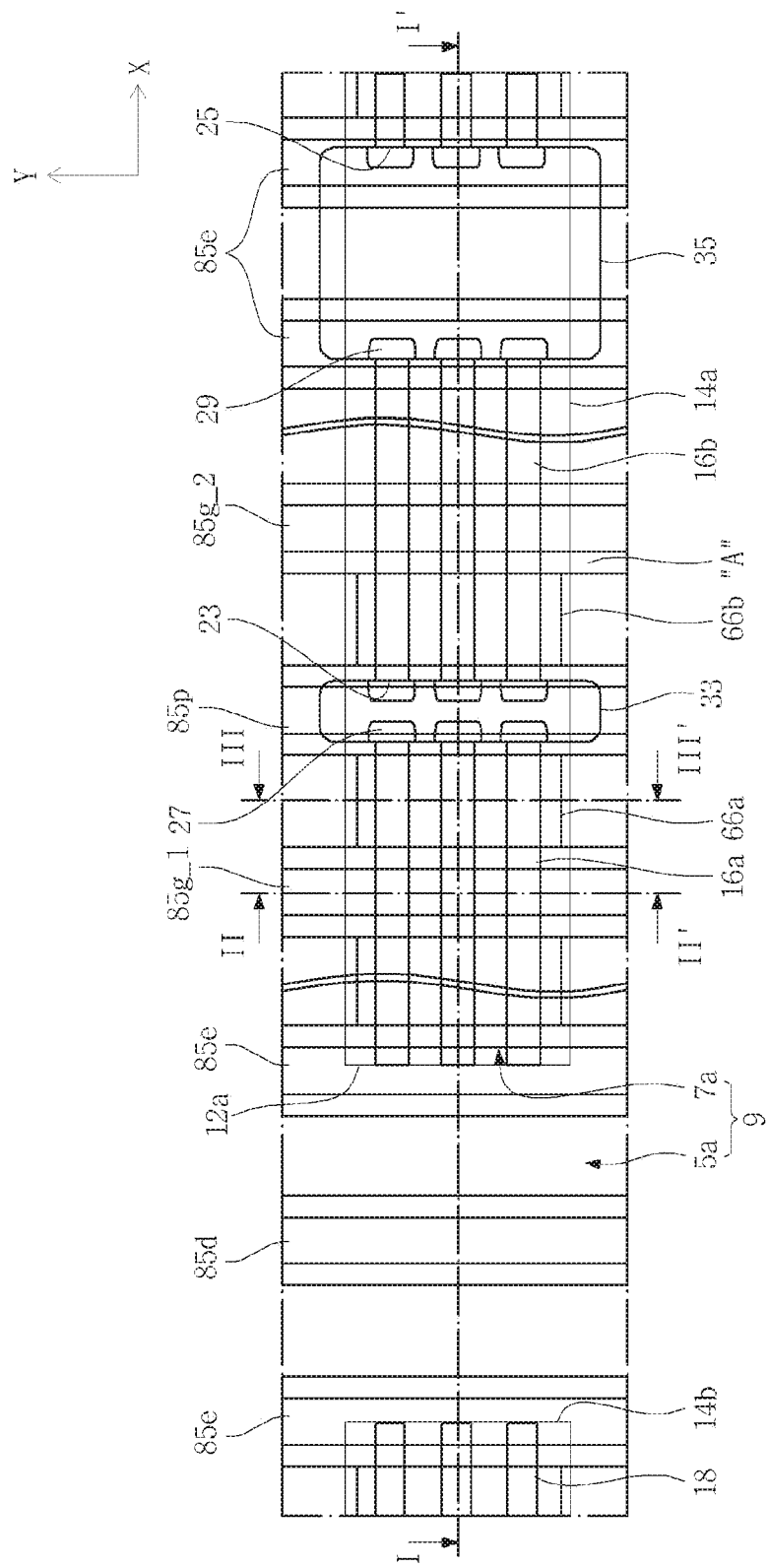
Figure 22A:
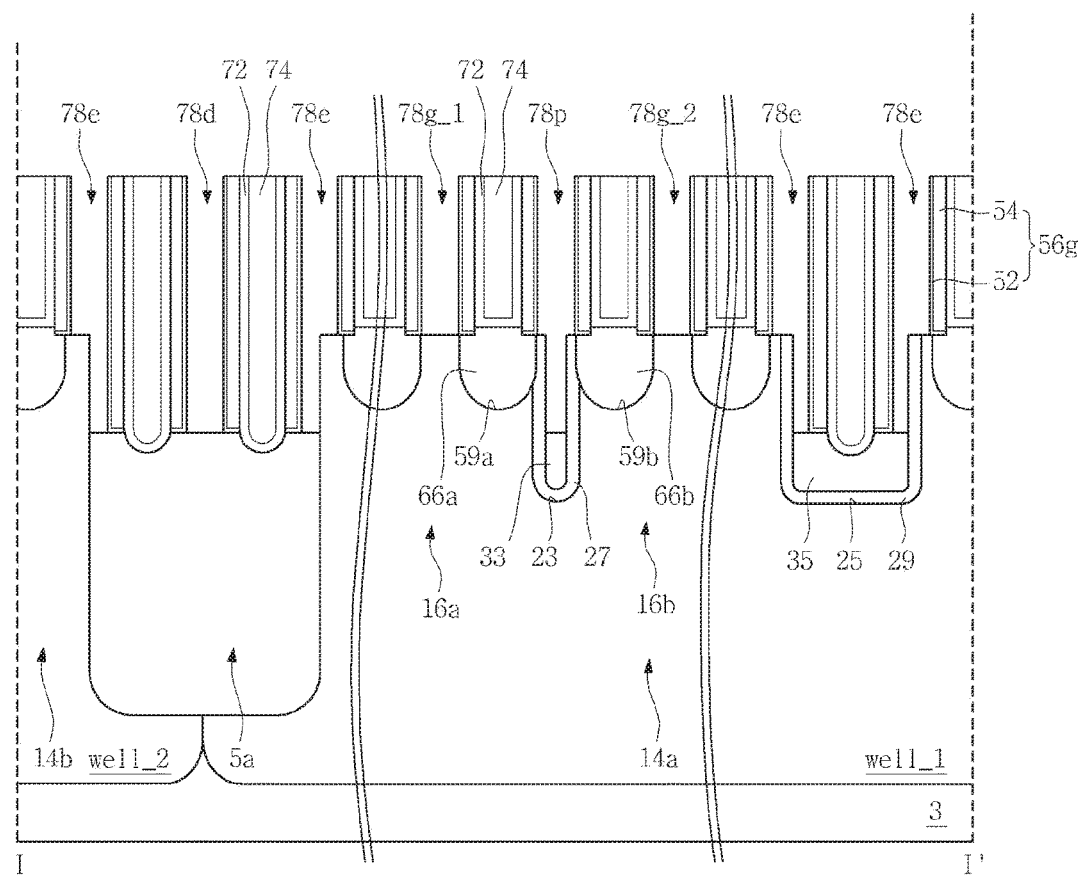
Figure 22B:
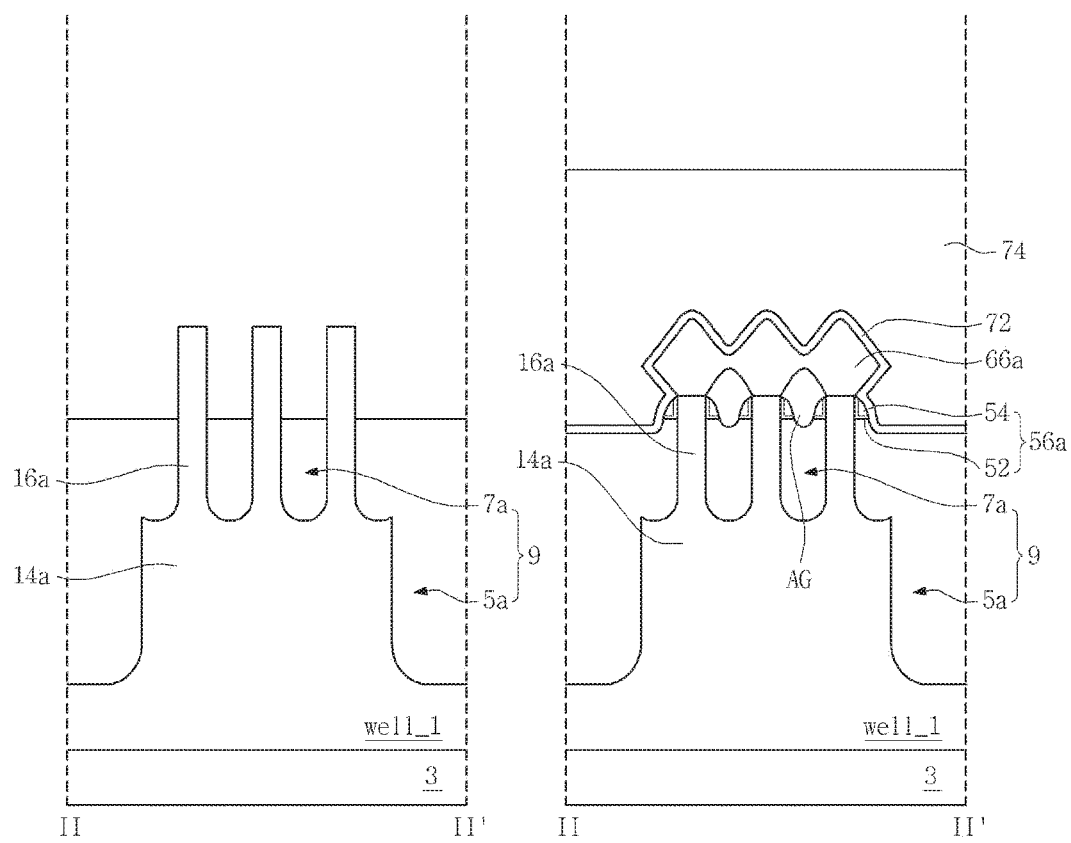

Referring to FIGS. 21, 22A, and 22B, the method of forming the semiconductor device according to an embodiment of the inventive concept may include forming an insulating stopper layer 72 and a lower interlayer insulating layer 74 and forming gate trenches 78e, 78d, 78g_1, 78g_2, and 78p.

The forming of the insulating stopper layer 72 and the lower interlayer insulating layer 74 may include conformally forming the insulating stopper layer 72 on the semiconductor substrate 3 having the first and second source/drain semiconductor layers 66a and 66b, forming the lower interlayer insulating layer 74 on the insulating stopper layer 72, and planarizing the insulating stopper layer 72 and the lower interlayer insulating layer 74 until the sacrificial gate patterns 49e, 49d, 49g_1, 49p, and 49g_2 are exposed. The insulating stopper layer 72 may be formed of a silicon nitride-based insulating material. The lower interlayer insulating layer 74 may be formed of a silicon oxide-based insulating material.

The gate trenches 78e, 78d, 78g_1, 78g_2, and 78p may be formed by removing the sacrificial gate patterns 49e, 49d, 49g_1, 49p, and 49g_2 using an etching process.

Figure 23A:
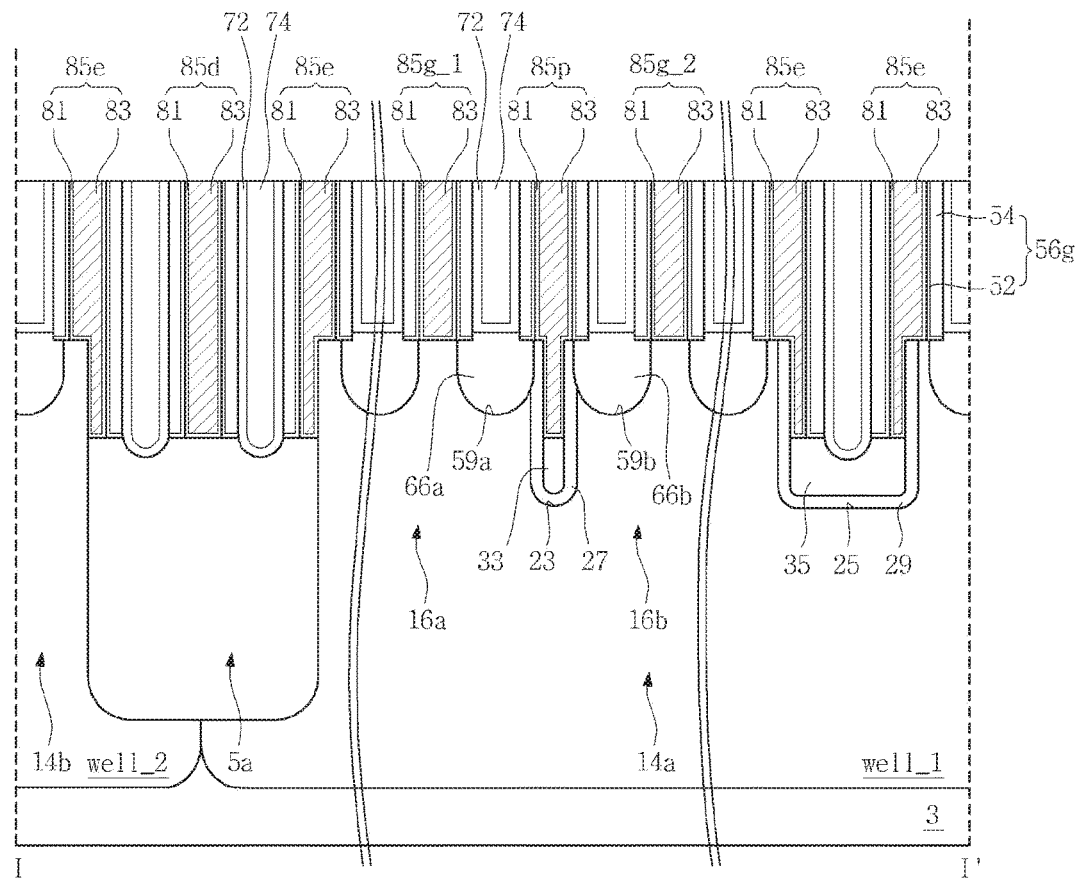
Figure 23B:
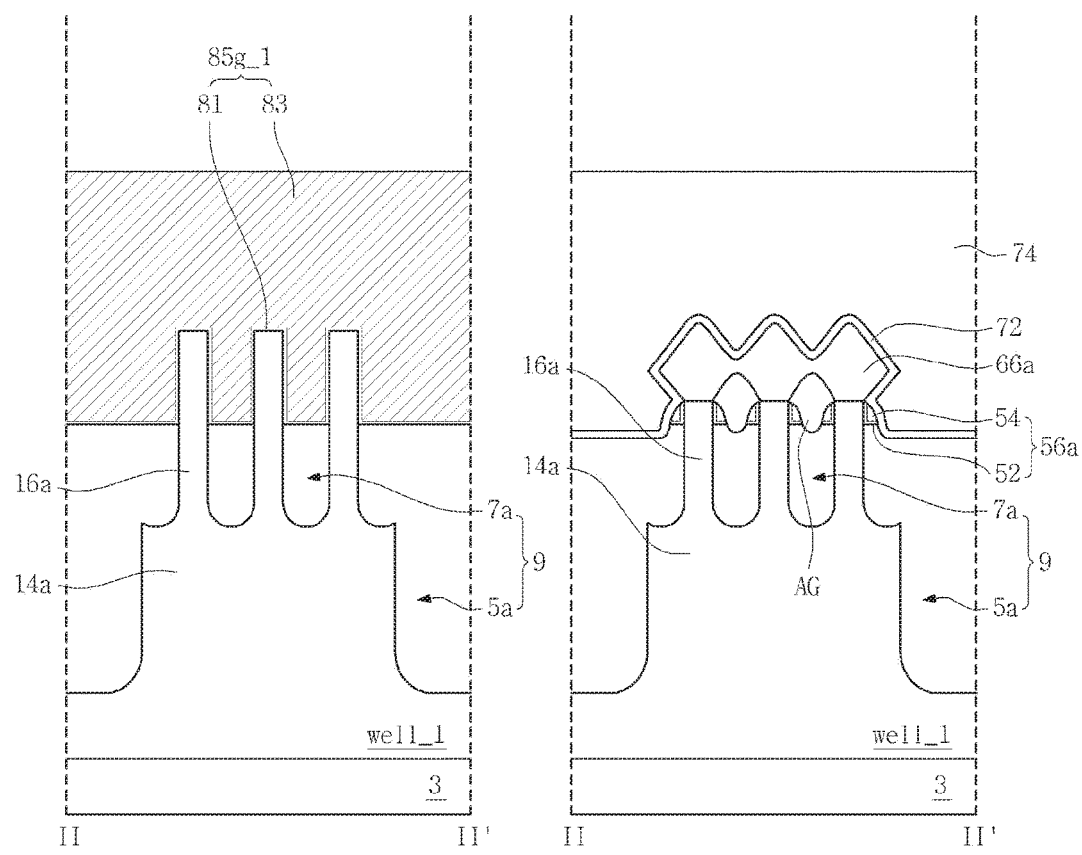
Figure 24A:
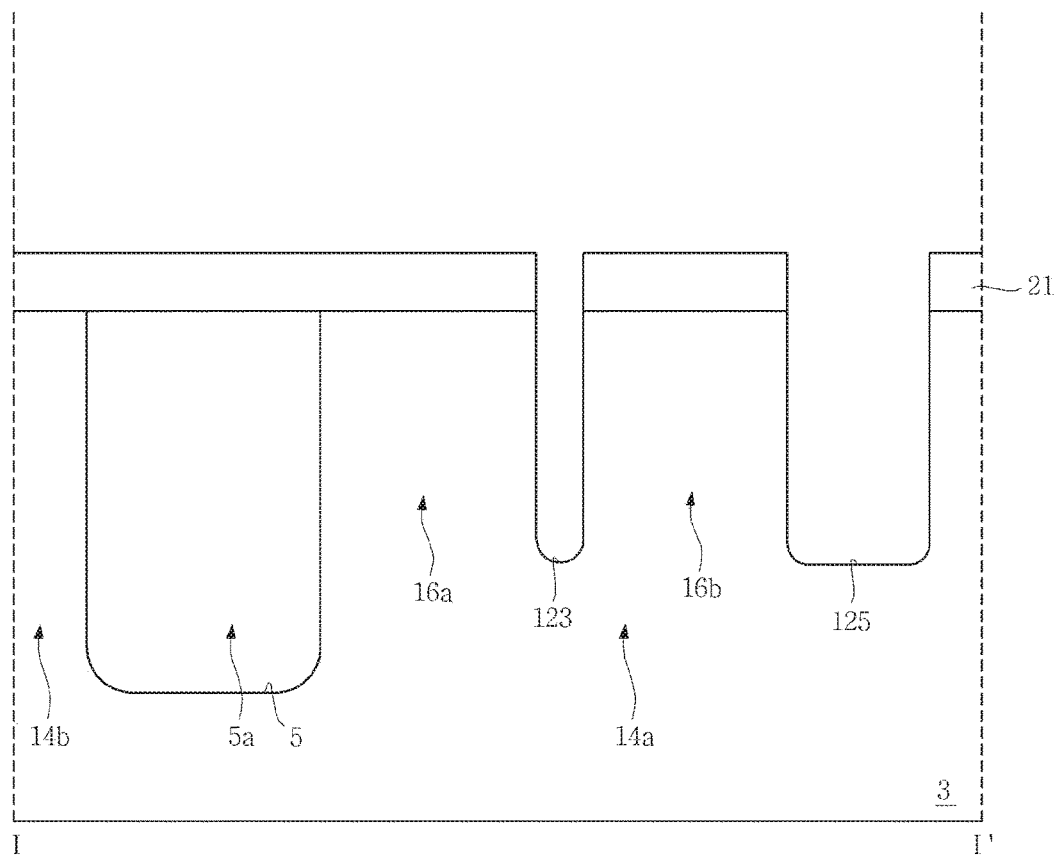
FIGS. 24A to 27B are cross-sectional views illustrating an example of a method of forming a semiconductor device according to an embodiment of the inventive concept.
Figure 24B:
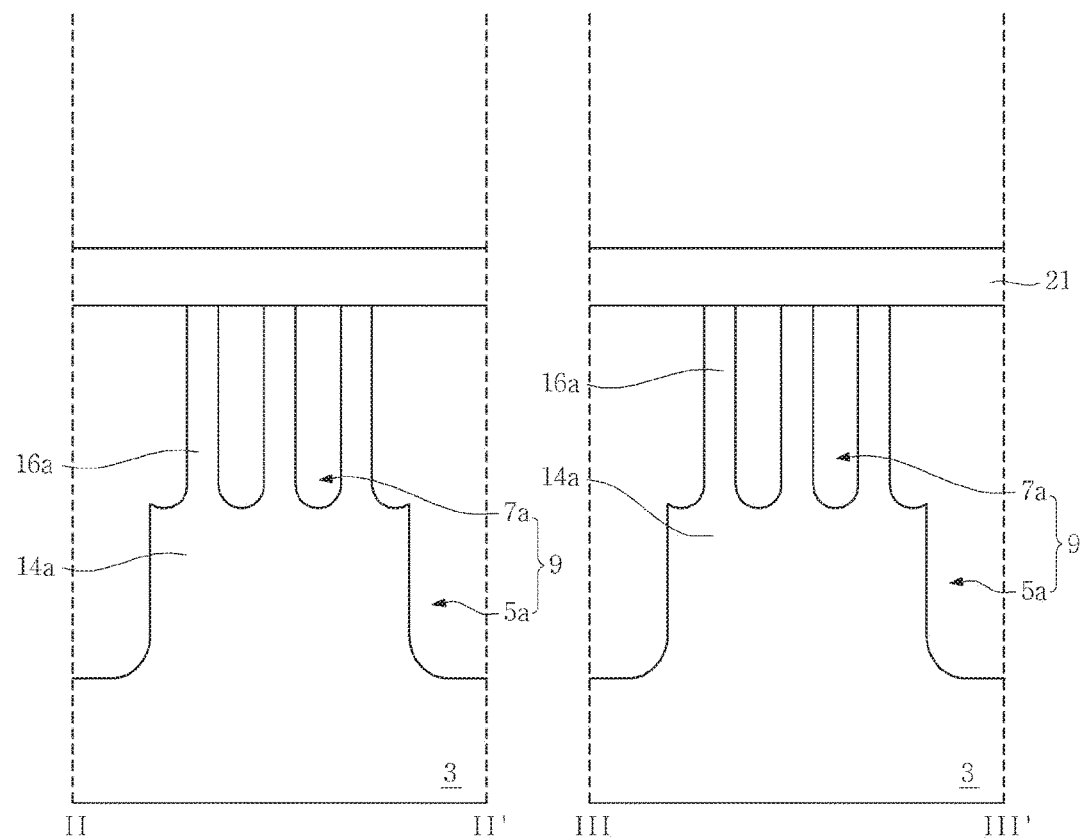
Figure 25A:
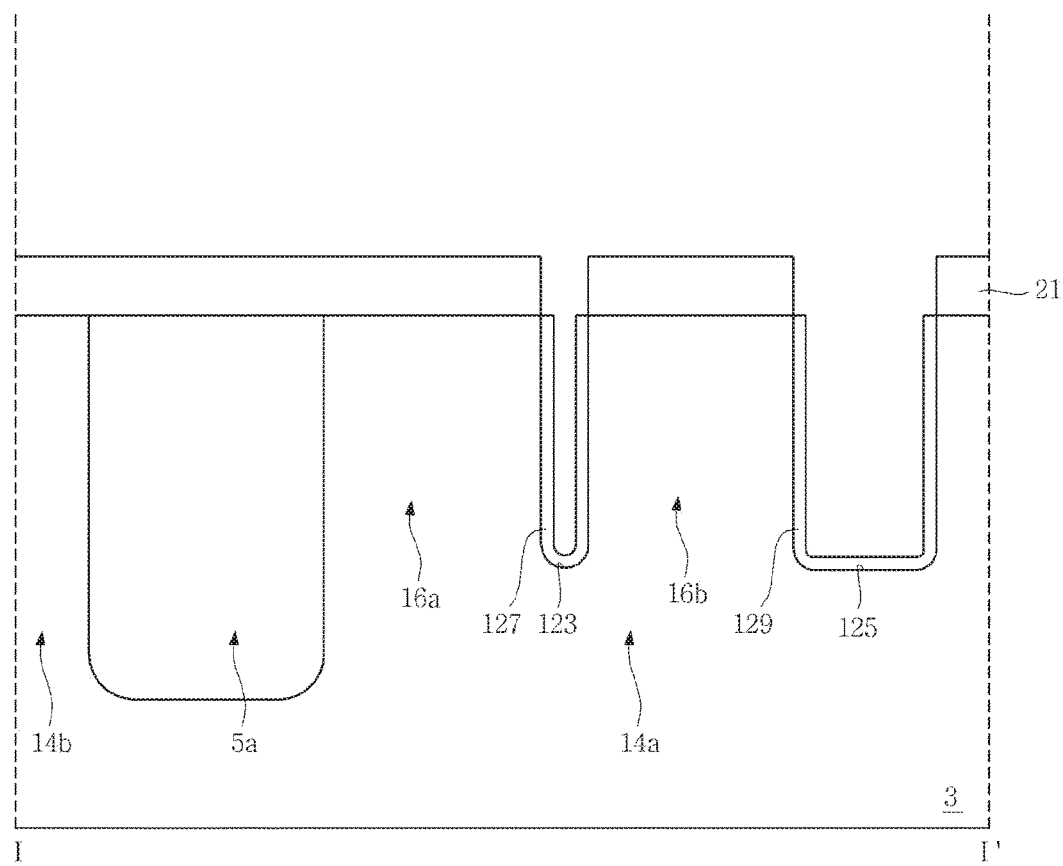
Figure 25B:
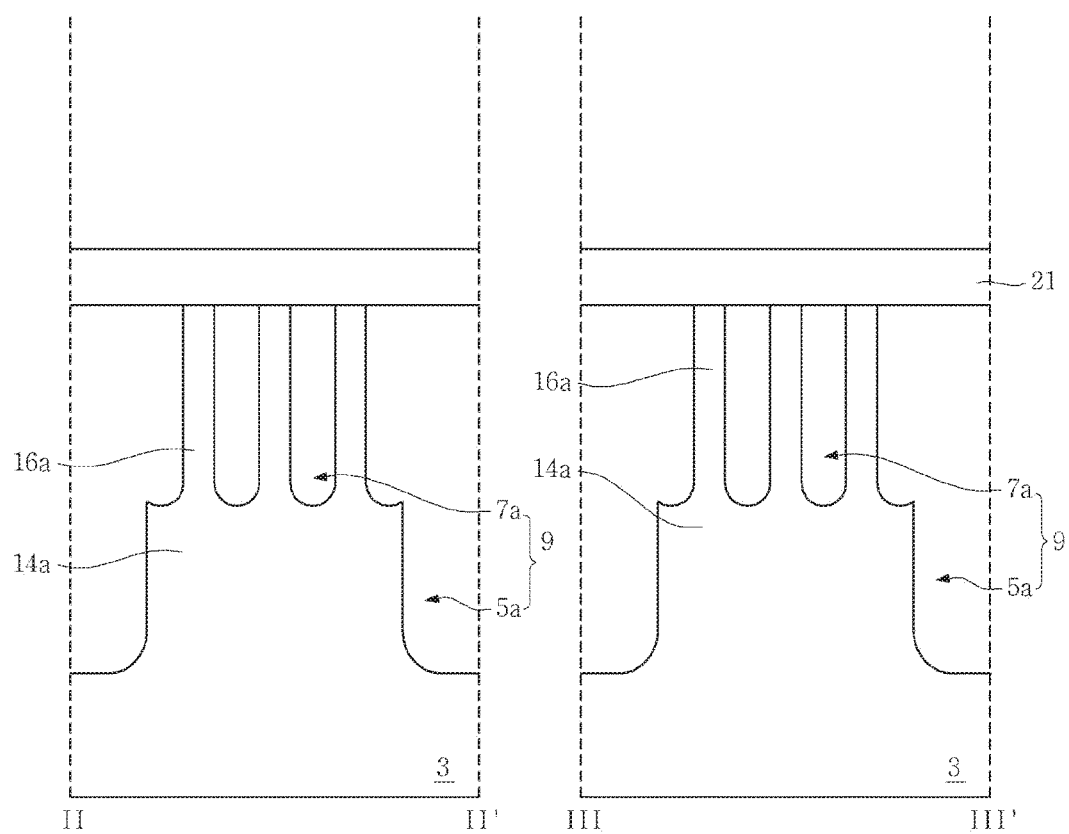
Figure 26A:
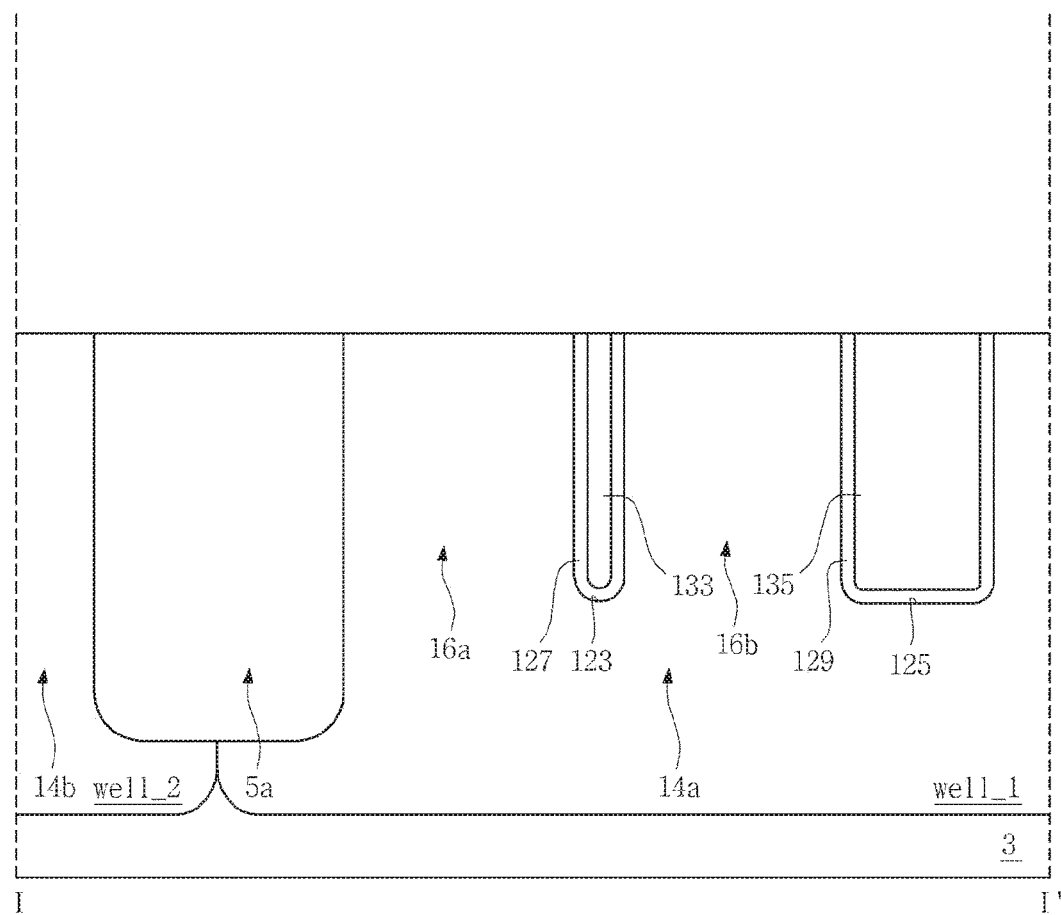
Figure 26B:
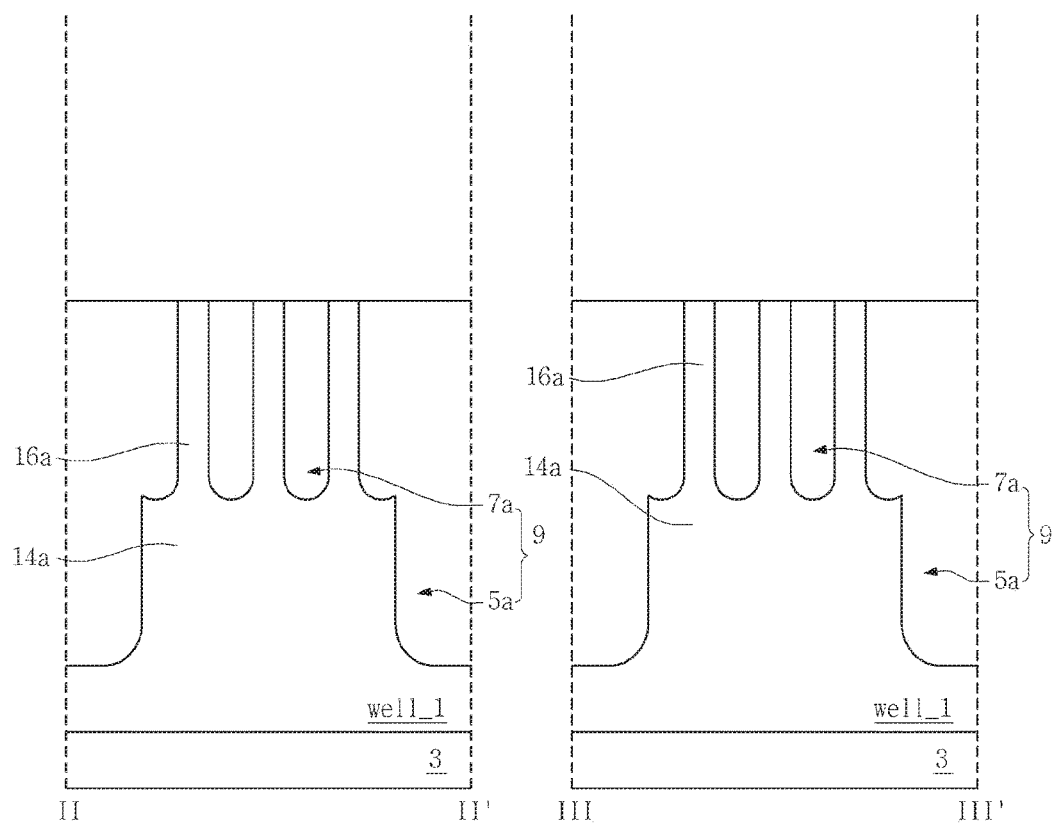
Figure 27A:
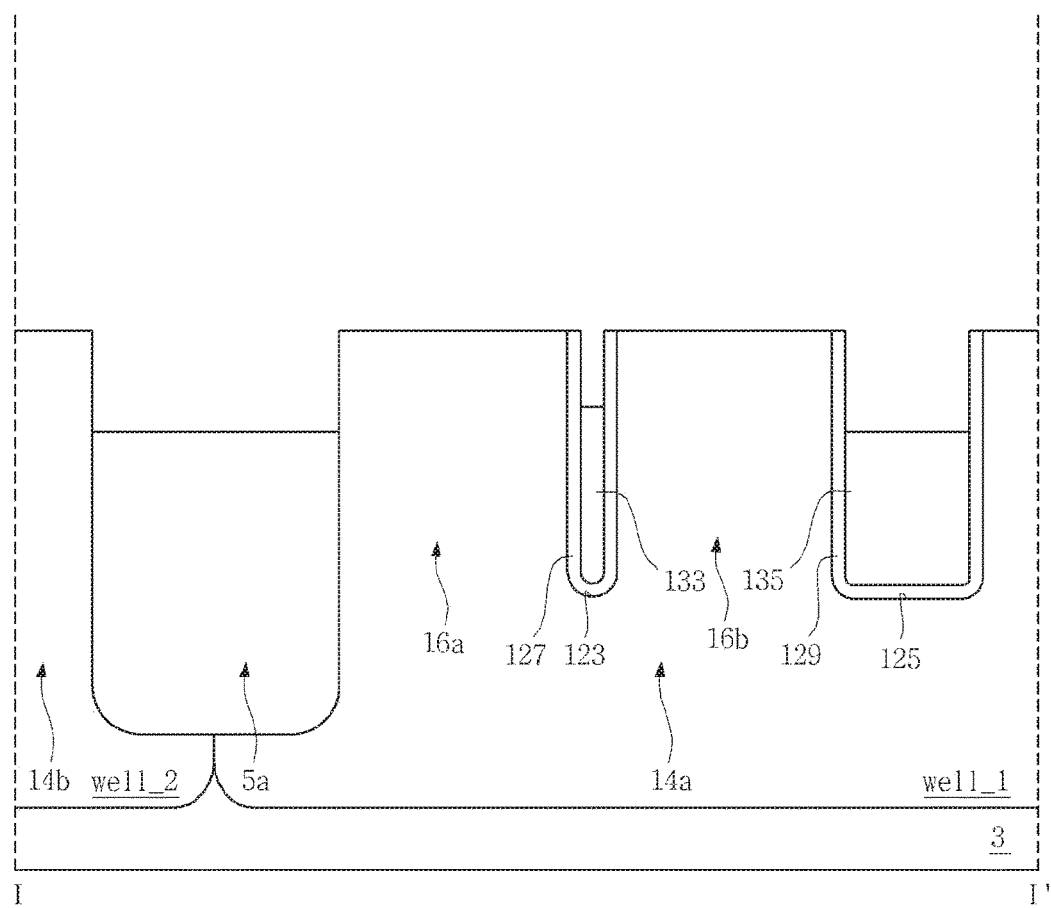
Figure 27B:
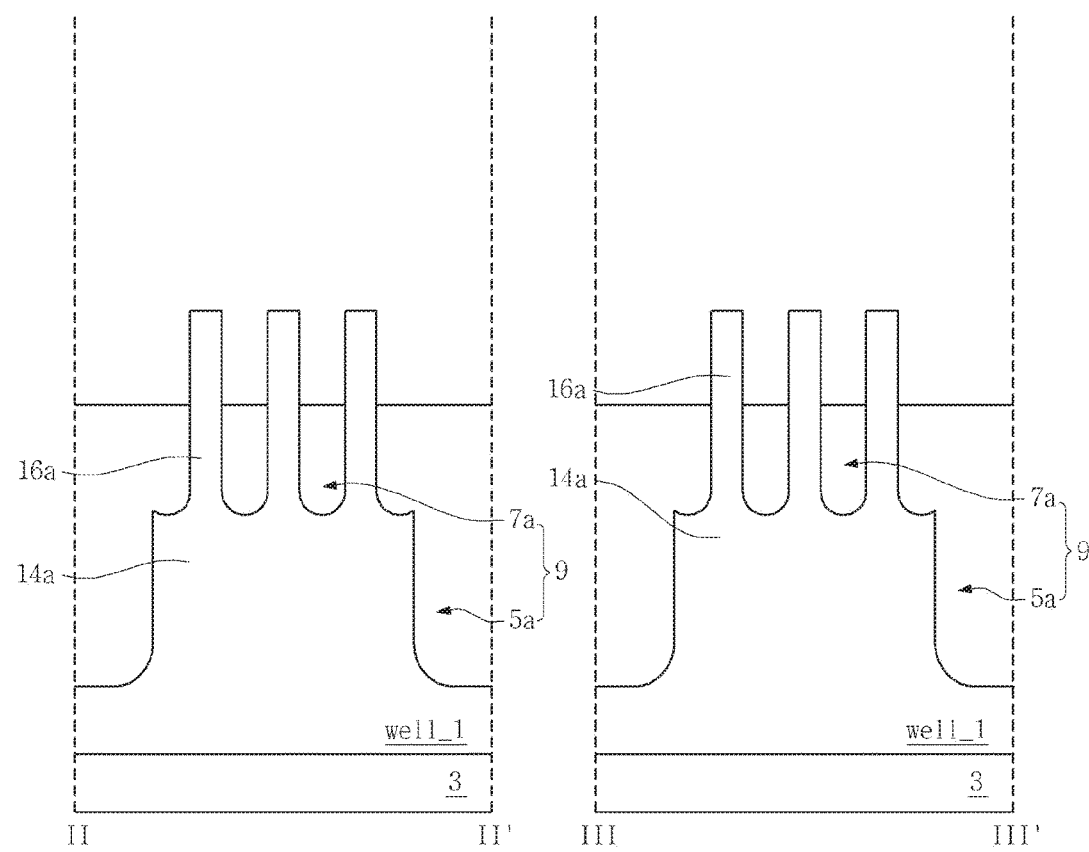
Figure 28A:
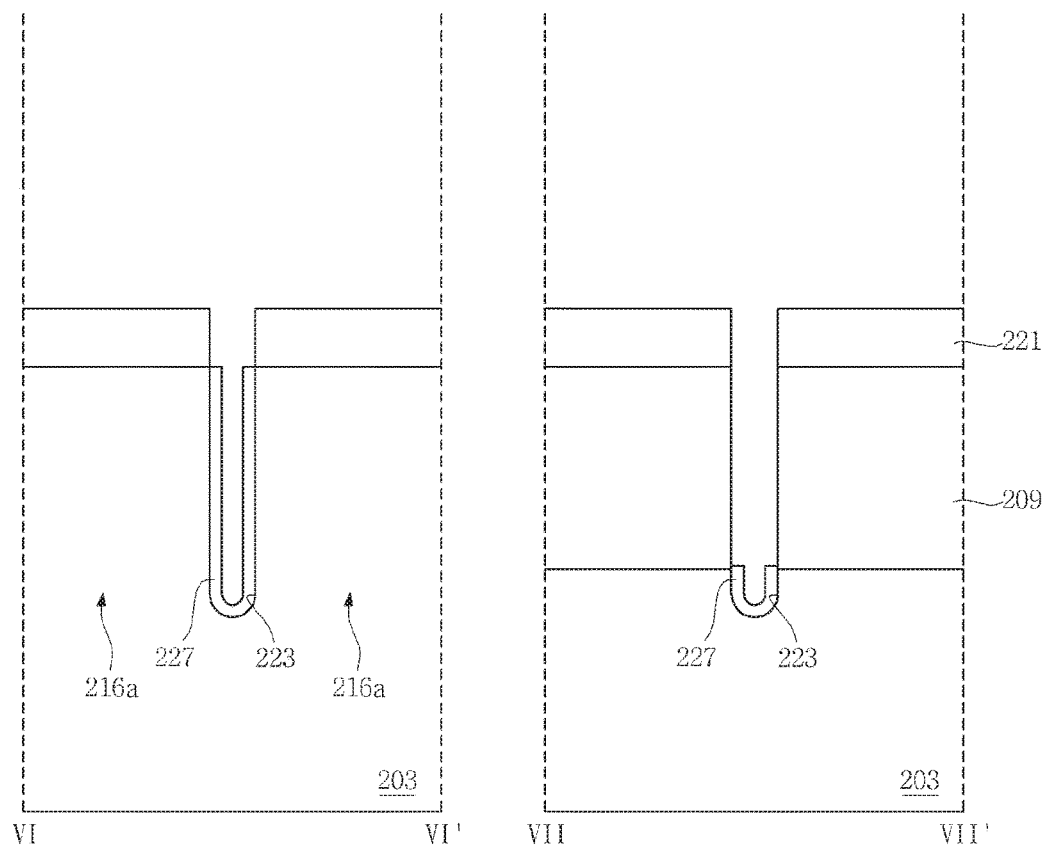
FIGS. 28A to 30C are cross-sectional views illustrating an example of a method of forming a semiconductor device according to an embodiment of the inventive concept.
Figure 28B:
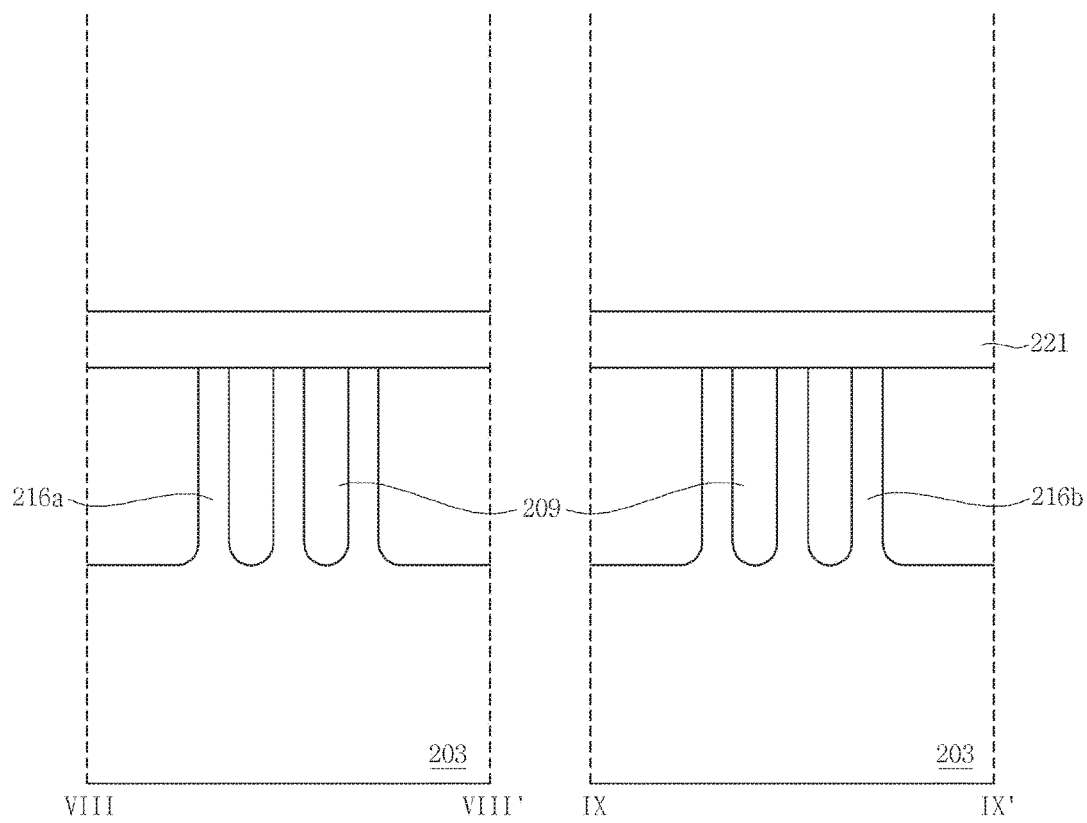
Figure 28C:
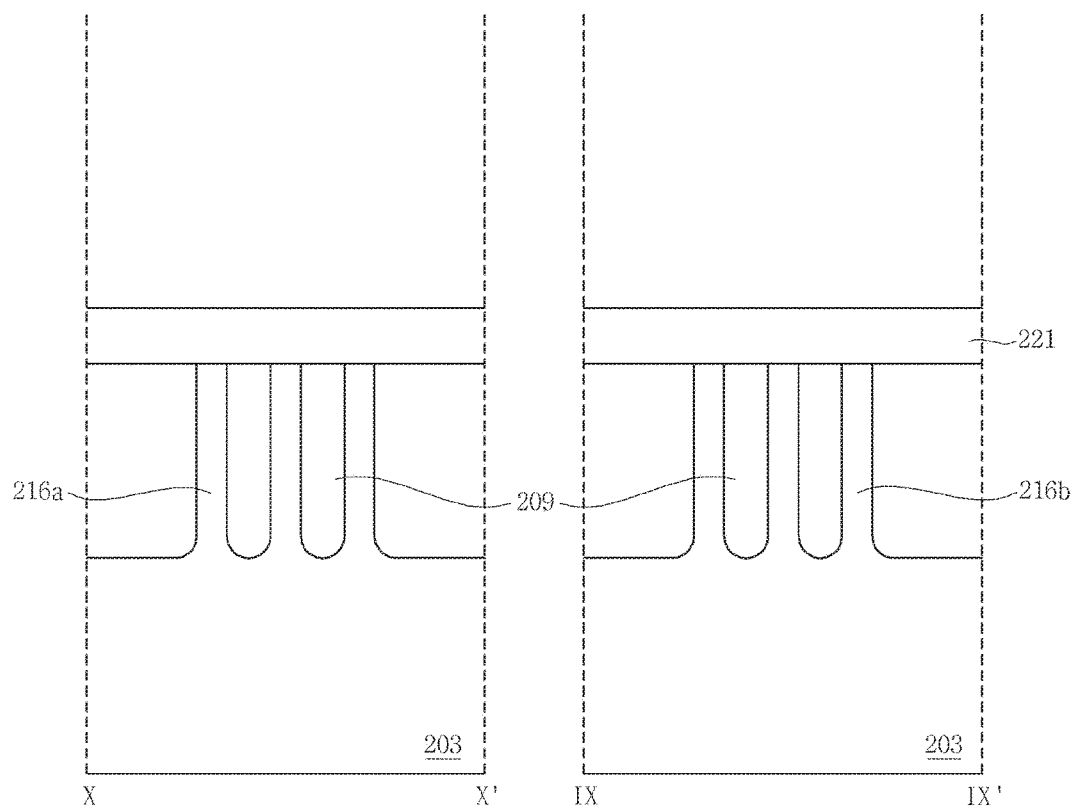
Figure 29A:
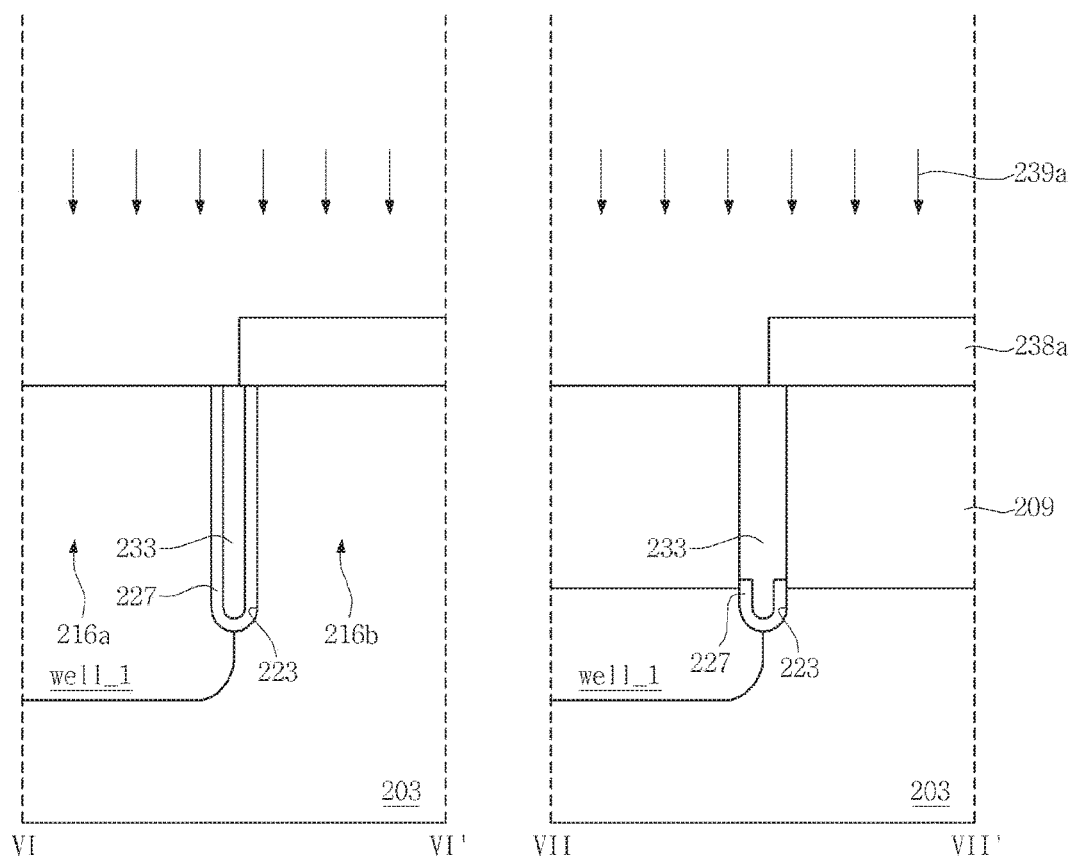
Figure 29B:
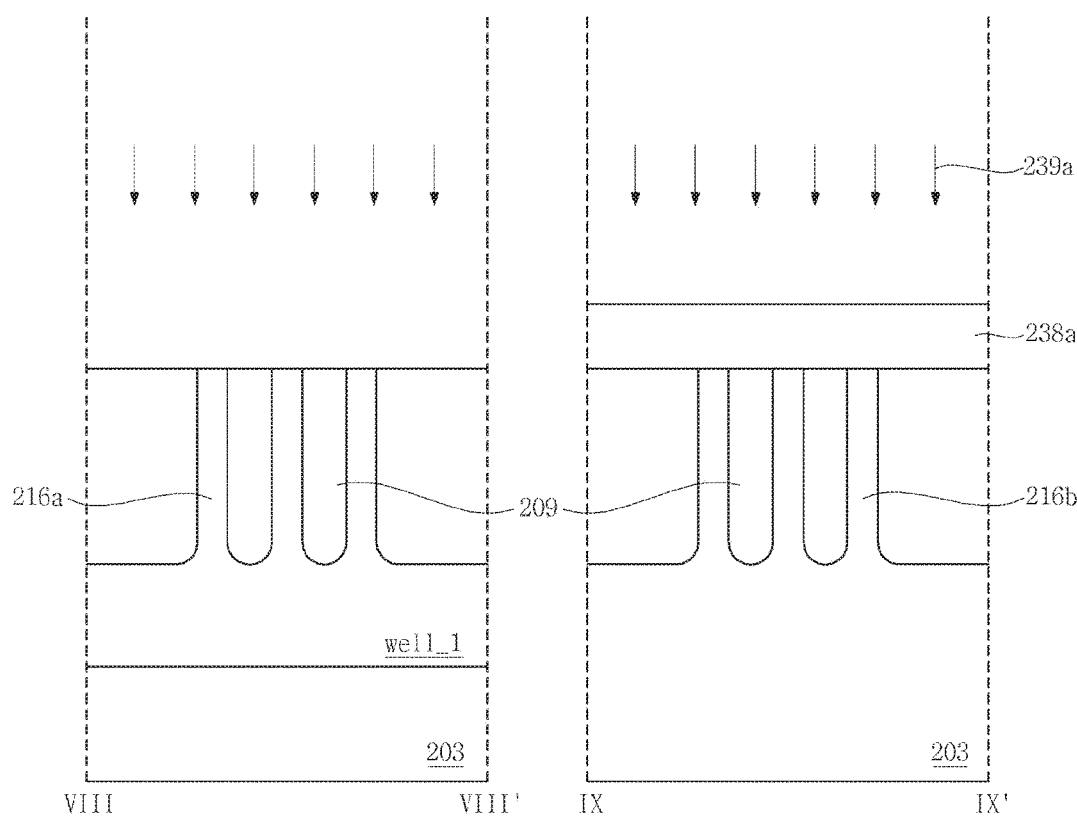
Figure 29C:
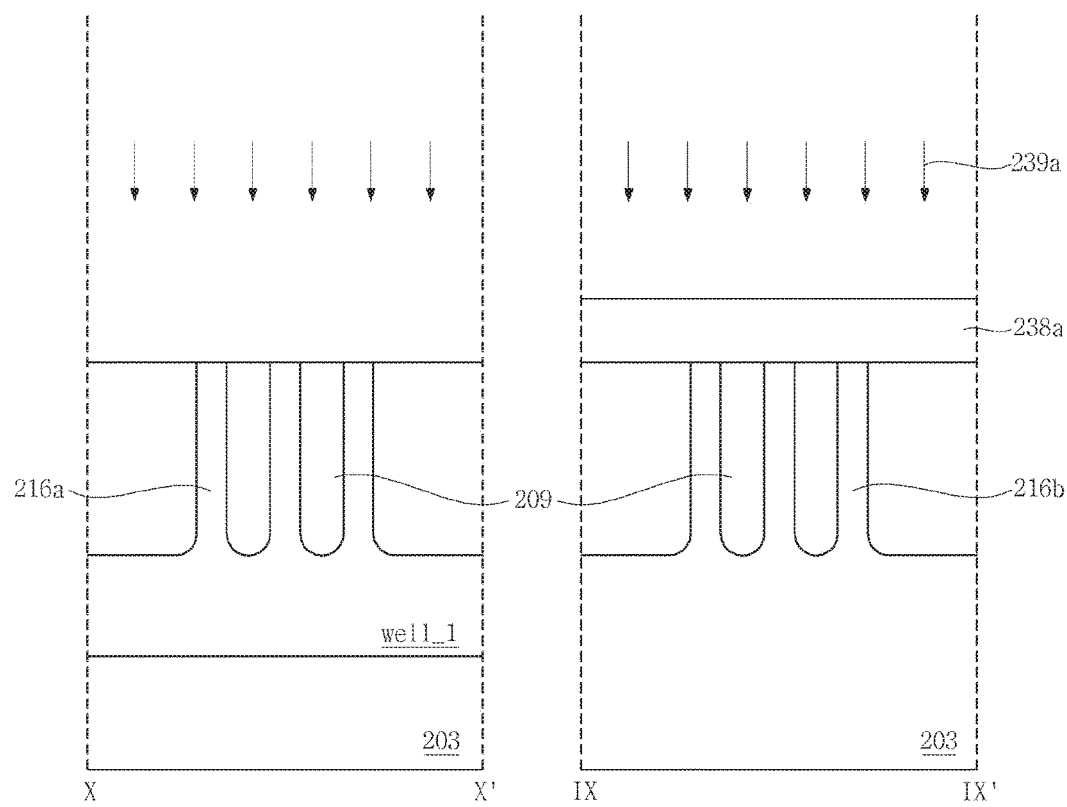
Figure 30A:
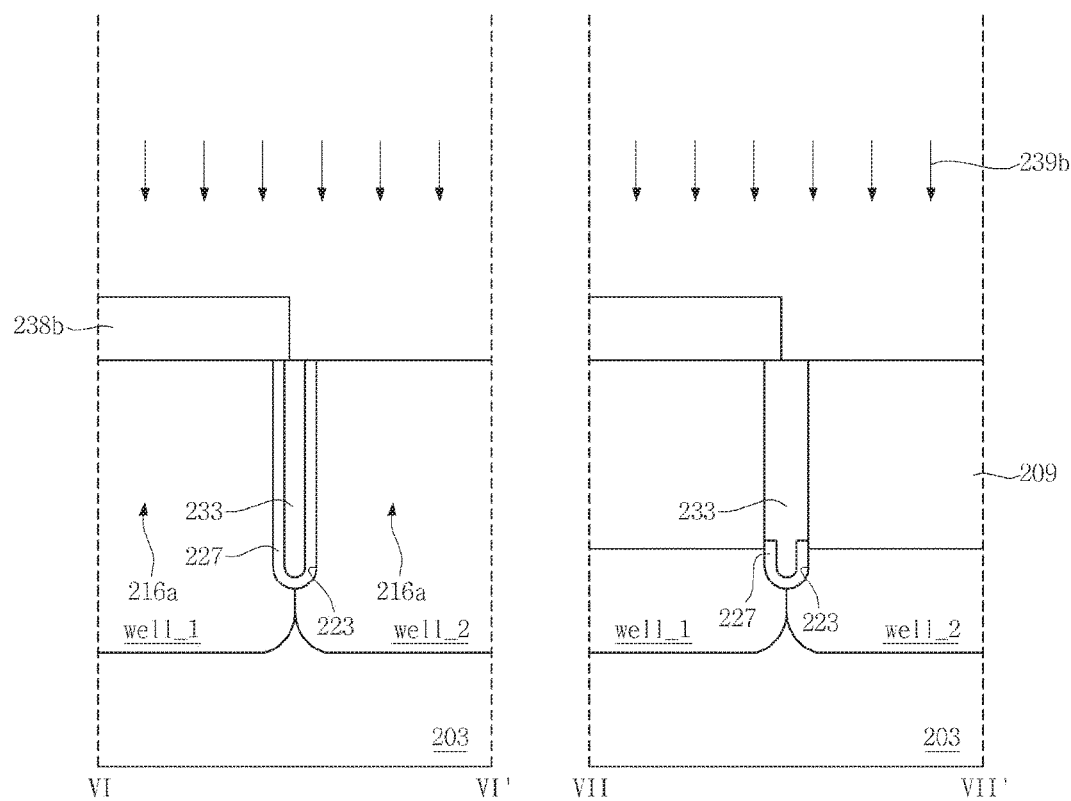
Figure 30B:
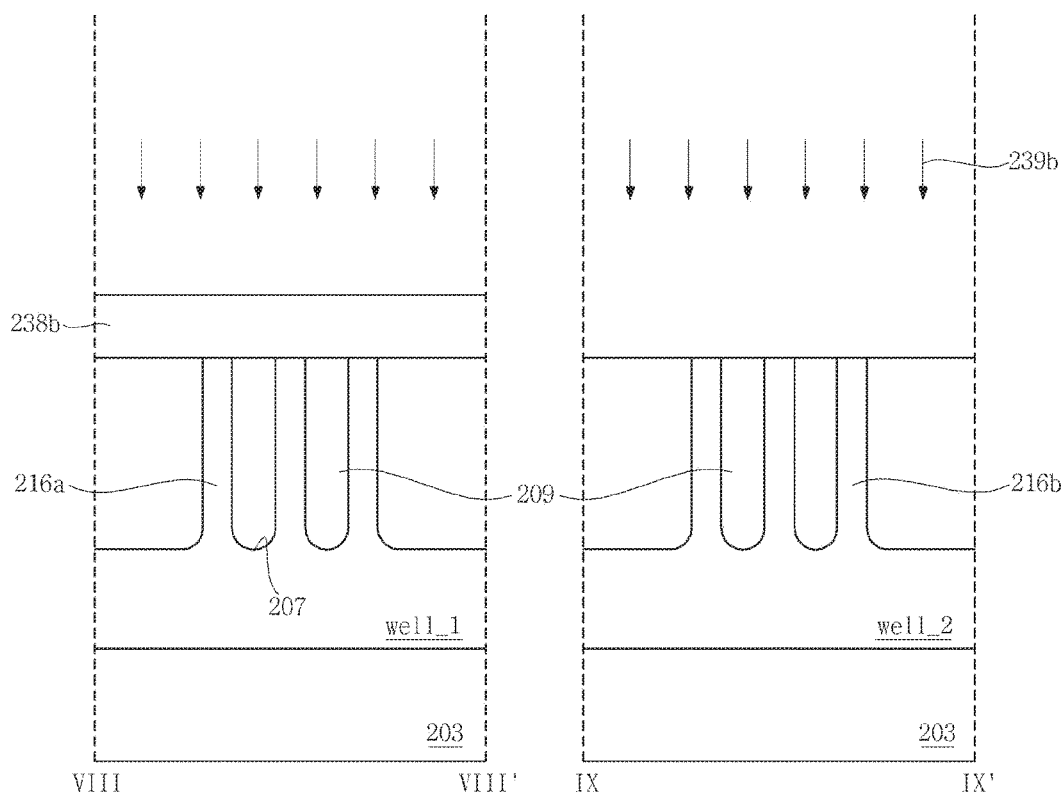
Figure 30C:
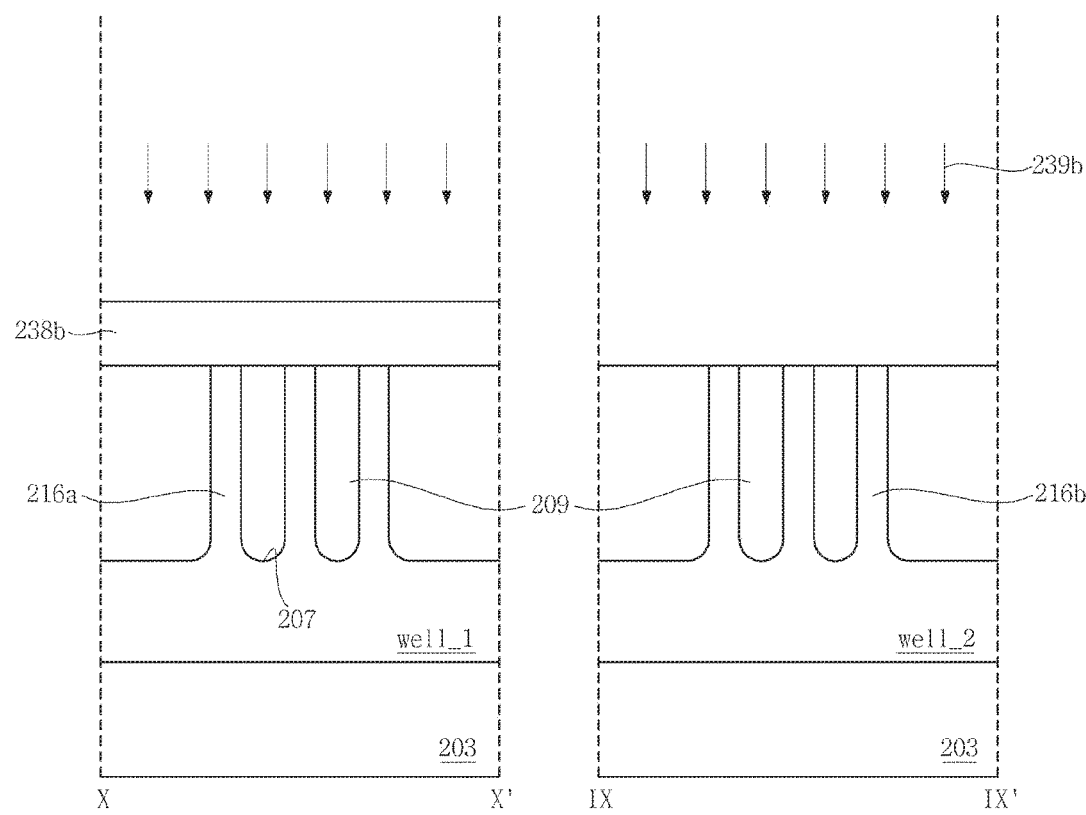

Referring to FIGS. 21, 23A, and 23B, the method of forming the semiconductor device according to an embodiment of the inventive concept may include forming a plurality of gate patterns 85e, 85d, 85g_1, 85p, and 85g_2, which fill the gate trenches 78e, 78d, 78g_1, 78g_2, and 78p.

The forming of the plurality of gate patterns 85e, 85d, 85g_1, 85p, and 85g_2 may include forming a gate dielectric 81 on the semiconductor substrate 3 having the gate trenches 78e, 78d, 78g_1, 78g_2, and 78p, forming a conductive material layer on the gate dielectric 81, planarizing the conductive material layer, and forming a gate electrode 83.

The gate dielectric 81 may be formed of silicon oxide and/or a metal oxide having a greater dielectric constant than silicon oxide. The gate electrode 83 may include a first conductive material, and a second conductive material. The first conductive material may include a barrier conductive material such as titanium (Ti), titanium nitride (TiN), tantalum (Ta), tantalum nitride (TaN), or the like and the second conductive material may include a metal such as tungsten (W), an alloy, or a metal compound.

Referring again to FIGS. 1, 2, 3A, 3B, 4A, 4B, and 4C, the method of forming the semiconductor device according to an embodiment of the inventive concept may include forming an upper interlayer insulating layer 90 and forming silicide layers 92 and contact structures 94.

The forming of the upper interlayer insulating layer 90 may include forming an insulating material layer on the plurality of gate patterns 85e, 85d, 85g_1, 85p, and 85g_2 and the lower interlayer insulating layer 74.

The forming of the silicide layers 92 and the contact structures 94 may include forming contact holes, which pass through the lower and upper interlayer insulating layers 74 and 90 and the insulating stopper layer 72 and expose the first and second source/drain semiconductor layers 66a and 66b, forming the silicide layers 92 on surfaces of the exposed first and second source/drain semiconductor layers 66a and 66b, and forming the contact structures 94, which fill the contact holes.

Next, an example of the method of forming the semiconductor device 100 described with reference to FIGS. 1, 2, 3A, 3B, 5A, 5B, and 5C will be described with reference to FIGS. 1, 2, 3A, 3B, and 24A to 27B. FIGS. 24A to 27B are cross-sectional views illustrating an example of the method of forming the semiconductor device according to an embodiment of the inventive concept.

Referring to FIGS. 1, 2, 3A, 3B, 24A, and 24B, the method of forming the semiconductor device according to an embodiment of the inventive concept may include forming a field insulating layer 9, which defines a plurality of active regions 14a, 14b, 16, and 18 in a semiconductor substrate 3. The plurality of active regions 14a, 14b, 16, and 18, and the field insulating layer 9 may be the same as those illustrated in FIGS. 9, 10A, and 10B.

The method of forming the semiconductor device according to an embodiment of the inventive concept may include forming first and second field trench areas 123 and 125 and forming first active regions 16a, second active regions 16b, and third active regions 16c.

The forming of the first and second field trench areas 123 and 125 may include forming a hard mask pattern 21 on the semiconductor substrate 3 having the plurality of active regions 14a, 14b, 16, and 18 and the field insulating layer 9, and etching active regions 16 of the plurality of active regions 14a, 14b, 16, and 18. The first and second active regions 16a and 16b may face each other due to the interposition of the first field trench area 123 and the second and third active regions 16b and 16c may face each other due to the interposition of the second field trench area 125.

A depth of each of the first and second field trench areas 123 and 125 may be deeper than a depth of a bottom of a shallow portion 7a of the field insulating layer 9.

Referring to FIGS. 1, 2, 3A, 3B, 25A, and 25B, the method of forming the semiconductor device according to an embodiment of the inventive concept may include forming a first semiconductor extension layer 127 and a second semiconductor extension layer 129. The first and second semiconductor extension layers 127 and 129 may be formed in substantially the same manner as the method of forming the first and second semiconductor extension layers 27 and 29 illustrated in FIGS. 14A and 14B.

Referring to FIGS. 1, 2, 3A, 3B, 26A, and 26B, the method of forming the semiconductor device according to an embodiment of the inventive concept may include forming first and second isolation patterns 133 and 135, which fill the first and second field trench areas 123 and 125 and forming first and second well regions well_1 and well_2.

The first and second isolation patterns 133 and 135 and the first and second well regions well_1 and well_2 may be formed in substantially the same manner as the method of forming the first and second isolation patterns 33 and 35 and the first and second well regions well_1 and well_2 illustrated in FIGS. 15A and 15B.

Referring to FIGS. 1, 2, 3A, 3B, 27A, and 27B, the method of forming the semiconductor device according to an embodiment of the inventive concept may include partially etching the field insulating layer 9, the first isolation pattern 133, and the second isolation pattern 135. The field insulating layer 9, the first isolation pattern 133, and the second isolation pattern 135 may be partially etched to have upper surfaces formed lower than upper surfaces of the first to third active regions 16a, 16b, and 16c.

Next, the same processes as those described with reference to FIGS. 17A to 23B may be performed.

An example of the method of forming the semiconductor device described with reference to FIGS. 6, 7A, 7B, 8A, 8B, and 8C will be described with reference to FIGS. 28A to 30C. FIGS. 28A to 30C are cross-sectional views illustrating an example of the method of forming the semiconductor device according to an embodiment of the inventive concept.

Referring to FIGS. 6, 7A, 7B, 28A, 28B, and 28C, the method of forming the semiconductor device according to an embodiment of the inventive concept may include forming a field insulating layer 209, which defines active lines in a semiconductor substrate 203, etching the active lines, forming a field trench area 223, and forming a semiconductor extension layer 227 in the field trench area 223.

The forming of the field trench area 223 may include forming a hard mask pattern 221 on the active lines and the field insulating layer 209 and etching the active lines using the hard mask pattern 221 as an etch mask.

The first and second active regions 216a and 216b may be formed by etching the active lines. The first active regions 216a and the second active regions 216b may face each other due to the interposition of the field trench area 223.

The forming of the semiconductor extension layer 227 may include epitaxially growing a semiconductor material from the first and second active regions 216a and 216b exposed by the field trench area 223 and the semiconductor substrate 203 disposed under the first and second active regions 216a and 216b, by performing an SEG process.

In an embodiment, the semiconductor extension layer 227 may be formed of the same material as the first and second active regions 216a and 216b, for example, a silicon material.

Referring to FIGS. 6, 7A, 7B, 29A, 29B, and 29C, the method of forming the semiconductor device according to an embodiment of the inventive concept may include forming an isolation pattern 233, which fills the field trench area 223 and forming a first well region well_1.

The forming of the isolation pattern 233 may include forming an insulating material layer on the semiconductor substrate 3 having the semiconductor extension layer 227, planarizing an insulating material layer until the hard mask pattern 221 is exposed, and removing the hard mask pattern 221 by performing an etching process.

The forming of the first well region well_1 may include implanting impurities in the first active regions 216a by performing a first well ion implantation process 239a, which uses a first well ion implantation mask 238a as an ion implantation mask, and removing the first well ion implantation mask 238a. The first well ion implantation mask 238a may cover the second active regions 216b. The first well region well_1 may be formed in the semiconductor substrate 203 under a bottom of the field trench area 223.

Referring to FIGS. 6, 7A, 7B, 30A, 30B, and 30C, the method of forming the semiconductor device according to an embodiment of the inventive concept may include forming a second well region well_2.

The forming of the second well region well_2 may include implanting impurities in the second active regions 216b by performing a second well ion implantation process 239b, which uses a second well ion implantation mask 238b as an ion implantation mask, and removing the second well ion implantation mask 238b. The second well ion implantation mask 238b may cover the first active regions 216a. The second well region well_2 may be formed in the semiconductor substrate 203 under a bottom of the field trench area 223. The first well region well_1 may have a different conductivity type from the second well region well_2.

A portion of the semiconductor extension layer 227 near the first active regions 216a may have the same conductivity type as the first well region well_1, and a portion of the semiconductor extension layer 227 near the second active regions 216b may have the same conductivity type as the second well region well_2.

Next, the same processes as those described with reference to FIGS. 17A to 23B may be performed.

Figure 31A:
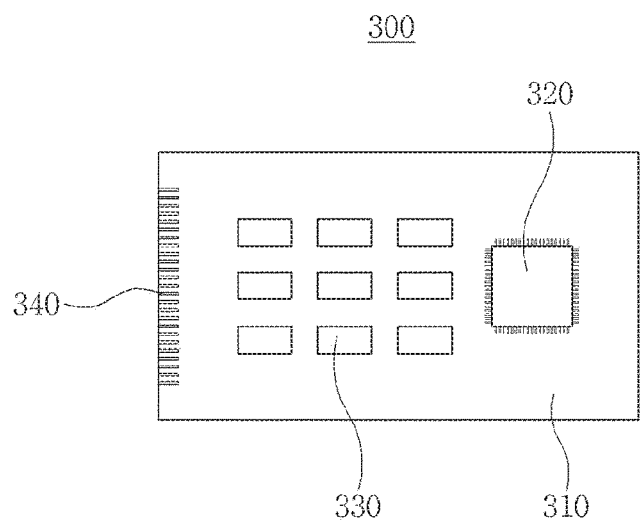
FIG. 31A is a conceptual view showing a semiconductor module according to the embodiments of the inventive concept.

FIG. 31A is a conceptual view showing a semiconductor module according to some embodiments of the inventive concept.

Referring to FIG. 31A, the semiconductor module 300 according to some embodiments of the inventive concept may include a processor 320 and memory devices 330, which are mounted on a module substrate 310. Conductive input/output terminals 340 may be disposed on at least one side of the module substrate 310. The processor 320 or the memory devices 330 may include any one of the semiconductor devices described with reference to FIGS. 1 to 30C.

Figure 31B:
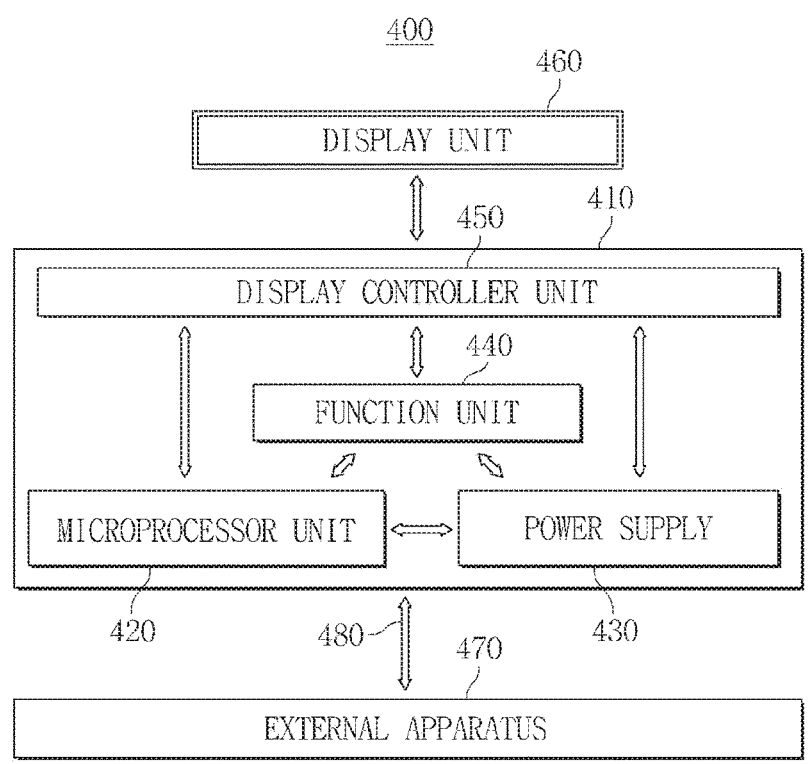
FIGS. 31B and 31C are conceptual block diagrams showing electronic systems according to embodiments of the inventive concept.
Figure 31C:
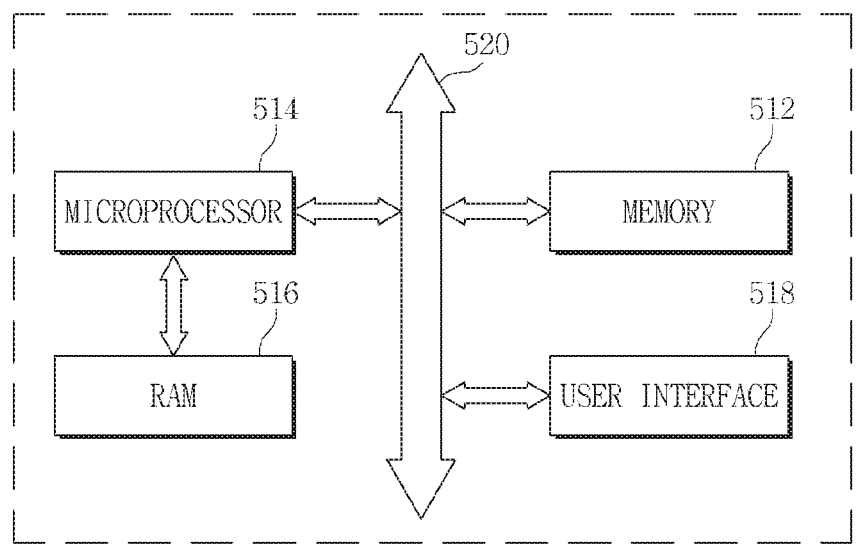

FIGS. 31B and 31C are conceptual block diagrams showing electronic systems according to the embodiments of the inventive concept.

First, referring to FIG. 31B, the electronic system 400 according to some embodiments of the inventive concept may include a body 410, a display unit 460, and an external apparatus 470. The body 410 may include a microprocessor 420, a power supply 430, a function unit 440, and/or a display controller 450. The body 410 may include a system board or a mother board having a printed circuit board (PCB), and/or a case. The microprocessor 420, the power supply 430, the function unit 440, and the display controller 450 may be mounted or disposed on a surface of the body 410 or outside the body 410. The display unit 460 may be disposed on the surface of the body 410 or inside/outside the body 410. The display unit 460 may display an image processed by the display controller 450. For example, the display unit 460 may include a liquid crystal display (LCD), an active matrix organic light emitting diodes (AMOLED), or various display panels. The display unit 460 may include a touch screen. Therefore, the display unit 460 may have an input/output function. The power supply 430 may supply current or voltage to the microprocessor 420, the function unit 440, and the display controller 450, etc. The power supply 430 may include a charging battery, a socket for a dry cell, or a voltage/current converter. The microprocessor 420 may receive a voltage from the power supply 430 to control the function unit 440 and the display unit 460. For example, the microprocessor 420 may include a CPU or an application processor (AP). The function unit 440 may include a touch pad, a touch screen, a volatile/non-volatile memory, a memory card controller, a camera, a lighting, an audio and moving picture playback processor, a wireless radio antenna, a speaker, a microphone, a USB port, or a unit having other various functions.

The microprocessor unit 420 or the function unit 440 may include any one of the semiconductor devices described with reference to FIGS. 1 to 30C.

Next, referring to FIG. 31C, the electronic system 500 according to the embodiment of the inventive concept may include a microprocessor 514, a memory system 512, and a user interface 518, which perform data communication using a bus 520. The microprocessor 514 may include a CPU or an AP. The electronic system 500 may further include a RAM 516 in direct communication with the microprocessor 514. The microprocessor 514 and/or the RAM 516 may be assembled within a single package. The user interface 518 may be used to input data to the electronic system 500, or output data from the electronic system 500. For example, the user interface 518 may include a touch pad, a touch screen, a keyboard, a mouse, a scanner, a voice detector, a cathode ray tube (CRT) monitor, an LCD, an AMOLED, a plasma display pad (PDP), a printer, a lighting, or various input/output devices. The memory system 512 may store operational codes of the microprocessor 514, data processed by the microprocessor 514, or data received from the outside. The memory system 512 may include a memory controller, a hard disk, or a solid state drive (SSD). The microprocessor 514, the RAM 516, and/or the memory system 512 may include any one of the semiconductor devices described with reference to FIGS. 1 to 30C.

According to embodiments of the inventive concept, a structure of a semiconductor device in which the source/drain semiconductor layers, which face each other due to the interposition of an isolation pattern and are formed as epitaxial layers, can be stably formed, and a method of forming the semiconductor device are provided. In order to stably form the source/drain semiconductor layers facing each other due to the interposition of the isolation pattern, a semiconductor extension layer can be disposed between the isolation pattern and the source/drain semiconductor layer.

Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. A semiconductor device, comprising:
   a first active region and a second active region, which are disposed in a semiconductor substrate and have side surfaces facing each other;
   an isolation pattern disposed between the first and second active regions;
   a semiconductor extension layer disposed between the first and second active regions;
   a first source/drain semiconductor layer disposed on the first active region; and
   a second source/drain semiconductor layer disposed on the second active region;
   wherein the semiconductor extension layer is disposed between the first active region and the isolation pattern and between the second active region and the isolation pattern.

2. The semiconductor device of claim 1, wherein the semiconductor extension layer is in contact with the side surfaces of the first and second active regions.

3. The semiconductor device of claim 1, wherein a level of an upper end of the semiconductor extension layer is higher than a level of an upper surface of the isolation pattern relative to the semiconductor substrate.

4. The semiconductor device of claim 1, wherein the semiconductor extension layer extends under the isolation pattern relative to the semiconductor substrate.

5. The semiconductor device of claim 1, wherein the first source/drain semiconductor layer is disposed in a first recessed area in the first active region.

6. The semiconductor device of claim 5, wherein a level of an upper end of the semiconductor extension layer is higher than a level of a bottom of the first recessed area relative to the semiconductor substrate.

7. The semiconductor device of claim 5, wherein a level of a bottom of the semiconductor extension layer is lower than a level of a bottom of the first recessed area relative to the semiconductor substrate.

8. The semiconductor device of claim 1, wherein:
   the semiconductor extension layer is a first epitaxial layer; and
   the first and second source/drain semiconductor layers are second epitaxial layers different from the first epitaxial layer.

9. The semiconductor device of claim 1, wherein the facing side surfaces of the first and second active regions are closer to the semiconductor extension layer than the isolation pattern.

10. A semiconductor device, comprising:
    a first active region and a second active region, which are disposed in a semiconductor substrate and have side surfaces facing each other;
    an isolation pattern disposed between the first and second active regions;
    a semiconductor extension layer disposed between the first and second active regions;
    a first source/drain semiconductor layer disposed on the first active region; and
    a second source/drain semiconductor layer disposed on the second active region;
    wherein the first source/drain semiconductor layer is disposed in a first recessed area in the first active region; and
    wherein a level of an upper end of the semiconductor extension layer is higher than a level of a bottom of the first recessed area relative to the semiconductor substrate.

11. A semiconductor device, comprising:
a first active region and a second active region, which are disposed in a semiconductor substrate and have side surfaces facing each other;
an isolation pattern disposed between the first and second active regions;
a semiconductor extension layer disposed between the first and second active regions;
a first source/drain semiconductor layer disposed on the first active region; and
a second source/drain semiconductor layer disposed on the second active region;
wherein the first source/drain semiconductor layer is disposed in a first recessed area in the first active region; and
wherein a level of a bottom of the semiconductor extension layer is lower than a level of a bottom of the first recessed area relative to the semiconductor substrate.

* * * * *